(12) United States Patent
Yu et al.

(10) Patent No.: US 11,929,203 B2
(45) Date of Patent: Mar. 12, 2024

(54) SUPERCONDUCTING MAGNET ASSEMBLY

(71) Applicant: SHANGHAI UNITED IMAGING HEALTHCARE CO., LTD., Shanghai (CN)

(72) Inventors: Xingen Yu, Shanghai (CN); Jin Qian, Shanghai (CN)

(73) Assignee: SHANGHAI UNITED IMAGING HEALTHCARE CO., LTD., Shanghai (CN)

(*) Notice: Subject to any disclaimer, the term of this patent is extended or adjusted under 35 U.S.C. 154(b) by 49 days.

(21) Appl. No.: 17/305,819

(22) Filed: Jul. 15, 2021

(65) Prior Publication Data

US 2022/0020516 A1    Jan. 20, 2022

(30) Foreign Application Priority Data

Jul. 15, 2020  (CN) .......................... 202021389087.3
Apr. 26, 2021  (CN) .......................... 202110452205.3

(51) Int. Cl.
| H01F 6/04 | (2006.01) |
| F25D 19/00 | (2006.01) |
| G01R 33/38 | (2006.01) |
| G01R 33/3815 | (2006.01) |
| H01F 6/02 | (2006.01) |

(52) U.S. Cl.
CPC ............. *H01F 6/02* (2013.01); *F25D 19/006* (2013.01); *G01R 33/3804* (2013.01); *G01R 33/3815* (2013.01); *H01F 6/04* (2013.01)

(58) Field of Classification Search
CPC ...... G01R 33/3804; H01F 6/04; F25D 19/006
See application file for complete search history.

(56) References Cited

U.S. PATENT DOCUMENTS

| 4,689,970 A * | 9/1987 | Ohguma | ................ H01F 6/04 62/51.1 |
| 4,924,198 A * | 5/1990 | Laskaris | ............ G01R 33/3815 324/318 |
| 5,960,868 A * | 10/1999 | Kuriyama | ............. F25D 19/006 165/277 |
| 6,959,554 B1 * | 11/2005 | Shirron | ................. F25D 19/006 62/3.1 |

(Continued)

FOREIGN PATENT DOCUMENTS

| CN | 107607210 A | 1/2018 |
| CN | 108591818 B | 5/2019 |

(Continued)

*Primary Examiner* — Ramon M Barrera
(74) *Attorney, Agent, or Firm* — METIS IP LLC

(57) ABSTRACT

A superconducting magnet assembly may include a switch component including a first thermal switch and/or a second thermal switch. The first thermal switch may include a first activation mode configured to facilitate heat transfer between a first stage cold head and a radiation shield, and a first deactivation mode configured to break or impede the heat transfer between the first stage cold head and the radiation shield. The second thermal switch may include a second activation mode configured to facilitate heat transfer between a second stage cold head and a superconducting magnet, and a second deactivation mode configured to break or impede the heat transfer between the second stage cold head and the superconducting magnet.

20 Claims, 16 Drawing Sheets

(56) References Cited

U.S. PATENT DOCUMENTS

| | | |
|---|---|---|
| 2010/0005814 A1 | 1/2010 | Strobel |
| 2010/0022395 A1 | 1/2010 | Bittner |
| 2020/0348055 A1 | 11/2020 | Trindade Pereira et al. |

FOREIGN PATENT DOCUMENTS

| | | | |
|---|---|---|---|
| CN | 113074484 A | | 7/2021 |
| CN | 113097598 A | | 7/2021 |
| JP | 63215023 A | * | 9/1988 |

* cited by examiner

First Activation Mode

First Deactivation Mode

Second Activation Mode

Second Deactivation Mode

SUPERCONDUCTING MAGNET ASSEMBLY

CROSS-REFERENCE TO RELATED APPLICATIONS

This application claims priority to Chinese Patent Application No. 202110452205.3 filed on Apr. 26, 2021 and Chinese Patent Application No. 202021389087.3 filed on Jul. 15, 2020, the contents of each of which are hereby incorporated by reference.

TECHNICAL FIELD

The present disclosure generally relates to magnetic resonance imaging (MRI), and in particular, to a superconducting magnet in an MRI system.

BACKGROUND

With the development of medical imaging, MRI has become an important medical diagnosis technology and play an increasingly important role in medical diagnosis. In MRI devices, a superconducting magnet provides a main magnetic field. Keeping magnet coils of the superconducting magnet in a superconducting state has a greater influence on the image quality of MRI.

SUMMARY

According to a first aspect of the present disclosure, a superconducting magnet assembly may include a cryostat, a superconducting magnet, and a refrigeration component. The cryostat may include an outer vessel, an inner vessel disposed in the outer vessel, and a radiation shield disposed between the outer vessel and the inner vessel. The superconducting magnet may be configured to generate a main magnetic field and disposed in the inner vessel. At least a portion of the refrigeration component may be disposed within the outer vessel. The refrigeration component may include a refrigerator including a first stage cold head and/or a second stage cold head. The first stage cold head may be configured to cool the superconducting magnet to a superconducting state. The second stage cold head may be configured to cool the radiation shield. The refrigeration component may also include a switch component including a first thermal switch and/or a second thermal switch. The first thermal switch may include a first activation mode configured to facilitate heat transfer between the first stage cold head and the radiation shield, and a first deactivation mode configured to break or impede the heat transfer between the first stage cold head and the radiation shield. The second thermal switch may include a second activation mode configured to facilitate heat transfer between the second stage cold head and the superconducting magnet, and a second deactivation mode configured to break or impede the heat transfer between the second stage cold head and the superconducting magnet.

In some embodiments, the switch component may include a container. A first end of the container may be thermally coupled with the refrigerator. A second end of the container may be thermally coupled with the radiation shield or the superconducting magnet. The container may be filled with a transfer medium that transitions between a gas phase and a liquid phase based on a refrigeration temperature of the refrigerator.

In some embodiments, the container may include a first pipeline and a second pipeline. A first end of the first pipeline may be connected with a first end of the second pipeline so that the first pipeline and the second pipeline are in fluid communication. The second pipeline may be at an angle with the first pipeline. A second end of the first pipeline may be thermally coupled with the refrigerator, and a second end of the second pipeline may be thermally coupled with the radiation shield or the superconducting magnet.

In some embodiments, the container may include an end cover connected with the second end of the first pipeline. A diameter of a first end of the end cover may be smaller than a diameter of a second end of the end cover. The first end of the end cover may be connected with the second end of the first pipeline. The second end of the end cover may be away from the second end of the first pipeline.

In some embodiments, the switch component may include a connection block connected with the second end of the container. The container may be thermally coupled with the radiation shield or the superconducting magnet through the connection block.

In some embodiments, the refrigeration component may include a support component. The support component may include one or more fixing holes configured to fix the container and the refrigerator on the support component. The support component may be connected with the first end of the container.

In some embodiments, an area of a surface of the support component facing the refrigerator may be larger than an area of a cross section of the container.

In some embodiments, the switch component may include a supplement pipeline configured to allow addition of the transfer medium to the container. A first end of the supplement pipeline may be in fluid communication with the container. A second end of the supplement pipeline may extend outside the cryostat and may be connected with an external cold source of the transfer medium.

In some embodiments, the switch component may include a valve of the supplement pipeline configured to control fluid communication between the supplement pipeline and the external cold source.

In some embodiments, a diameter of the supplement pipeline may be smaller than or equal to a diameter of the container.

In some embodiments, a connection between the supplement pipeline and the container may be closer to the first end of the container than to the second end of the container.

In some embodiments, the first thermal switch may include a first container, a first cold end, and a first hot end. A first end of the first container may be thermally coupled with the first stage cold head through the first cold end, and a second end of the first container may be thermally coupled with the radiation shield through the first hot end. The first container may be a hollow structure filled with a first transfer medium that transitions between a gas phase and a liquid phase based on a refrigeration temperature of the first stage cold head.

In some embodiments, the second thermal switch may include a second container, a second cold end, and a second hot end. A first end of the second container may be thermally coupled with the second stage cold head through the second cold end, and a second end of the second container may be thermally coupled with the superconducting magnet through the second hot end. The second container may be a hollow structure filled with a second transfer medium that transitions between a gas phase and a liquid phase based on a refrigeration temperature of the second stage cold head.

In some embodiments, a boiling point of the first transfer medium in the first thermal switch may be different from a boiling point of the second transfer medium in the second thermal switch.

In some embodiments, the second thermal switch may be connected with the inner vessel or the superconducting magnet.

In some embodiments, a first value of a heat transfer rate of at least a portion of the first thermal switch at a first temperature range including a refrigeration temperature of the first stage cold head may be relatively high so that the first thermal switch is in the first activation mode when the refrigerator is on. A second value of the heat transfer rate of the at least portion of the first thermal switch at a second temperature range higher than the first temperature range may be smaller than the first value so that the first thermal switch is in the first deactivation mode when the refrigerator is off. A third value of a heat transfer rate of at least a portion of the second thermal switch at a third temperature range including a refrigeration temperature of the second stage cold head may be relatively high so that the second thermal switch is in the second activation mode when the refrigerator is on. A fourth value of the heat transfer rate of the at least portion of the second thermal switch at a fourth temperature range higher than the third temperature range may be smaller than the third value so that the second thermal switch is in the second deactivation mode when the refrigerator is off.

In some embodiments, a count of the first thermal switch may be one or more. When the count of the first thermal switch is more than one, the more than one first thermal switch may be spaced from each other. A count of the second thermal switch may be one or more. When the count of the second thermal switch is more than one, the more than one second thermal switch may be spaced from each other.

In some embodiments, the refrigeration component may include a connection component configured to connect the refrigerator with the switch component, and connect the switch component with the radiation shield or the superconducting magnet.

In some embodiments, the inner vessel may accommodate a first cooling medium configured to maintain the superconducting magnet in the superconducting state. The superconducting magnet assembly may further include a heat exchange component that is disposed within the outer vessel and configured to exchange heat with the first cooling medium.

In some embodiments, the heat exchange component may include an exchange chamber and a storage chamber. The exchange chamber may be in fluid communication with the inner vessel so that the first cooling medium flows from the inner vessel to the heat exchange component. The storage chamber may accommodate a second cooling medium that is configured to exchange heat with the first cooling medium.

In some embodiments, the heat exchange component may include a cooling pipeline configured to cool the radiation shield. The cooling pipeline may be disposed circumferentially around the radiation shield. A first end of the cooling pipeline may be in fluid communication with the exchange chamber, and a second end of the cooling pipeline may extend outside the cryostat.

In some embodiments, the heat exchange component may include an outlet pipeline configured to allow the first cooling medium to flow outside the cryostat. A first end of the outlet pipeline may be in fluid communication with the exchange chamber, and a second end of the outlet pipeline may extend outside the cryostat.

In some embodiments, the heat exchange component may include a thermal connection joint through which the heat exchange component is thermally coupled with the refrigeration component.

In some embodiments, the refrigeration component may include a base on which the refrigerator is disposed. At least a portion of the base or the refrigerator may be thermally coupled with the first cooling medium through a first pipeline.

In some embodiments, at least a portion of the heat exchange component may be thermally coupled with the refrigeration component through a second pipeline.

According to another aspect of the present disclosure, a magnetic resonance (MR) device may include a superconducting magnet assembly including a bore, a frequency radio (RF) coil assembly disposed within the bore, and a gradient coil assembly disposed within the bore and between the RF coil assembly and the superconducting magnet assembly. The superconducting magnet assembly may include a cryostat, a superconducting magnet, and a refrigeration component. The cryostat may include an outer vessel, an inner vessel disposed in the outer vessel, and a radiation shield disposed between the outer vessel and the inner vessel. The superconducting magnet may be configured to generate a main magnetic field and disposed in the inner vessel. At least a portion of the refrigeration component may be disposed within the outer vessel. The refrigeration component may include a refrigerator configured to cool the superconducting magnet to a superconducting state and/or cool the radiation shield. The refrigeration component may also include a switch component accommodating a transfer medium of which liquid-gas transition controls the switch component to be in an activation mode or a deactivation mode. The refrigeration component may also include a connection component configured to connect the refrigerator with the switch component, and connect the switch component with the radiation shield or the superconducting magnet.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

Figure 1:
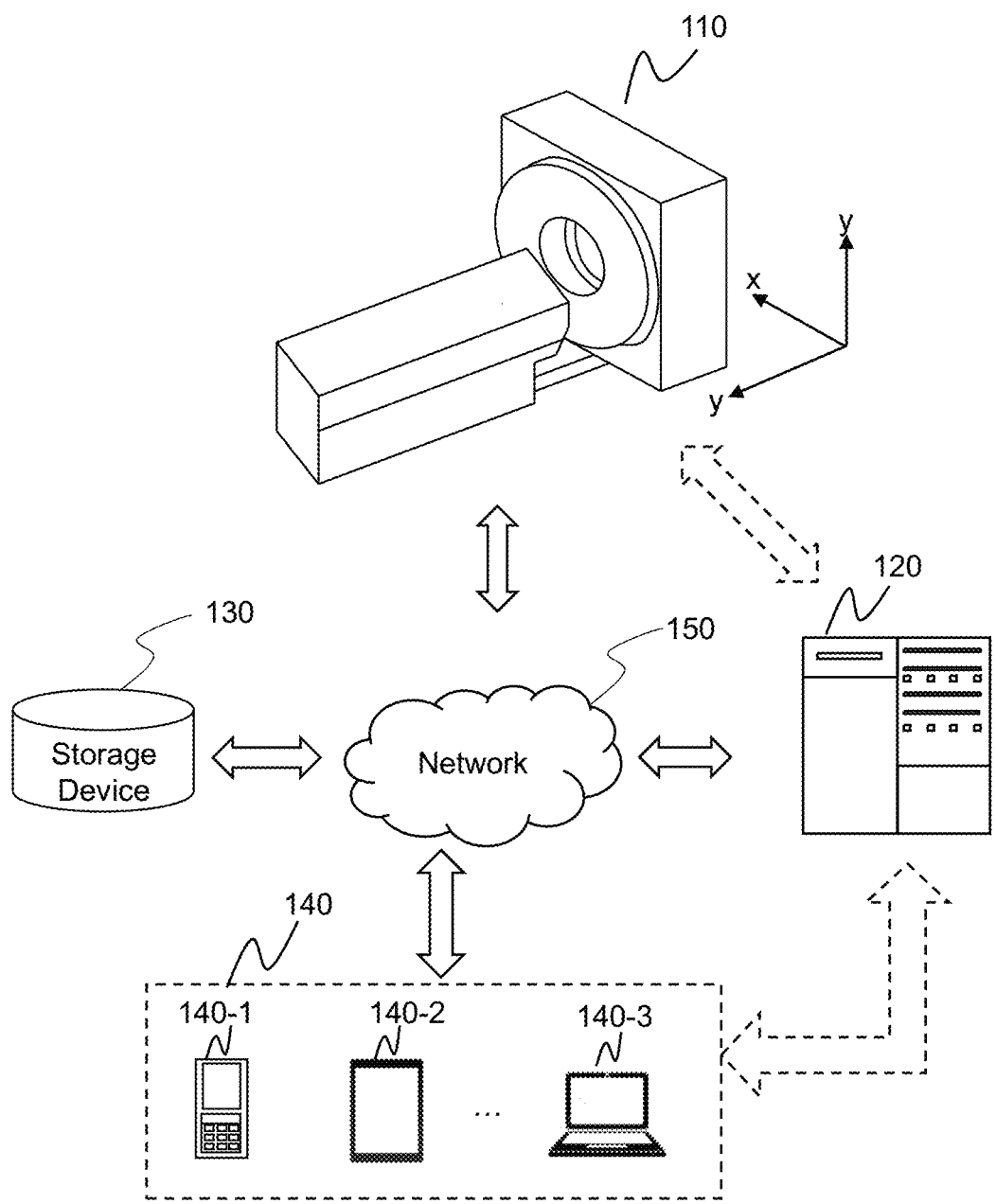
FIG. 1 is a schematic diagram illustrating an exemplary MRI system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "unit," "module," and/or "block" used herein are one method to distinguish different components, elements, parts, section or assembly of different level in ascending order. However, the terms may be displaced by another expression if they achieve the same purpose.

As used herein, the term "and/or" includes any and all combinations of one or more of the associated listed items. In the present disclosure, unless otherwise expressly specified, the terms "mount," "connect," "couple," "fix," etc., should be understood in a broad sense, for example, it may be a fixed connection, a detachable connection, integrated into a whole, a mechanical connection, an electrical connection, directly connected, or indirectly connected via an intermediate medium, an internal connection of two elements, or an interconnection of two elements. For those skilled in the art, the specific meanings of the above terms in the present disclosure may be understood according to specific circumstances.

In the present disclosure, spatial reference terms such as "center," "longitudinal," "transverse," "length," "width," "thickness," "upper," "lower," "front," "back," "left," "right," "vertical," "horizontal," "top," "bottom," "inner," "outer," "clockwise," "counterclockwise," "axial," "radial," "circumferential," etc., indicate, in a relative sense, an orientation or positional relationship between two or more elements, assemblies, devices, or systems based on an orientation or positional relationship as shown in the drawings, and are only for the convenience and simplicity of description, rather than indicating or implying that the elements, assemblies, devices, or systems in the present disclosure have a particular orientation when the disclosed system, or a portion thereof, is in operation, or are constructed and operated in a particular orientation, and therefore should not be understood as a limitation of the present disclosure.

In the present disclosure, unless expressly stated otherwise, a first feature being "above" or "below" a second feature may be that the first feature and the second feature are in direct contact, or the first feature and the second feature may be in indirect contact via an intermediate medium. In some embodiments, the first feature being "above" or "on" the second feature may mean that the first feature is directly above or obliquely above the second feature, or simply mean that a horizontal height of the first feature is higher than a horizontal height of the second feature. The first feature being "below" or "underneath" the second feature may mean that the first feature is directly below or obliquely below the second feature, or it may simply mean that a horizontal height of the first feature is smaller than a horizontal height of the second feature.

It will be understood that, although the terms "first," "second," "third," etc., may be used herein to distinguish one element from another. For example, a first element may be termed a second element, and similarly, a second element may be termed a first element, without departing from the scope of exemplary embodiments of the present disclosure.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

Provided herein are systems and components for medical imaging and/or medical treatment. In some embodiments, the medical system may include an imaging system. The imaging system may include a single modality imaging system and/or a multi-modality imaging system. The single modality imaging system may include, for example, a magnetic resonance imaging (MRI) system. Exemplary MRI systems may include a superconducting magnetic resonance imaging system, a non-superconducting magnetic resonance imaging system, etc. The multi-modality imaging system may include, for example, a computed tomography-magnetic resonance imaging (MRI-CT) system, a positron emission tomography-magnetic resonance imaging (PET-MRI) system, a single photon emission computed tomography-magnetic resonance imaging (SPECT-MRI) system, a digital subtraction angiography-magnetic resonance imaging (DSA-MRI) system, etc. In some embodiments, the medical system may include a treatment system. The treatment system may include a treatment plan system (TPS), image-guide radiotherapy (IGRT), etc. The image-guide radiotherapy (IGRT) may include a treatment device and an imaging device. The treatment device may include a linear accelerator, a cyclotron, a synchrotron, etc., configured to perform a radio therapy on a subject. The treatment device may include an accelerator of species of particles including, for example, photons, electrons, protons, or heavy ions. The imaging device may include an MRI scanner, a CT scanner (e.g., cone beam computed tomography (CBCT) scanner), a digital radiology (DR) scanner, an electronic portal imaging device (EPID), etc.

An aspect of the present disclosure provides a switch component including a first thermal switch and a second thermal switch. A first stage cold head of a refrigerator may be thermally coupled with a radiation shielding through the first thermal switch, and a second stage cold head of the refrigerator may be thermally coupled with a superconducting magnet through the second thermal switch. When the refrigerator is working, the first thermal switch may be in a first activation mode, and the second thermal switch may be in a second activation mode. In the first activation mode, the first thermal switch may increase heat transfer efficiency between the first stage cold head and the radiation shield, so as to facilitate heat transfer between the first stage cold head and the radiation shield. In the second activation mode, the second thermal switch may increase heat transfer efficiency between the second stage cold head and the superconducting magnet, so as to facilitate heat transfer between the second stage cold head and the superconducting magnet. When the refrigerator is not working, the first thermal switch may be in a first deactivation mode, and the second thermal switch may be in a second deactivation mode. In the first deactivation mode, the first thermal switch may decrease the heat transfer efficiency between the first stage cold head and the radiation shield, so as to break or impede the heat transfer between the first stage cold head and the radiation shield. In the second deactivation mode, the second thermal switch may decrease the heat transfer efficiency between the second stage cold head and the superconducting magnet, so as to break or impede the heat transfer between the second stage cold head and the superconducting magnet. The switch component may accommodate a transfer medium that transitions between a gas phase and a liquid phase based on a refrigeration temperature of the refrigerator. The liquid-gas transition of the transfer medium may implement the switch between the activation mode and the deactivation mode of the switch component based on the operation status of the refrigerator.

Another aspect of the present disclosure provides a transfer component through which a refrigerator may cool a radiation shield and/or a superconducting magnet. One end of the transfer component may extend into an inner vessel, the other end of the transfer component may be connected with the refrigerator. When the refrigerator is replaced, the refrigerator can be directly removed from the transfer component, which effectively solves the problem of inconvenient replacement of the refrigerator, and avoids the occurrence of helium leakage.

Yet another aspect of the present disclosure provides a heat exchange component. When a refrigerator is not working, the helium flowing from an inner vessel may enter the heat exchange component and exchange heat with a medium (e.g., liquid nitrogen) in the heat exchange component. Then, the helium cooled by the heat exchange component may be used to cool a radiation shield.

FIG. 1 is a schematic diagram illustrating an exemplary MRI system 100 according to some embodiments of the present disclosure. As illustrated, the MRI system 100 may include an MRI scanner 110, a network 120, a terminal 130, a processing device 140, and a storage device 150. The components of the MRI system 100 may be connected in one or more of various ways. Merely byway of example, as illustrated in FIG. 1, the MRI scanner 110 may be connected to the processing device 140 through the network 120. As another example, the MRI scanner 110 may be connected to the processing device 140 directly (as indicated by the bi-directional arrow in dotted lines linking the MRI scanner 110 and the processing device 140). As a further example, the storage device 150 may be connected to the processing device 140 directly or through the network 120. As still a further example, a terminal device (e.g., 131, 132, 133, etc.) may be connected to the processing device 140 directly (as indicated by the bi-directional arrow in dotted lines linking the terminal 130 and the processing device 140) or through the network 120.

The MRI scanner 110 may scan an object located within its detection region and generate a plurality of data relating to the object. In the present disclosure, "subject" and "object" are used interchangeably. Merely by way of example, the object may include a patient, a man-made object, etc. As another example, the object may include a specific portion, organ, and/or tissue of a patient. For example, the object may include head, brain, neck, body, shoulder, arm, thorax, cardiac, stomach, blood vessel, soft tissue, knee, feet, or the like, or any combination thereof. In some embodiments, the MRI scanner 110 may be a close-bore scanner or an open-bore scanner. In some embodiments, the MRI scanner 110 may include a single-modality device or a multi-modality device. Exemplary multi-modality devices may include an MRI-CT device, a PET-MRI device, etc.

In the present disclosure, the X axis, the Y axis, and the Z axis shown in FIG. 1 may form an orthogonal coordinate system. The X axis and the Z axis shown in FIG. 1 may be horizontal, and the Y axis may be vertical. As illustrated, the positive x-direction along the X axis may be from the right side to the left side of the MRI scanner 110 seen from the direction facing the front of the MRI scanner 110; the positive y-direction along the Y axis shown in FIG. 1 may be from the lower part to the upper part of the MRI scanner 110; the positive z-direction along the Z axis shown in FIG. 1 may refer to a direction in which the object is moved out of the detection region (or referred to as the bore) of the MRI scanner 110. More description of the MRI scanner 110 may be found elsewhere in the present disclosure. See, e.g., FIG. 2 and the description thereof.

The network 120 may include any suitable network that can facilitate the exchange of information and/or data for the MRI system 100. In some embodiments, one or more components of the MRI system 100 (e.g., the MRI scanner 110, the terminal 130, the processing device 140, or the storage device 150) may communicate information and/or data with one or more other components of the MRI system 100 via the network 120. For example, the processing device 140 may obtain MR signals from the MRI scanner 110 via the network 120. In some embodiments, the network 120 may be any type of wired or wireless network, or a combination thereof.

The terminal 130 may include a mobile device 131, a tablet computer 132, a laptop computer 133, or the like, or any combination thereof. In some embodiments, the mobile device 131 may include a smart home device, a wearable device, a smart mobile device, a virtual reality device, an augmented reality device, or the like, or any combination thereof. In some embodiments, the terminal 130 may remotely operate the MRI scanner 110 and/or the processing device 140. In some embodiments, the terminal 130 may operate the MRI scanner 110 and/or the processing device 140 via a wireless connection. In some embodiments, the terminal 130 may receive information and/or instructions inputted by a user, and send the received information and/or instructions to the MRI scanner 110 or to the processing device 140 via the network 120. In some embodiments, the terminal 130 may receive data and/or information from the processing device 140. In some embodiments, the terminal 130 may be part of the processing device 140. In some embodiments, the terminal 130 may be omitted.

The processing device 140 may process data and/or information obtained from the MRI scanner 110, the terminal 130, and/or the storage device 150. For example, the processing device 140 may obtain MR data from the storage device 150 or the MRI scanner 110 and generate one or more images based on the MR data. In some embodiments, the processing device 140 may be a single server, or a server group. The server group may be centralized or distributed. In some embodiments, the processing device 140 may be local or remote. In some embodiments, the processing device 140 may be implemented on a cloud platform.

The storage device 150 may store data and/or instructions. In some embodiments, the storage device 150 may store data obtained from the MRI scanner 110, the terminal 130 and/or the processing device 140. For example, the storage device 150 may store one or more MR images. In some embodiments, the storage device 150 may store data and/or instructions that the processing device 140 may execute or use to perform exemplary methods described in the present disclosure. For example, the storage device 150 may store instructions that the processing device 140 may execute to generate one or more images. In some embodiments, the storage device 150 may include a mass storage device, a removable storage device, a volatile read-and-write memory, a read-only memory (ROM), or the like, or any combination thereof. In some embodiments, the storage device 150 may be implemented on a cloud platform.

In some embodiments, the storage device 150 may be connected to the network 120 to communicate with one or more components of the MRI system 100 (e.g., the MRI scanner 110, the processing device 140, the terminal 130, etc.). One or more components of the MRI system 100 may access the data or instructions stored in the storage device 150 via the network 120. In some embodiments, the storage device 150 may be part of the processing device 140.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Figure 2:
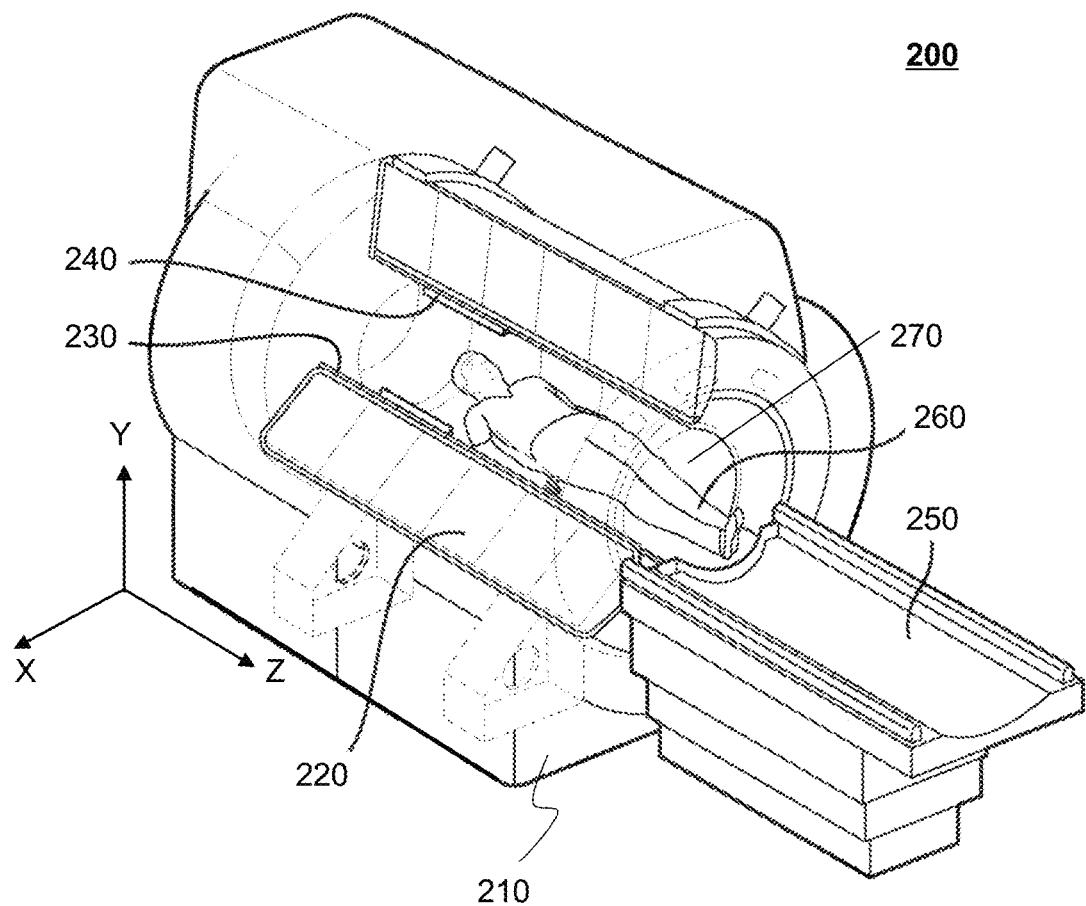
FIG. 2 is a schematic diagram illustrating an exemplary MRI scanner according to some embodiments of the present disclosure.

FIG. 2 is a schematic diagram illustrating an exemplary MRI scanner 200 according to some embodiments of the present disclosure. As illustrated, the MRI scanner 200 may include a gantry 210, a main magnet 220, gradient coils 230, radio frequency (RF) coils 240, and a patient support 250 (e.g., along the z-direction) configured to hold an object (e.g., the object 260). In some embodiments, the MRI scanner 110 in the MRI system 100 may be implemented based on the MRI scanner 200.

As illustrated, the main magnet 220 may generate a first magnetic field (or referred to as a main magnetic field) that may be applied to the object 260 (also referred to as subject) positioned inside the first magnetic field. The main magnet 220 may include a resistive magnet or a superconducting magnet that both need a power supply (not shown in FIG. 2) for operation. Alternatively, the main magnet 220 may include a permanent magnet. The main magnet 220 may form a detection region 270 and surround, along the z-direction, the object 260 that is moved into or positioned within the detection region 270. The main magnet 220 may also control the homogeneity of the generated main magnetic field. Some shim coils (not shown) may be in the main magnet 220. The shim coils placed in the gap of the main magnet 220 may compensate for the inhomogeneity of the magnetic field of the main magnet 220. The shim coils may be energized by a shim power supply.

The gradient coils 230 may be located inside the main magnet 220. For example, the gradient coils 230 may be located in the detection region 270. The gradient coils 230 may surround, along the z-direction, the object 260 that is moved into or positioned within the detection region 270. The gradient coils 230 may be surrounded by the main magnet 220 around the z-direction, and be closer to the object 260 than the main magnet 220. The gradient coils 230 may generate a second magnetic field (or referred to as a gradient field, including gradient fields Gx, Gy, and Gz). The second magnetic field may be superimposed on the main magnetic field generated by the main magnet 220 and distort the main magnetic field so that the magnetic orientations of the protons of an object may vary as a function of their positions inside the gradient field, thereby encoding spatial information into MR signals generated by the region of the object being imaged. The gradient coils 230 may include X coils (e.g., configured to generate the gradient field Gx corresponding to the x-direction), Y coils (e.g., configured to generate the gradient field Gy corresponding to the y-direction), and/or Z coils (e.g., configured to generate the gradient field Gz corresponding to the z-direction) (not shown in FIG. 2). The three sets of coils may generate three different magnetic fields that are used for position encoding. The gradient coils 230 may allow spatial encoding of MR signals for image reconstruction. As used herein, the X-axis, the Y-axis, the Z-axis, the x-direction, the y-direction, and the z-direction in the description of FIG. 2 are the same as or similar to those described in FIG. 1.

In some embodiments, the radio frequency (RF) coils 240 may be located inside the main magnet 220 and serve as transmitters, receivers, or both. For example, the RF coils 240 may be located in the detection region. The RF coils 240 may surround, along the z-direction, the object 260 that is moved into or positioned within the detection region 270. The RF coils 240 may be surrounded by the main magnet 220 and/or the gradient coils 230 around the z-direction, and be closer to the object 260 than the gradient coils 230. When used as transmitters, the RF coils 240 may generate RF signals that provide a third magnetic field that is utilized to generate MR signals related to the region of the object being imaged. The third magnetic field may be perpendicular to the main magnetic field. When used as receivers, the RF coils may be responsible for detecting MR signals (e.g., echoes).

In some embodiments, the main magnet 220, the gradient coils 230, and the RF coils 240 may be circumferentially positioned with respect to the object 260 around the z-direction. It is understood by those skilled in the art that the main magnet 220, the gradient coils 230, and the RF coils 240 may be situated in a variety of configurations around the object.

In some embodiments, the gantry 210 may be configured to support magnets (e.g., the main magnet 220 in FIG. 2), coils (e.g., the gradient coils 230 and/or the radio frequency (RF) coils 240 in FIG. 2), etc. The gantry 210 may surround, along the z-direction, the object 260 that is moved into or located within the detection region 270.

In some embodiments, the patient support 250 may be configured to support the object 260. In some embodiments, the patient support 250 may have 6 degrees of freedom, for example, three translational degrees of freedom along three coordinate directions (i.e., x-direction, y-direction, and z-direction) and three rotational degrees of freedom around the three coordinate directions. Accordingly, the object 260 may be positioned by the patient support 250 within the detection region 270. Merely by way of example, the patient support 250 may move the object 260 into the detection region 270 along the z-direction in FIG. 1.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

The present disclosure provides a superconducting magnet assembly that may be applied in an MRI system (e.g., the MRI system 100).

Figure 3:
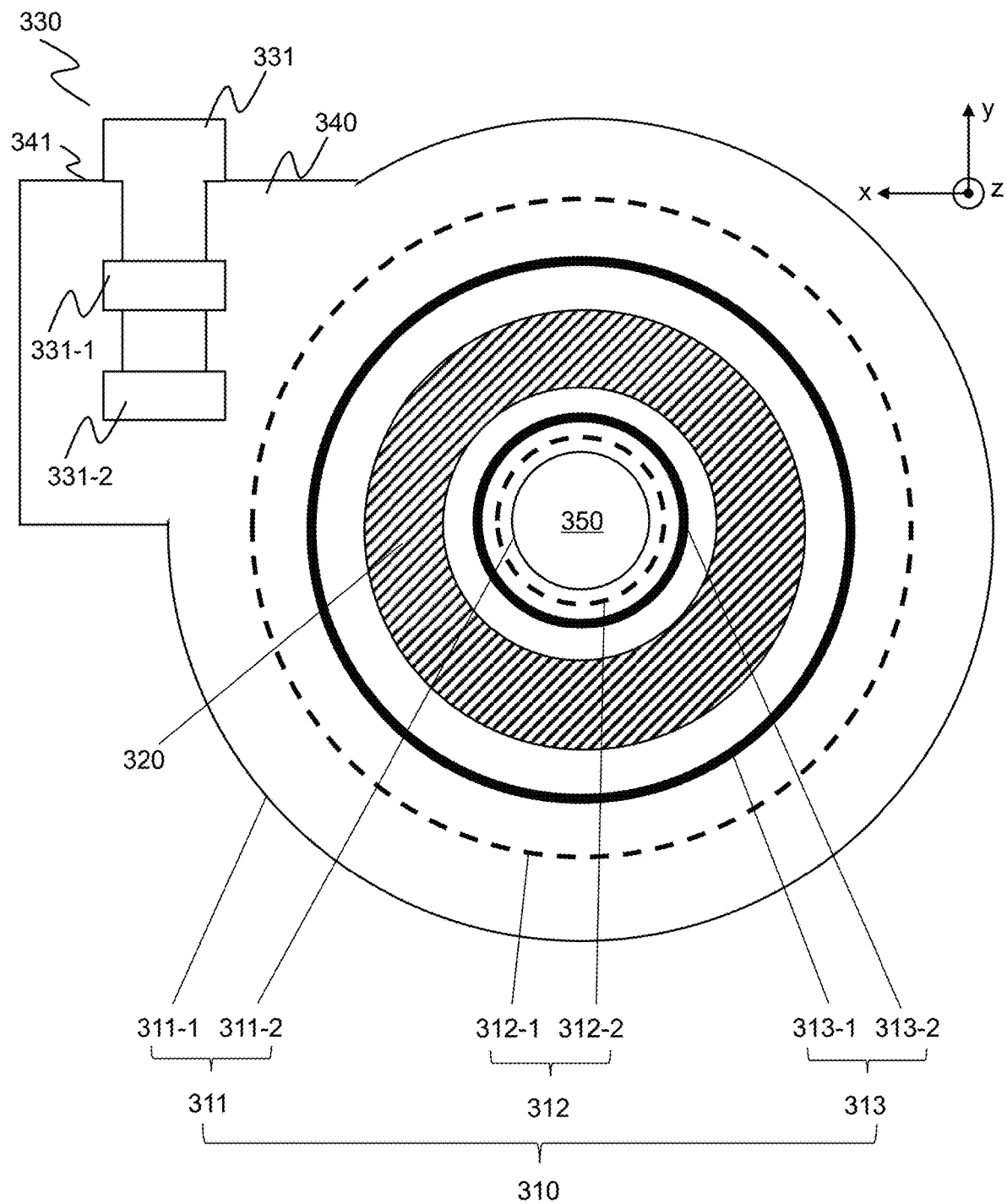
FIG. 3 is a schematic diagram illustrating an exemplary superconducting magnet assembly according to some embodiments of the present disclosure.

FIG. 3 is a schematic diagram illustrating an exemplary superconducting magnet assembly 300 according to some embodiments of the present disclosure. In some embodiments, the superconducting magnet assembly 300 may be applied in the main magnet 220 in the MRI scanner 200. As used herein, the x-direction, the y-direction, and the z-direction in FIG. 3 are the same as or similar to those described in FIG. 1.

In some embodiments, the superconducting magnet assembly 300 may include a cryostat 310, a superconducting magnet 320, and a refrigeration component 330. The superconducting magnet 320 may be configured to generate a main magnetic field and disposed within the cryostat 310. The superconducting magnet 320 may include at least one superconducting magnet coil. The refrigeration component 330 and the cryostat 310 may be configured to maintain the superconducting magnet 320 in a superconducting state.

The cryostat 310 may be a main structure of the superconducting magnet assembly 300. The cryostat 310 may be configured to accommodate a plurality of components of the superconducting magnet assembly 300, and maintain a low temperature state to ensure the performance of the superconducting magnet assembly 300.

In some embodiments, the cryostat 310 may include an outer vessel 311, a radiation shield 312 (also referred to as a radiation-proof heat leakage layer), and inner vessel 313 (also referred to as a vacuum vessel). The radiation shield 312 and inner vessel 313 may be disposed within the outer vessel 311.

In some embodiments, the inner vessel 313 may accommodate the superconducting magnet 330. In some embodiments, the inner vessel 313 may further accommodate a first cooling medium. The first cooling medium may include liquid helium, hyperpolarization materials, liquid nitrogen, water, etc. The first cooling medium may be directly or indirectly thermally coupled with the superconducting magnet 320. At least a portion of the superconducting magnet 320 may be immersed in the first cooling medium. Alternatively, the first cooling medium may be accommodated in a pipeline. The pipeline may be thermally coupled to the superconducting magnet 320. The superconducting magnet 320 may be cooled by the first cooling medium to reduce the temperature of the superconducting magnet 320 to a superconducting state, thereby ensuring the performance of the superconducting magnet 320 and avoiding the quench of superconductivity.

In some embodiments, the superconducting magnet assembly 300 may also be applied in a cryogen-free superconducting magnet system, in which the superconducting magnet 320 may be cooled to the superconducting state without a cooling medium.

In some embodiments, the radiation shield 312 may be configured to isolate the external heat (e.g., heat from the outside of the cryostat 310) from the superconducting magnet 320, thereby reducing or avoiding the transfer of the external heat to the superconducting magnet 320. The radiation shield 312 may be a shielding cover having a low surface emissivity, which may effectively reflect radiation heat from the outside (e.g., the outer vessel 311) to the inner vessel 313 to reduce the heat transfer between the outer vessel 311 and the inner vessel 313, thereby reducing the amount of evaporation of the first cooling medium in the inner vessel 313 and the quench of superconductivity of the superconducting magnet 320. In some embodiments, the radiation shield 312 may provide primary thermal truncation (thermal isolation) related to a specific temperature, e.g., 30-50 K. Therefore, the heat leakage of the transmission through a suspension or current lead to the inner vessel 313 may also be greatly reduced.

In some embodiments, the outer vessel 311, the inner vessel 313, the superconducting magnet 320, and the radiation shield 312 may be disposed coaxially (e.g., along the z-direction) or non-coaxially. In some embodiments, the inner vessel 313, the superconducting magnet 320, and the radiation shield 312 may be disposed in the outer vessel 311. The radiation shield 312 may be located between the outer vessel 311 and the inner vessel 313.

In some embodiments, the outer vessel 311 may include a through hole 350 extending in an axial direction (e.g., the z-direction). When the superconducting magnet assembly 300 is applied in the MRI scanner 200, the through hole 350 may correspond to the detection region 270 of the MRI scanner 200.

In some embodiments, at least one of the outer vessel 311, the radiation shield 312, and the inner vessel 313 may be an annular closed structure. In some embodiments, at least one of the outer vessel 311, the radiation shield 312, the superconducting magnet 320, and the inner vessel 313 may surround the through hole 350 around the z-direction.

In some embodiments, the outer vessel 311 may include a first outer cylinder 311-1, a first inner cylinder 311-2, and a first end plate. The first inner cylinder 311-2 and the first outer cylinder 311-1 may be hollow cylindrical structures. The first inner cylinder 311-2 and the first outer cylinder 311-1 may be around the z-direction. The through hole 350 may be formed based on the first inner cylinder 311-2. The first outer cylinder 311-1 may surround the peripheral circumference of the first inner cylinder 311-2 and have a larger diameter than the first inner cylinder 311-2. The first end plate may be disposed at both ends (e.g., along the z-direction) of the first inner cylinder 311-2 and the first outer cylinder 311-1. The first end plate may include two annular plate structures. The first end plate may be operably connected to the first inner cylinder 311-2 and the first outer cylinder 311-1 to cover the two ends of the first inner cylinder 311-2 and the first outer cylinder 311-1. In some embodiments, the first outer cylinder 311-1, the first inner cylinder 311-2, and the first end plate may form an annular closed accommodation space to accommodate the radiation shield 312, the inner vessel 313, the superconducting magnet 320, and at least a portion of the refrigeration component 330. In some embodiments, the outer vessel 311 may be made of a metal or a composite material. In some embodiments, the outer vessel 311 may be made of carbon steel or stainless steel.

In some embodiments, the inner vessel 313 may include a second outer cylinder 313-1, a second inner cylinder 313-2, and a second end plate. The second inner cylinder 313-2 and the second outer cylinder 313-1 may be hollow cylindrical structures. The second inner cylinder 313-2 and the second outer cylinder 313-1 may surround the through hole 350 around the z-direction. The second outer cylinder 313-1 may surround the peripheral circumference of the second inner cylinder 313-2 and have a larger diameter than the second inner cylinder 313-2. The second end plate may be disposed at both ends (e.g., along the z-direction) of the second inner cylinder 313-2 and the second outer cylinder 313-1. The second end plate may include two annular plate structures. The second end plate may be operably connected to the second inner cylinder 313-2 and the second outer cylinder 313-1 to cover the two ends of the second inner cylinder 313-2 and the second outer cylinder 313-1. In some embodiments, the second outer cylinder 313-1, the second inner cylinder 313-2, and the second end plate may form an annular closed accommodation space to accommodate the superconducting magnet 320. In some embodiments, the inner vessel 313 may be made of a metal or a composite material. In some embodiments, the inner vessel 313 may be made of carbon steel or stainless steel.

In some embodiments, the radiation shield 312 may include a third outer cylinder 312-1, a third inner cylinder 312-2, and a third end plate. The third inner cylinder 312-2 and the third outer cylinder 312-1 may be hollow cylindrical structures. The third inner cylinder 312-2 and the third outer cylinder 312-1 may surround the through hole 350 around the z-direction. The third outer cylinder 312-1 may surround the peripheral circumference of the third inner cylinder 312-2 and have a larger diameter than the third inner cylinder 312-2. The third end plate may be disposed at both ends (e.g., along the z-direction) of the third inner cylinder 312-2 and the third outer cylinder 312-1. The third end plate may include two annular plate structures. The third end plate may be operably connected to the third inner cylinder 312-2 and the third outer cylinder 312-1 to cover the two ends of the third inner cylinder 312-2 and the third outer cylinder 312-1. In some embodiments, the third outer cylinder 312-1, the third inner cylinder 312-2, and the third end plate may form an annular closed accommodation space to accommodate the inner vessel 313 and/or the superconducting magnet 320.

In some embodiments, along the radial direction, the third inner cylinder 312-2 may be located between the first inner cylinder 311-2 and the second inner cylinder 313-2. For example, the third inner cylinder 312-2 may surround the peripheral circumference of the first inner cylinder 311-2 around the z-direction. The second inner cylinder 313-2 may surround the peripheral circumference of the third inner cylinder 312-2 around the z-direction. In some embodiments, along the radial direction, the third outer cylinder 312-1 may be located between the first outer cylinder 311-1 and the second outer cylinder 313-1. For example, the third outer cylinder 312-1 may surround the peripheral circumference of the second outer cylinder 3211 around the z-direction. The first outer cylinder 311-1 may surround the peripheral circumference of the third outer cylinder 312-1 around the z-direction. In some embodiments, along the z-direction, the third end plate may be located between the first end plate and the second plate.

In some embodiments, the first outer cylinder 311-1 of the outer vessel 311 may surround the peripheral circumference of the radiation shield 312, the inner vessel 313, and the superconducting magnet 320 around the z-direction. In some embodiments, the third outer cylinder 312-1 of the radiation shield 312 may surround the peripheral circumference of the inner vessel 313 and/or the superconducting magnet 320. In some embodiments, the second outer cylinder 313-1 of the inner vessel 313 may surround the peripheral circumference of the superconducting magnet 320.

In some embodiments, there may be a space between the inner vessel 313 and the outer vessel 311, which is a vacuum environment. The vacuum environment may reduce the outward radiation of the cold energy of the inner vessel 313, and reduce the transfer of the external heat to the inner vessel 313, thereby ensuring a low temperature environment (e.g., a superconducting state) of the inner vessel 313. For example, the space may include a first sub-space between the first outer cylinder 311-1 and the second outer cylinder 313-1, and a second sub-space between the first inner cylinder 312 and the second inner cylinder 313-2. In some embodiments, the radiation shield 312 may be disposed within the space. For example, the third outer cylinder 312-1 may be disposed within the first sub-space and the third inner cylinder 312-2 may be disposed within the second sub-space.

The refrigeration component 330 may include a refrigerator 331. At least a portion of the refrigerator 331 may be disposed in the outer vessel 311. The refrigerator 331 may be configured to cool the radiation shield 312 to a specific temperature (e.g., 30-50K) and/or cool the superconducting magnet 320 to a superconducting state. In some embodiment, the refrigerator 331 may include a first stage cold head 331-1 configured to cool the radiation shield 312. In some embodiments, the refrigerator 331 may include a second stage cold head 331-2 configured to cool the superconducting magnet 320 to the superconducting state. When the refrigerator 331 operates, the cold energy generated by the refrigerator 331 may be transferred to the first stage cold head 331-1 and/or the second stage cold head 331-2. The first stage cold head 331-1 and the second stage cold head 331-2 may transfer the cold energy to the radiation shield 312 and the superconducting magnet 320, respectively.

In some embodiments, the refrigerator 331 may be disposed between the outer vessel 311 and the radiation shield 312 (e.g., between the first outer cylinder 311 and the third outer cylinder 3221), or between the outer vessel 311 and the inner vessel 313 (e.g., between the first outer cylinder 311 and the second outer cylinder 313-1). In some embodiments, the first cooling medium (e.g., liquid helium) in the inner vessel 313 may transform from a liquid state to a gaseous state after absorbing heat. The refrigerator 331 (e.g., the second stage cold head 331-2) may cool the first cooling medium from the gaseous state to the liquid state. The liquid first cooling medium may maintain the superconducting magnet 320 at a superconducting state. The refrigerator 331 may provide a sufficient cooling compensation to the superconducting magnet 320. A value of the cooling compensation may be greater than a value of the thermal leakage of the superconducting magnet 320 from the outside, thereby maintaining the first cooling medium in the inner vessel 313 to reduce volatilization or have no volatilization. Therefore, the superconducting magnet 320 immersed in the first cooling medium may be ensured to operate normally.

In some embodiments, the refrigerator 331 may be thermally coupled with the radiation shield 312 and/or the superconducting magnet 320. For example, the refrigerator 331 may be in direct contact with the radiation shield 312, the inner vessel 313, and/or the superconducting magnet 320. As another example, the refrigerator 331 may be thermally coupled with the radiation shield 312, the inner vessel 313, and/or the superconducting magnet 320 through a middle component.

In some embodiments, the first stage cold head 331-1 may be thermally coupled with the radiation shield 312. For example, the first stage cold head 331-1 may be in direct contact with the radiation shield 312 (e.g., the third outer cylinder 312-1). As another example, the first stage cold head 331-1 may be thermally coupled with the radiation shield 312 through a first middle component. In some embodiments, the second stage cold head 331-2 may be thermally coupled with the superconducting magnet 320. For example, the second stage cold head 331-2 may be in direct contact with the inner vessel 313 (e.g., the second outer cylinder 313-1). As another example, the second stage cold head 331-2 may be extended in the inner vessel 313 to be in direct contact with the superconducting magnet 320. As still another example, the second stage cold head 331-2 may be extended in the inner vessel 313 to be in contact with the first cooling medium or a pipeline accommodating the first cooling medium. As further another example, the second stage cold head 331-2 may be thermally coupled with the inner vessel 313 (e.g., the second outer cylinder 313-1) through a second middle component.

In some embodiments, the first middle component may be disposed between the refrigerator 331 (e.g., the first stage cold head 331-1) and the radiation shield 312, and connect the refrigerator 331 (e.g., the first stage cold head 331-1) and the radiation shield 312. The second middle component may be disposed between the refrigerator 331 (e.g., the second stage cold head 331-2) and the superconducting magnet 320, and connect the refrigerator 331 (e.g., the second stage cold head 331-2) and the superconducting magnet 320. In some embodiments, the middle component may include a thermal transfer band. The thermal transfer band may transfer the cold energy produced by the refrigerator 331 to cool the radiation shield 312 and/or the superconducting magnet 320. In some embodiments, the thermal transfer band may include a thermal transfer soft band. In some embodiments, the thermal transfer band may be made of a material with high thermal transfer, such as high purity copper, high-pure aluminum, or the like.

In some embodiments, the middle component may include a switch component configured to adjust, based on an operation status of the refrigerator 331, heat transfer efficiency between the refrigerator 331 (e.g., the first stage cold head and/or the second stage cold head) and the cryostat 310 (e.g., the radiation shield 312 and/or the superconducting magnet 320). Details regarding the switch component may be found elsewhere in the present disclosure (e.g., the description in connection with FIGS. 4 through 11).

In some embodiments, the cryostat 310 may further include a service turret 340. The service turret 340 may be operably connected with the outer vessel 311 (e.g., the first outer cylinder 311-1 of the outer vessel 311). At least a portion of the service turret 340 may be protruded outside the outer vessel 311. The service turret 340 may include an accommodation space that is in fluid communication with the accommodation space of the outer vessel 311. In some embodiments, at least a portion of the refrigeration component 330 may be located in the service turret 340. As shown in FIG. 3, the service turret 340 may form a cold head sleeve. The cold head sleeve may include an opening end 341. The cold head sleeve may be configured to accommodate at least a portion of the refrigeration component 330. In some embodiments, a portion of the refrigeration component 330 may be located in the service turret 340 to cool the radiation shield 312 and/or the superconducting magnet 320. Atop portion of the refrigeration component 330 may extend outside the service turret 340 through the opening end 341. In some embodiments, the service turret 340 may also be configured to dispose an opening configured to allow addition of the first cooling medium to the cryostat 310. In some embodiments, the service turret 340 may also be configured to dispose one or more interfaces configured to connect a lead wire of the superconducting magnet 320.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

When the cold head (e.g., the first stage cold head 331-1 and/or the second stage cold head 331-2) of the refrigerator 331 is stopped or replaced with a new cold head, the cold head no longer works to perform refrigeration. The cold head may become a good conductor. The external heat (e.g., heat from the outside of the cryostat 310) may be transferred to the cold head, and easy to be transferred to the radiation shield 312 and/or the superconducting magnet 320) through the cold head with high heat transfer rate. Accordingly, the temperature of the cryostat 310 may increase. The first cooling medium (e.g., liquid helium) in the cryostat 310 may be volatilized, resulting in a loss of the first cooling medium. Especially for magnets with little or no first cooling medium, after the cold head is stopped, since there is no large amount of first cooling medium as a heat sink, the heat may be transferred into the superconducting magnet 320 immediately, which is easy to cause a quench of superconductivity of the superconducting magnet 320, affecting the performance of the superconducting magnet assembly 300.

In response to the above problem of the quench of superconductivity caused by transferring external heat to the cryostat 310 through the cold head when the cold head is stopped, the present disclosure provides a switch component, a superconducting magnet assembly with the switch component, and an MRI scanner with the switch component. The switch component may avoid or reduce heat transfer between the cold head and the cryostat when the cold head is stopped, thereby avoiding volatilization of the first cooling medium (e.g., liquid helium) and the quench of superconductivity. The performance of the superconducting magnet assembly may be ensured, and thus the performance of the MRI scanner may be ensured.

Figure 4:
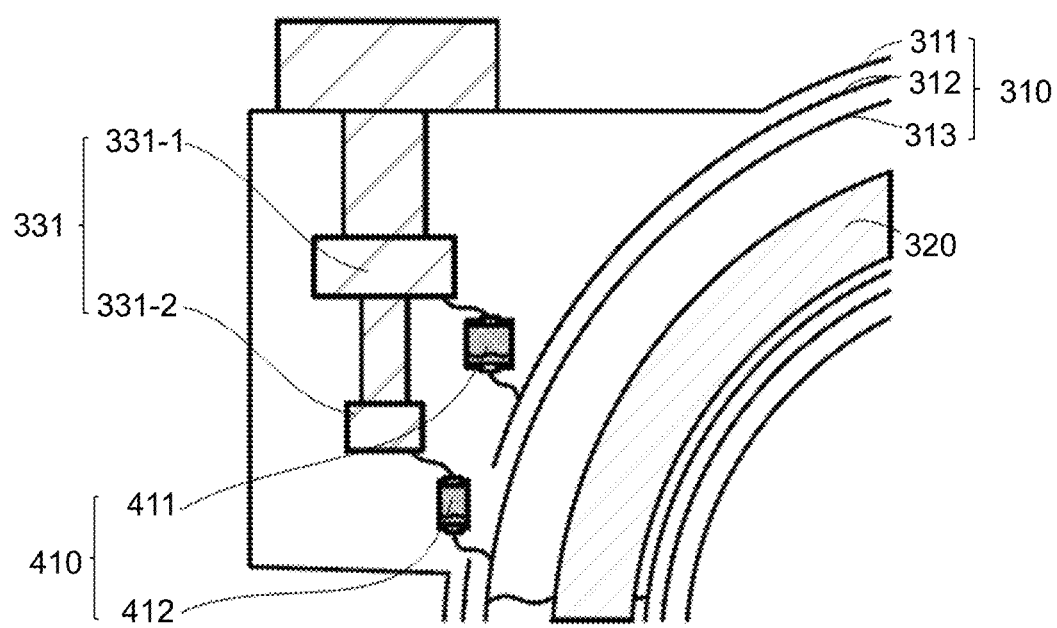
FIG. 4 is a schematic diagram illustrating an exemplary superconducting magnet assembly according to some embodiments of the present disclosure.

FIG. 4 is a schematic diagram illustrating an exemplary superconducting magnet assembly 400 according to some embodiments of the present disclosure. compared with the superconducting magnet assembly 300 in FIG. 3, in the superconducting magnet assembly 400, the refrigeration component 330 may further include a switch component 410 (the middle component illustrated in FIG. 3) configured to adjust, based on an operation status of the refrigerator 331, heat transfer efficiency between the refrigerator 331 and the cryostat 310. In some embodiments, the superconducting magnet assembly 400 may be applied in the main magnet 220 of the MRI scanner 200 in FIG. 2.

In some embodiments, the switch component 410 may include a first thermal switch 411 and/or a second thermal switch 412. The first thermal switch 411 may include a first activation mode and a first deactivation mode. The first activation mode may be configured to increase heat transfer efficiency between the first stage cold head 331-1 and the radiation shield 312 so as to facilitate heat transfer between the first stage cold head 331-1 and the radiation shield 312. The first deactivation mode may be configured to decrease the heat transfer efficiency between the first stage cold head 331-1 and the radiation shield 312 so as to break or impede the heat transfer between the first stage cold head 331-1 and the radiation shield 312. The second thermal switch 412 may include a second activation mode and a second deactivation mode. The second activation mode may be configured to increase heat transfer efficiency between the second stage cold head 331-2 and the superconducting magnet 320 so as to facilitate heat transfer between the second stage cold head 331-2 and the superconducting magnet 320. The second deactivation mode may be configured to decrease the heat transfer efficiency between the second stage cold head 331-2 and the superconducting magnet 320 so as to break or impede the heat transfer between the second stage cold head 331-2 and the superconducting magnet 320.

In some embodiments, when the refrigerator 331 operates, the first thermal switch may be in the first activation mode, and/or the second thermal switch may be in the second activation mode. When the refrigerator 331 does not operate, the first thermal switch may be in the first deactivation mode, and/or the second thermal switch may be in the second deactivation mode.

In some embodiments, the switch component 410 may include a first end and a second end. The first end of the switch component 410 may be thermally coupled with the refrigerator 331. The second end of the switch component 410 may be thermally coupled with the radiation shield 312 and/or the superconducting magnet 320.

In some embodiments, the first stage cold head 331-1 may be thermally coupled with the radiation shield 312 through the first thermal switch 411. In some embodiments, the second stage cold head 331-2 may be thermally coupled with the superconducting magnet 320 through the second thermal switch 412. When the refrigerator 331 operates, the cold energy generated by the refrigerator 331 may be transferred to the first stage cold head 331-1 and/or the second stage cold head 331-2. The first stage cold head 331-1 and the second stage cold head 331-2 may transfer the cold energy to the radiation shield 312 and the superconducting magnet 320, respectively.

In some embodiments, the refrigeration component may further include a connection component configured to operably connect the refrigerator 331 and the switch component 410, and operably connect the tank 320 and the switch component 410. The switch component 410 may include two modes of turning-on and turning-off. The connection component may be configured to operably connect the refrigerator 331 (e.g., the second stage cold head 331-2) and the superconducting magnet 320, and/or operably connect the refrigerator 331 (e.g., the first stage cold head 331-1) and the radiation shield 312. The switch component 410 may be turned on to facilitating the thermal coupling between the refrigerator 331 (e.g., the second stage cold head 331-2) and the superconducting magnet 320 or a thermal coupling between the refrigerator 331 (e.g., the first stage cold head 331-1) and the radiation shield 312. The switch component 410 may be turned off to break or impede the thermal coupling between the refrigerator 331 and the superconducting magnet 320, and/or the thermal coupling between the refrigerator 331 and the radiation shield 312. The switch component 410 may adjust, based on an operation status of the refrigerator 331, heat transfer efficiency between the refrigerator 331 and the tank 320, which may ensure the cooling effect and the radiation shielding effect.

In some embodiments, the switch component 410 may include one thermal switch, e.g., the switch component 410 may include the first thermal switch 411 or the second thermal switch 412. In some embodiments, the switch component 410 may include more than one thermal switch, e.g., the switch component 410 may include at least one first thermal switch 411 and at least one second thermal switch 412. In the present disclosure, the number (or count) of thermal switches being two is merely for illustration. The structure and principle that the number (or count) of thermal switches is one or more than two may be the same as the structure and principle that the number (or count) of thermal switches is two, which may not be repeated herein.

The heat transfer efficiency between the first stage cold head 331-1 and the radiation shield 312 may be adjusted through the first thermal switch 411 based on the operation status of the refrigerator 331 (e.g., the first stage cold head 331-1). When the refrigerator 331 (e.g., the first stage cold head 331-1) operates, the first thermal switch 411 may be in a first activation mode (also referred to as a first turning-on mode). The first thermal switch 411 may increase the heat transfer efficiency between the first stage cold head 331-1 and the radiation shield 312, thereby facilitating the thermal coupling between the first stage cold head 331-1 and the radiation shield 312. At this time, the cold energy generated by the refrigerator 331 (e.g., the first stage cold head 331-1) may be transferred to the radiation shield 312 through the first thermal switch 411 to cool the radiation shield 312, reduce the temperature of the radiation shield 312, and reduce the heat transfer from the outer vessel 311 to the superconducting magnet 320. When the refrigerator 331

(e.g., the first stage cold head 331-1) is stopped or replaced, the first thermal switch 411 may be in a first deactivation mode (also referred to as a first turning-off mode). The first thermal switch 411 may reduce the heat transfer efficiency between the first stage cold head 331-1 and the radiation shield 312, thereby breaking or impeding the thermal coupling between the first stage cold head 331-1 and the radiation shield 312. The heat absorbed by the refrigerator 331 from the outside may be difficult to be transferred to the radiation shield 312 through the first thermal switch 411. Although the first stage cold head 331-1 is a good thermal conductor, since the first thermal switch 411 breaks or impedes the thermal coupling between the first stage cold head 331-1 and the radiation shield 312, the external heat (e.g., heat outside the cryostat 310) may be difficult to be transferred to the radiation shield 312 through the first stage cold head 331-1 and the first thermal switch 411 to ensure the radiation shielding effect of the radiation shield 312 to the outer vessel 311.

The heat transfer efficiency between the second stage cold head 331-2 and the superconducting magnet 320 may be adjusted through the second thermal switch 412 based on the operation status of the refrigerator 331 (e.g., the second stage cold head 331-2). When the refrigerator 331 (e.g., the second stage cold head 331-2) operates, the second thermal switch 412 may be in a second activation mode (also referred to as a second turning-on mode). The second thermal switch 412 may increase the heat transfer efficiency between the second stage cold head 331-2 and the superconducting magnet 320, thereby facilitating the thermal coupling between the second stage cold head 331-2 and the superconducting magnet 320. At this time, the cold energy generated by the refrigerator 331 (e.g., the second stage cold head 331-2) may be transferred to the superconducting magnet 320 through the second thermal switch 412 to cool the superconducting magnet 320, reduce the temperature of the superconducting magnet 320, and reduce the heat transfer from the outer vessel 311 to the superconducting magnet 320. When the refrigerator 331 (e.g., the second stage cold head 331-2) is stopped or replaced, the second thermal switch 412 may be in a second deactivation mode (also referred to as a second turning-off mode). The second thermal switch 412 may reduce the heat transfer efficiency between the second stage cold head 331-2 and the superconducting magnet 320, thereby breaking or impeding the thermal coupling between the second stage cold head 331-2 and the superconducting magnet 320. The heat absorbed by the refrigerator 331 from the outside may be difficult to be transferred to the superconducting magnet 320 through the second thermal switch 412. Although the second stage cold head 331-2 is a good thermal conductor, since the second thermal switch 412 breaks or impedes the thermal coupling between the second stage cold head 331-2 and the superconducting magnet 320, the external heat may be difficult to be transferred to the superconducting magnet 320 through the second stage cold head 331-2 and the second thermal switch 412 to ensure the cooling effect to the superconducting magnet 320.

In some embodiments, the heat transfer efficiency between the refrigerator 331 (e.g., the first stage cold head 331-1) and the radiation shield 312, and the heat transfer efficiency between the refrigerator 331 (e.g., the second stage cold head 331-2) and the superconducting magnet 320 may be adjusted, based on the operation status of the refrigerator 331, through the first thermal switch 411 and the second thermal switch 412, respectively. When the refrigerator 331 operates, the first thermal switch 411 and the second thermal switch 412 may be in an activation mode. The cold energy produced by the refrigerator 331 may be transferred to the radiation shield 312 and the superconducting magnet 320 through the first thermal switch 411 and the second thermal switch 412, respectively. The temperature of the superconducting magnet 320 may be reduced, avoiding the quench of superconductivity. When the refrigerator 331 does not operate or needs to be replaced, the first thermal switch 411 and the second thermal switch 412 may be in a deactivation mode, and reduce the heat transfer efficiency between the refrigerator 331 and the radiation shield 312, and the heat transfer efficiency between the refrigerator 331 and the superconducting magnet 320 to break or impede the thermal coupling between the refrigerator 331 and the radiation shield 312, and the thermal coupling between the refrigerator 331 and the superconducting magnet 320, avoiding the transfer of the external heat to the superconducting magnet 320 and the radiation shield 312 inside the cryostat 310 through the first stage cold head 331-1 and the second stage cold head 331-2, thereby avoiding the loss of the first cooling medium in the cryostat 310. Therefore, maintenance costs of the superconducting magnet assembly 400 may be reduced.

In the superconducting magnet assembly 400, the heat transfer efficiency between the refrigerator 331 and the radiation shield 312 inside the cryostat 310, and the heat transfer efficiency between the refrigerator 331 and the superconducting magnet 320 inside the cryostat 310 may be adjusted through the first thermal switch 411 and the second thermal switch 412, respectively, which may effectively solve the problem that when the refrigerator 331 stops operating or is replaced, the external heat may be transferred to the cryostat 310 through the refrigerator 331 to cause the quench of superconductivity. Therefore, the volatilization of the liquid helium in the cryostat 310 may be avoided or reduced, thereby avoiding the quench of superconductivity and ensuring the performance of the superconducting magnet assembly 400.

In some embodiments, the switch component 410 may include a container. The container may include a first end and a second end. The first end of the container may be thermally coupled with the refrigerator 331 (e.g., the first stage cold head 331-1 and/or the second stage cold head 331-2). The second end of the container may be thermally coupled with the radiation shield 312 and/or the superconducting magnet 320. The container may be a hollow closed structure. The container may be filled with a transfer medium that transitions between a gas phase and a liquid phase based on a refrigeration temperature of the refrigerator 331. In some embodiments, the location of the first end of the container may be higher than the location of the second end of the container. For example, the first end of the container may be the upper end of the container, and the second end of the container may be the lower end of the container. In some embodiments, the container may be of any shape, e.g., cuboid, cylinder, pipeline, etc.

In some embodiments, the switch component 410 may include a cold end and a hot end. The first end of the container may be operably connected with the cold end. The first end of the container may be thermally coupled with the refrigerator 331 through the cold end. The second end of the container may be operably connected with the hot end. The second end of the container may be thermally coupled with the radiation shield 312 and/or the superconducting magnet 320 through the hot end.

Figure 5A:
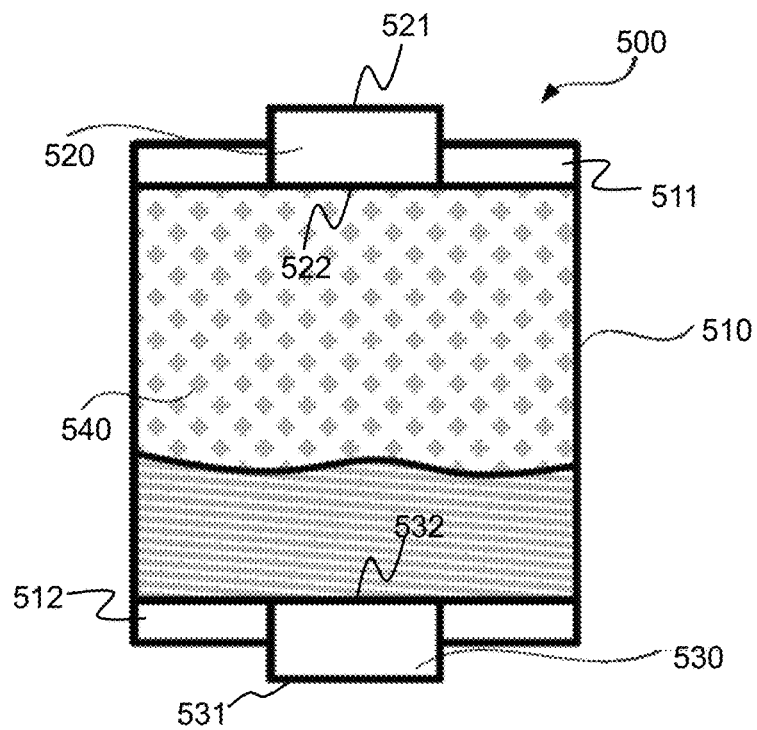
FIGS. 5A and 5B are schematic diagrams illustrating a first activation mode and a first deactivation mode of an exemplary first thermal switch, respectively, according to some embodiments of the present disclosure.
Figure 5B:
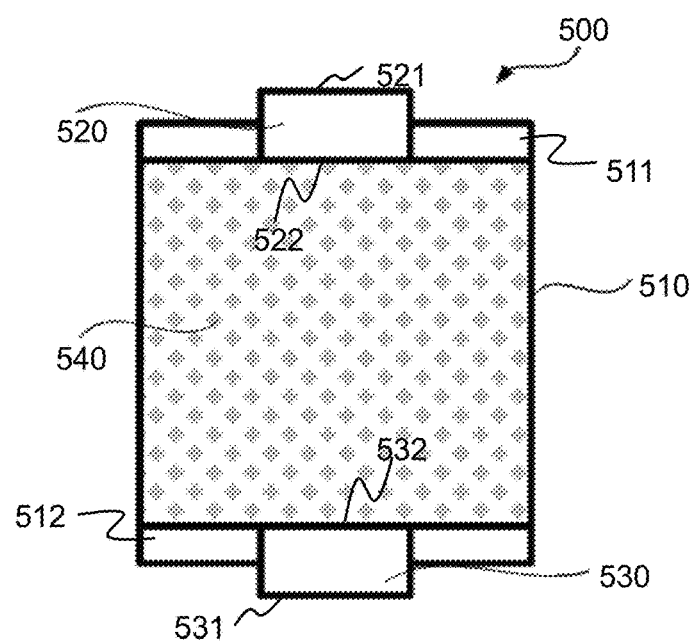

FIG. 5A is a schematic diagram illustrating a first activation mode of an exemplary first thermal switch 500 according to some embodiments of the present disclosure. FIG. 5B is a schematic diagram illustrating a first deactivation mode of the exemplary first thermal switch 500 according to some embodiments of the present disclosure. In some embodiments, the first thermal switch 500 may be applied in the first thermal switch 411 of the superconducting magnet assembly 400 in FIG. 4.

In some embodiments, the first thermal switch 500 may include a first container 510. The first container 510 may include a first end 511 and a second end 512. The first end 511 may be thermally coupled with a cold head of a refrigerator (e.g., the first stage cold head 331-1 of the refrigerator 331). The second end 512 may be thermally coupled with the radiation shield 312. In some embodiments, the first thermal switch 500 may further include a first cold end 520 and a first hot end 530. The first cold end 520 and the first hot end 530 may be operably connected with the first end 511 and the second end 512 of the first container 510, respectively. The first cold end 520 may be thermally coupled with the first stage cold head 331-1. The first hot end 530 may be thermally coupled with the radiation shield 312. The first container 510 may be a hollow closed structure. The first container 510 may be filled with a first transfer medium 540 that transitions between a gas phase and a liquid phase based on a refrigeration temperature of the first stage cold head 331-1.

In some embodiments, the location of the first end 511 may be higher than the location of the second end 512. For example, as shown in FIGS. 5A and 5B, the first end 511 may be the upper end of the first container 510, and the second end 512 may be the lower end of the first container 510. In the first container 510, the gaseous first transfer medium 540 may converge to the first end 511 (e.g., the upper end of the first container 510). The liquid first transfer medium 540 may converge to the second end 512 (e.g., the lower end of the first container 510). The first cold end 520 may be operably connected with the first end 511 of the first container 510. A first end 521 of the first cold end 520 may be thermally coupled with the first stage cold head 331-1, and a second end 522 of the first cold end 520 may be operably connected with the first end 511. For example, the second end 522 of the first cold end 520 may extend into the first container 510 through the first end 511, and be in contact with the first transfer medium 540 in the first container 510. The cold energy may be transferred from the first stage cold head 331-1 to the first transfer medium 540 through the first cold end 520. The first hot end 530 may be operably connected with the second end 512 of the first container 510. A first end 531 of the first hot end 530 may be thermally coupled with the radiation shield 312, and a second end 532 of the first hot end 530 may be operably connected with the second end 512. For example, the second end 532 of the first hot end 530 may extend into the first container 510 through the second end 512, and be in contact with the first transfer medium 540 in the first container 510. The cold energy may be transferred from the first transfer medium 540 to the radiation shield 312 through the first hot end 530.

In some embodiments, when the refrigerator 331 operates, the first thermal switch 500 may be in a first activation mode, and configured to increase the heat transfer efficiency between the first stage cold head 331-1 and the radiation shield 312, thereby facilitating the thermal coupling between the first stage cold head 331-1 and the radiation shield 312. In some embodiments, when the refrigerator 331 operates, the cold energy generated by the refrigerator 331 may be transferred to the first stage cold head 331-1. Since the first cold end 520 is thermally coupled with the first stage cold head 331-1, the cold energy of the first stage cold head 331-1 may be transferred to the first cold end 520. The first cold end 520 may transfer the cold energy to the inside of the first container 510. For example, the second end 522 of the first cold end 520 may be in contact with the gaseous first transfer medium 540 in the first container 510 to transfer the cold energy to the first transfer medium 540.

In some embodiments, the temperature of the cold energy received by the first cold end 520 may be equal to or lower than a boiling point of the first transfer medium 540. When the gaseous first transfer medium 540 absorbs the cold energy transferred by the first cold end 520, the first transfer medium 540 at the first end 511 of the first container 510 may be liquefied (e.g., on a surface of the second end 522 of the first cold end 520). The liquefied first transfer medium 540 may flow downward to the second end 512 of the first container 510 under the gravity action to form a liquid pool at the second end 512. The liquid first transfer medium 540 may be in contact with the second end 532 of the first hot end 530. Therefore, the temperature of the first hot end 530 may be reduced to the temperature of the liquid first transfer medium 540, thereby achieving the purpose of cooling the first hot end 530. In some embodiments, the radiation shield 312 may exchange heat with the first hot end 530. After the first hot end 530 absorbs the cold energy, the cold energy may be transferred to the radiation shield 312 from the first hot end 530 to reduce the temperature of the radiation shield 312. The radiation shield 312 may transfer heat to the first hot end 530.

While the liquid first transfer medium 540 transfers the cold energy to the first hot end 530, the liquid first transfer medium 540 may absorb the heat of the first hot end 530. The first transfer medium 540 may evaporate to the gaseous state from the liquid state. The gaseous first transfer medium 540 may rise in the first container 510 to the first end 511, and be in contact with the first cold end 520. As such a cycle, the cold energy of the first cold end 520 may be transferred to the first hot end 530 through the gas-liquid transition of the first transfer medium 540. In this case, the first thermal switch 500 may be in a first activation mode.

In some embodiments, when the refrigerator 331 does not operate, the refrigerator 331 may not generate cold energy. The first stage cold head 331-1 may not receive cold energy. The external heat (e.g., from the outside of the outer vessel 311) may be transferred to the first stage cold head 331-1, and the temperature of the first stage cold head 331-1 may increase. For example, the temperature of the first stage cold head 331-1 when the refrigerator 331 does not operate may be higher than the temperature of the first stage cold head 331-1 (e.g., the refrigeration temperature of the first stage cold head 331-1) when the refrigerator 331 operates. Since the first stage cold head 331-1 is thermally coupled with the first cold end 520, the first stage cold head 331-1 may transfer the heat to the first cold end 520. Therefore, the temperature of the first cold end 520 may increase, and be higher than the boiling point of the first transfer medium 540. The gaseous first transfer medium 540 at the first end 511 may not be liquefied. After the heat of the radiation shield 312 is transferred to the first hot end 530, the liquid first transfer medium 540 at the second end 512 of the first container 510 may absorb the heat of the first hot end 530 and evaporate into the gaseous state. In this case, the first container 510 may be filled with the gaseous first transfer medium 540.

In some embodiments, the temperature of the first hot end 530 may be lower than the temperature of the first cold end 520. The temperature of the gaseous first transfer medium 540 at the first end 511 may be higher than the temperature of the gaseous first transfer medium 540 at the second end 512. Therefore, temperature stratification may form in the gaseous first transfer medium 540 in the first container 510, which may lead to poor gas flow of the gaseous first transfer medium 540 in the first container 510, thereby causing the heat transfer efficiency of the gaseous first transfer medium 540 in the first container 510 to be low. In this case, the first thermal switch 500 may be in a first deactivation mode, in which the heat transfer between the first cold end 520 and the first hot end 530 may be avoided or reduced, thereby avoiding or reducing the heat transfer between the first stage cold head 331-1 and the radiation shield 312.

In some embodiments, the first container 510 may be made of a material with a poor heat transfer rate. In some embodiments, the first container 510 may be made of stainless steel. In some embodiments, the first container 510 may also be made of other materials with poor heat transfer rate, such as ceramic, etc.

In some embodiments, the first cold end 520 and/or the first hot end 530 may be made of a high thermally conductive material. In some embodiments, the first cold end 520 and/or the first hot end 530 may be made of copper to ensure the heat transfer effect. In some embodiments, the first cold end 520 and/or the first hot end 530 may also be made of other materials with relatively high heat transfer rate. In some embodiments, the first end 521 and/or the second end 522 of the first cold end 520 may be provided with a thread to facilitate the connection between the first cold end 520 and other components (e.g., the first stage cold head 331-1, the first connection piece 710, the first end 511 of the first container 510, etc.). In some embodiments, the first end 531 and/or the second end 532 of the first hot end 530 may be provided with a thread to facilitate the connection between the first hot end 530 and other components (e.g., the radiation shield 312, the first connection piece 710, the second end 512 of the first container 510, etc.).

Figure 6A:
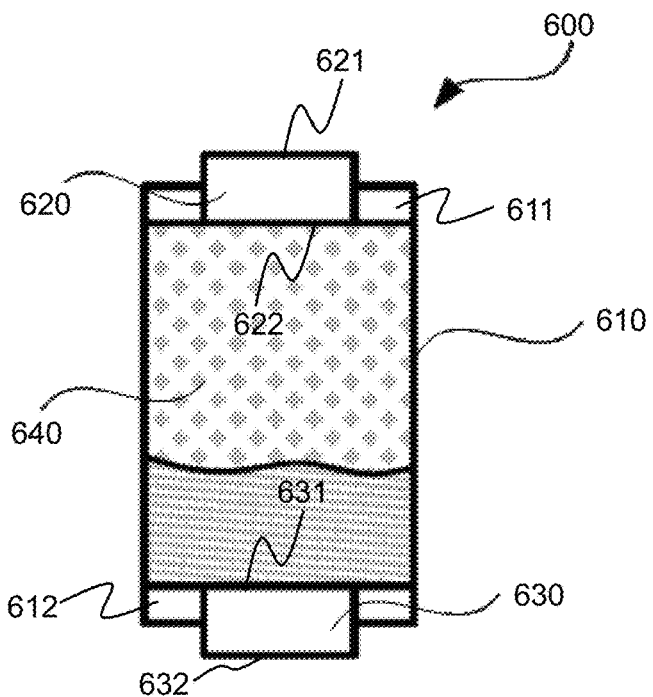
FIGS. 6A and 6B are schematic diagrams illustrating a second activation mode and a second deactivation mode of an exemplary second thermal switch, respectively, according to some embodiments of the present disclosure.
Figure 6B:
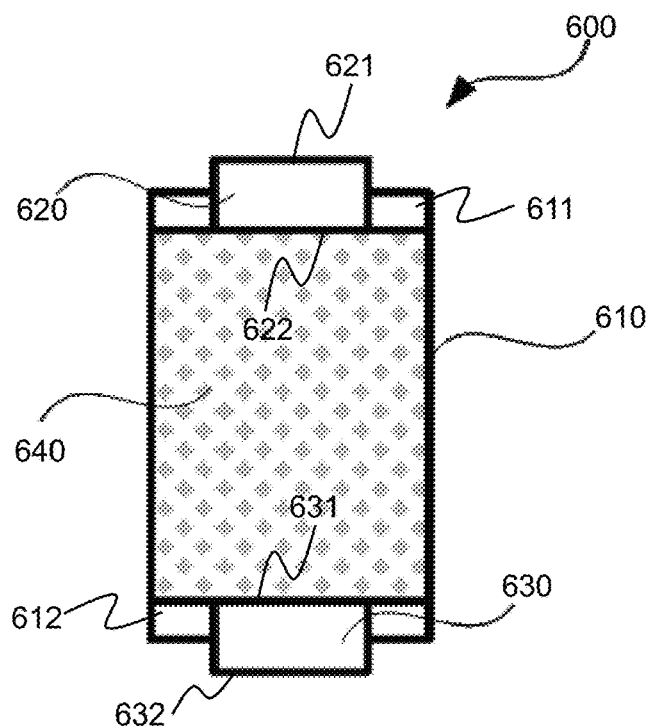

FIG. 6A is a schematic diagram illustrating a second activation mode of an exemplary second thermal switch 600 according to some embodiments of the present disclosure. FIG. 6B is a schematic diagram illustrating a second deactivation mode of the exemplary second thermal switch 600 according to some embodiments of the present disclosure. In some embodiments, the second thermal switch 600 may be applied in the second thermal switch 412 of the superconducting magnet assembly 400 in FIG. 4.

In some embodiments, the second thermal switch 600 may include a second container 610. The second container 610 may include a first end 611 and a second end 612. The first end 611 may be thermally coupled with a cold head of a refrigerator (e.g., the second stage cold head 331-2 of the refrigerator 331). The second end 612 may be thermally coupled with the superconducting magnet 320. In some embodiments, the second thermal switch 600 may further include a second cold end 620 and a second hot end 630. The second cold end 620 and the second hot end 630 may be operably connected with the first end 611 and the second end 612 of the second container 610, respectively. The second cold end 620 may be thermally coupled with the second stage cold head 331-2. The second hot end 630 may be thermally coupled with the superconducting magnet 320. The second container 610 may be a hollow closed structure. The second container 610 may be filled with a second transfer medium 640 that transitions between a gas phase and a liquid phase based on a refrigeration temperature of the second stage cold head 331-2.

In some embodiments, the location of the first end 611 may be higher than the location of the second end 612. For example, as shown in FIGS. 6A and 6B, the first end 611 may be the upper end of the second container 610, and the second end 612 may be the lower end of the second container 610. In the second container 610, the gaseous second transfer medium 640 may converge to the first end 611 (e.g., the upper end of the second container 610). The liquid second transfer medium 640 may converge to the second end 612 (e.g., the lower end of the second container 610). The second cold end 620 may be operably connected with the first end 611 of the second container 610. A first end 621 of the second cold end 620 may be thermally coupled with the second stage cold head 331-2, and a second end 622 of the second cold end 620 may be operably connected with the first end 611. For example, the second end 622 of the second cold end 620 may extend into the second container 610 through the first end 611, and be in contact with the second transfer medium 640 in the second container 610. The cold energy may be transferred from the second stage cold head 331-2 to the second transfer medium 640 through the second cold end 620. The second hot end 630 may be operably connected with the second end 612 of the second container 610. A first end 631 of the second hot end 630 may be thermally coupled with the superconducting magnet 320, and a second end 632 of the second hot end 630 may be operably connected with the second end 612. For example, the second end 632 of the second hot end 630 may extend into the second container 610 through the second end 612, and be in contact with the second transfer medium 640 in the second container 610. The cold energy may be transferred from the second transfer medium 640 to the superconducting magnet 320 through the second hot end 630.

In some embodiments, when the refrigerator 331 operates, the second thermal switch 600 may be in a second activation mode, and configured to increase the heat transfer efficiency between the second stage cold head 331-2 and the magnet component, thereby facilitating the thermal coupling between the second stage cold head 331-2 and the superconducting magnet 320. In some embodiments, when the refrigerator 331 operates, the cold energy generated by the refrigerator 331 may be transferred to the second stage cold head 331-2. Since the second cold end 620 is thermally coupled with the second stage cold head 331-2, the cold energy of the second stage cold head 331-2 may be transferred to the second cold end 620. The second cold end 620 may transfer the cold energy to the inside of the second container 610. For example, the second end 622 of the second cold end 620 may be in contact with the gaseous second transfer medium 640 in the second container 610 to transfer the cold energy to the second transfer medium 640.

In some embodiments, the temperature of the cold energy received by the second cold end 620 may be equal to or lower than a boiling point of the second transfer medium 640. When the gaseous second transfer medium 640 absorbs the cold energy transferred by the second cold end 620, the second transfer medium 640 at the first end 611 of the second container 610 may be liquefied (e.g., on a surface of the second end 622 of the second cold end 620). The liquefied second transfer medium 640 may flow downward to the second end 612 of the second container 610 under the gravity action to form a liquid pool at the second end 612. The liquid second transfer medium 640 may be in contact with the second end 632 of the second hot end 630. Therefore, the temperature of the second hot end 630 may be reduced to the temperature of the liquid second transfer medium 640, thereby achieving the purpose of cooling the second hot end 630. In some embodiments, the superconducting magnet 320 may exchange heat with the second hot end 630. After the second hot end 630 absorbs the cold energy, the cold energy may be transferred to the superconducting magnet 320 from the second hot end 630 to reduce the temperature of the superconducting magnet 320. The superconducting magnet 320 may transfer heat to the second hot end 630.

While the liquid second transfer medium 640 transfers the cold energy to the second hot end 630, the liquid second transfer medium 640 may absorb the heat of the second hot end 630. The second transfer medium 640 may evaporate to the gaseous state from the liquid state. The gaseous second transfer medium 640 may rise in the second container 610 to the first end 611, and be in contact with the second cold end 620. As such a cycle, the cold energy of the second cold end 620 may be transferred to the second hot end 630 through the gas-liquid transition of the second transfer medium 640. In this case, the second thermal switch 600 may be in a second activation mode.

In some embodiments, when the refrigerator 331 does not operate, the refrigerator 331 may not generate cold energy. The second stage cold head 331-2 may not receive cold energy. The external heat (e.g., from the outside of the outer vessel 311) may be transferred to the second stage cold head 331-2, and the temperature of the second stage cold head 331-2 may increase. For example, the temperature of the second stage cold head 331-2 when the refrigerator 331 does not operate may be higher than the temperature of the second stage cold head 331-2 (e.g., the refrigeration temperature of the second stage cold head 331-2) when the refrigerator 331 operates. Since the second stage cold head 331-2 is thermally coupled with the second cold end 620, the second stage cold head 331-2 may transfer the heat to the second cold end 620. Therefore, the temperature of the second cold end 620 may increase, and be higher than the boiling point of the second transfer medium 640. The gaseous second transfer medium 640 at the first end 611 may not be liquefied. After the heat of the superconducting magnet 320 is transferred to the second hot end 630, the liquid second transfer medium 640 at the second end 612 of the second container 610 may absorb the heat of the second hot end 630 and evaporate into the gaseous state. In this case, the second container 610 may be filled with the gaseous second transfer medium 640.

In some embodiments, the temperature of the second hot end 630 may be lower than the temperature of the second cold end 620. The temperature of the gaseous second transfer medium 640 at the first end 611 may be higher than the temperature of the gaseous second transfer medium 640 at the second end 612. Therefore, temperature stratification may form in the gaseous second transfer medium 640 in the second container 610, which may lead to poor gas flow of the gaseous second transfer medium 640 in the second container 610, thereby causing the heat transfer efficiency of the gaseous second transfer medium 640 in the second container 610 to be low. In this case, the second thermal switch 600 may be in a second deactivation mode, in which the heat transfer between the second cold end 620 and the second hot end 630 may be avoided or reduced, thereby avoiding or reducing the heat transfer between the second stage cold head 331-2 and the superconducting magnet 320.

In some embodiments, the second container 610 may be made of a material with a poor heat transfer rate. In some embodiments, the second container 610 may be made of stainless steel. In some embodiments, the second container 610 may also be made of other materials with poor heat transfer rate, such as ceramic, etc.

In some embodiments, the second cold end 620 and/or the second hot end 630 may be made of a high thermally conductive material. In some embodiments, the second cold end 620 and/or the second hot end 630 may be made of copper to ensure the heat transfer effect. In some embodiments, the second cold end 620 and/or the second hot end 630 may also be made of other materials with relatively high heat transfer rate. In some embodiments, the first end 621 and/or the second end 622 of the second cold end 620 may be provided with a thread to facilitate the connection between the second cold end 620 and other components (e.g., the second stage cold head 331-2, the second connection piece 720, the first end 611 of the second container 610, etc.). In some embodiments, the first end 631 and/or the second end 632 of the second hot end 630 may be provided with a thread to facilitate the connection between the second hot end 630 and other components (e.g., the superconducting magnet 320, the inner vessel 313, the second connection piece 720, the second end 612 of the second container 610, etc.).

In some embodiments, the boiling temperature of the transfer medium (e.g., the first transfer medium 540 and/or the second transfer medium 640) may be equal to the refrigeration temperature of the refrigerator 331 (e.g., the first stage cold head 331-1 and/or the second stage cold head 331-2). In this case, when the refrigerator 331 operates and transfers the cold energy to the transfer medium, the gaseous transfer medium may be rapidly liquefied. The liquefied transfer medium with the refrigeration temperature of the refrigerator 331 (e.g., the first stage cold head 331-1 and/or the second stage cold head 331-2) may cool the radiation shield 312 and/or the superconducting magnet 320 to the refrigeration temperature of the refrigerator 331 (e.g., the first stage cold head 331-1 and/or the second stage cold head 331-2). When the liquid transfer medium absorbs the heat of the radiation shield 312 and/or the superconducting magnet 320, the transfer medium may rapidly evaporate to the gaseous state from the liquid state. When the refrigerator 331 does not operate, the temperature of the refrigerator 331 may be higher than the boiling point of the transfer medium. The gaseous transfer medium may not be liquefied.

In some embodiments, the boiling temperature of the transfer medium (e.g., the first transfer medium 540 and/or the second transfer medium 640) may be higher than the refrigeration temperature of the refrigerator 331 (e.g., the first stage cold head 331-1 and/or the second stage cold head 331-2). A difference between the boiling temperature of the transfer medium and the refrigeration temperature of the refrigerator 331 may be less than a temperature threshold, e.g., 10° C., 5° C., 4° C., 3° C., 2° C., 1° C., 0.5° C., 0.1° C., 0.01° C., etc. In this case, when the refrigerator 331 operates and transfers the cold energy to the transfer medium, the gaseous transfer medium may be liquefied. Since the boiling temperature of the transfer medium is higher than the refrigeration temperature of the refrigerator 331, the temperature of the liquefied transfer medium may be equal to the boiling temperature and higher than the refrigeration temperature of the refrigerator 331. However, the transfer medium may not flow downward immediately after being liquefied. When a certain volume of the liquid transfer medium gathers on the surface of the cold end, the liquid transfer medium may flow downward under the action of gravity. After the formation of the liquid transfer medium and before the liquid transfer medium flows downward, the liquid transfer medium may continue to be cooled to the refrigeration temperature of the refrigerator 331. In this way, the temperature of the liquid transfer medium flowing downward may be equal to the refrigeration temperature, and the liquid transfer medium may cool the radiation shield 312 and/or the superconducting magnet 320 to the refrigeration temperature of the refrigerator 331.

If the boiling temperature of the transfer medium (e.g., the first transfer medium 540 and/or the second transfer medium 640) is much higher than the refrigeration temperature of the refrigerator 331 (e.g., the first stage cold head 331-1 and/or the second stage cold head 331-2), e.g., 10° C., 15° C., 20° C., 30° C., etc. higher than the refrigeration temperature of the refrigerator 331, the efficiency of the switch component 410 may be affected. For example, the temperature of the liquid transfer medium flowing downward may be higher than the refrigeration temperature, which may cause the radiation shield 312 and/or the superconducting magnet 320 to receive insufficient cold energy, so that the radiation shield 312 and/or the superconducting magnet 320 cannot be cooled to the refrigeration temperature. As another example, the liquid transfer medium needs to absorb a lot of heat from the radiation shield 312 or the superconducting magnet 320 to vaporize, which is not conducive to gas-liquid circulation, thereby affecting the efficiency of heat transfer. As still another example, for the transfer medium of which the boiling point is much higher than the refrigeration temperature of the refrigerator 331, the transfer medium may further solidify into a solid at the refrigeration temperature, so that solid transfer medium may exist in the container, which may affects the heat transfer efficiency. As further another example, at the beginning when the refrigerator 331 stops working, the temperature of the refrigerator 300 may be still higher than the boiling point of the transfer medium. At this time, the gaseous transfer medium may still liquefy and flow downwards, which cannot break or impede the heat transfer between the refrigerator 331, and the radiation shield 312 or the superconducting magnet 320.

In some embodiments, the boiling temperature of the transfer medium (e.g., the first transfer medium 540 and/or the second transfer medium 640) may be lower than the refrigeration temperature of the refrigerator 331 (e.g., the first stage cold head 331-1 and/or the second stage cold head 331-2). In this case, when the refrigerator 331 operates and transfers the cold energy to the transfer medium, the gaseous transfer medium at the upper end of the container may be cooled but may not be liquefied. The gaseous transfer medium at the lower end of the container may absorb the heat from the radiation shield 312 or the superconducting magnet 320. Therefore, the cold gaseous transfer medium at the upper end of the container may flow downward and the hot gaseous transfer medium at the lower end of the container may flow upward, thereby forming convection in the container. The cold energy of the refrigerator 331 may be transferred to the radiation shield 312 or the superconducting magnet 320 through the convection of the gaseous transfer medium. When the refrigerator 331 does not operate, the temperature of the upper end of the container may be higher than the temperature of the lower end of the container. The temperature of the gaseous transfer medium at the upper end may be higher than the temperature of the gaseous transfer medium at the lower end. Therefore, temperature stratification may form in the gaseous transfer medium in the container, which may lead to poor gas flow of the gaseous transfer medium in the container, thereby causing the heat transfer efficiency of the gaseous transfer medium in the container to be low.

In some embodiments, a power of the first stage cold head 331-1 and the cold energy generated by the first stage cold head 331-1 when the refrigerator 331 operates may be different from the power of the second stage cold head 331-2 and the cold energy generated by the second stage cold head 331-2 when the refrigerator 331 operates. The first stage cold head 331-1 may include a first refrigeration device and a first copper block. The first copper block may be thermally coupled with the first cold end 520. In some embodiments, the refrigeration temperature of the first stage cold head 331-1 may be within a range from 30K to 50K. A refrigeration power of the first stage cold head 331-1 may be about 45 W. The first stage cold head 331-1 may transfer the cold energy generated by the first refrigeration device to the first cold end 520 through the first copper block. The second stage cold head 331-2 may include a second refrigeration device and a second copper block. The second copper block may be thermally coupled with the second cold end 620. In some embodiments, the refrigeration temperature of the second stage cold head 331-2 may be about 4.2 K. A refrigeration power of the second stage cold head 331-2 may be about 1 W. The second stage cold head 331-2 may transfer the cold energy generated by the second refrigeration device to the second cold end 620 through the second copper block.

Since there is a difference between the cold energy generated by the first stage cold head 331-1 and the cold energy generated by the second stage cold head 331-2, the boiling point of the first transfer medium 540 in the first thermal switch 500 corresponding to the first stage cold head 331-1 and the boiling point of the second transfer medium 640 in the second thermal switch 600 corresponding to the second stage cold head 331-2 may be different. In some embodiments, the first transfer medium 540 may have a boiling point lower than 60K, lower than 55K, lower than 50K, with a range from 30 K to 50 K, with a range from 35 K to 50 K, etc. For example, the first transfer medium 540 may include neon or a mixture thereof. In some embodiments, the second transfer medium 640 may have a boiling point lower than 15K, lower than 10K, lower than 5K, with a range from 3 K to 5 K, etc. For example, the second transfer medium 640 may include argon or a mixture thereof.

In some embodiments, a volume of the second thermal switch 600 may be smaller than a volume of the first thermal switch 500, which may reduce an occupancy space while ensuring the cooling effect.

The second thermal switch 412 may be thermally coupled with the inner vessel 313. Alternatively, the second thermal switch 412 may be thermally coupled with the superconducting magnet 320. In some embodiments, the second hot end 630 of the second thermal switch 412 may be directly connected to the inner vessel 313 to reduce the temperature of the inner vessel 313 and cool the first cooling medium in the inner vessel 313, thereby reducing the temperature of the superconducting magnet 320. In some embodiments, the second hot end 630 of the second thermal switch 412 may be directly connected to the superconducting magnet 320, thereby directly reducing the temperature of the superconducting magnet 320. In some embodiments, the superconducting magnet 320 may include a coil body and a coil bracket. The second thermal switch 412 may be connected to the coil body and/or the coil bracket, thereby reducing the temperature of the superconducting magnet 320.

Figure 7:
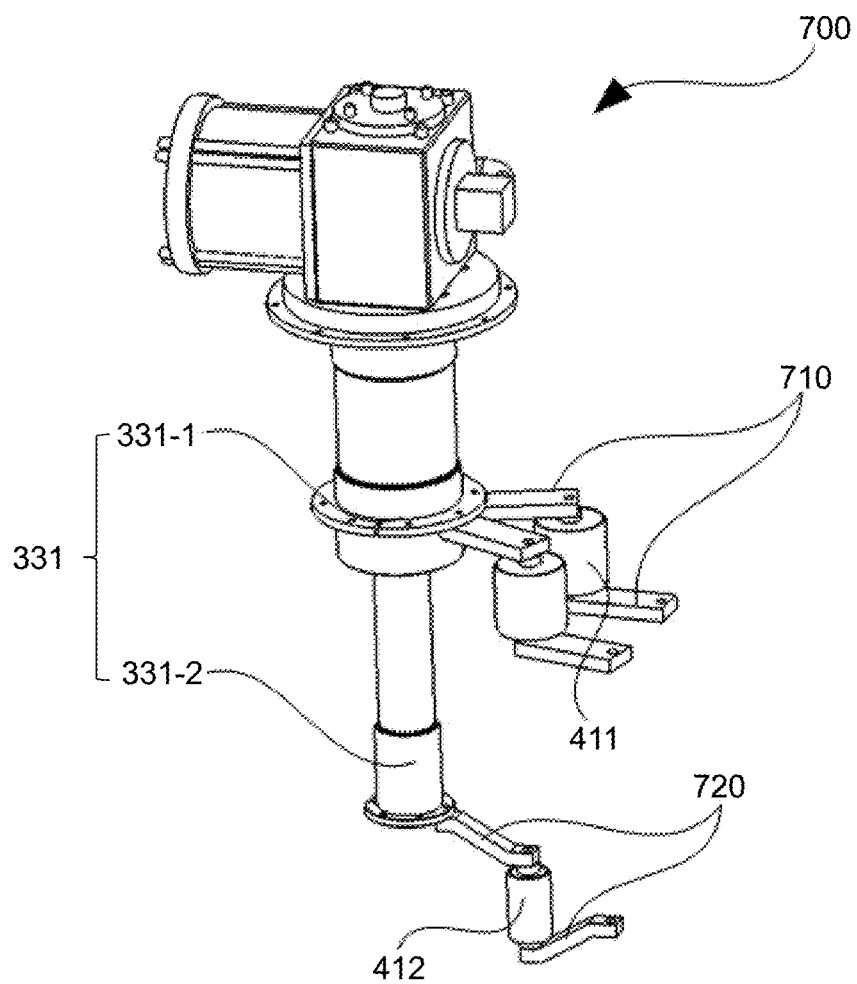
FIG. 7 is a schematic diagram illustrating an exemplary refrigeration component according to some embodiments of the present disclosure.

In some embodiments, the switch component 410 may include one or more switches. When the switch component 410 include more than one switch, the more than one switch may be spaced from each other. In some embodiments, the number (count) of the first thermal switch 411 may be larger than or equal to 1. When the number (count) of the first thermal switch 411 is larger than 1, the more than one first thermal switch 411 may be disposed spaced from each other. The more than one first thermal switch 411 may be thermally coupled with the radiation shield 312, respectively, which may reduce the temperature of the radiation shield 312 to ensure the cooling effect of the radiation shield 312. In some embodiments, the temperature of the radiation shield 312 may be reduced through one first thermal switch 411. Merely by way of example, the number (count) of the first thermal switch 411 may be two (e.g., as shown in FIG. 7). In some embodiments, the number (count) of the first thermal switch 411 may be one, three, or more.

In some embodiments, the number (count) of the second thermal switch 412 may be larger than or equal to 1. When the number (count) of the second thermal switch 412 is larger than 1, the more than one second thermal switch 412 may be disposed spaced from each other. The more than one second thermal switch 412 may be thermally coupled with the superconducting magnet 320, respectively, which may reduce the temperature of the superconducting magnet 320 to ensure the cooling effect of the superconducting magnet 320. In some embodiments, the temperature of the superconducting magnet 320 may be reduced through one second thermal switch 412. Merely by way of example, the number (count) of the second thermal switch 412 may be one (e.g., as shown in FIG. 7). In some embodiments, the number (count) of the second thermal switch 412 may be more than one.

In some embodiments, the first thermal switch 411 may be connected with the first copper block of the first stage cold head 331-1 in the service turret 340. The second thermal switch 412 may be connected with the second copper block of the second stage cold head 331-2 in the service turret 340. In some embodiments, the cryostat 310 may not include the service turret 340. The first thermal switch 411 may be connected with the first stage cold head 331-1 in a space between the outer vessel 311 and the inner vessel 313. The second thermal switch 412 may be connected with the second stage cold head 331-2 in the space between the outer vessel 311 and the inner vessel 313.

FIG. 7 is a schematic diagram illustrating an exemplary refrigeration component 700 according to some embodiments of the present disclosure. The refrigeration component 700 may be applied in the refrigeration component 330 of the superconducting magnet assembly 400.

In some embodiments, the refrigeration component 700 may include the refrigerator 331, the first thermal switch 411, the second thermal switch 412, and a connection component configured to connect the refrigerator 331 and the switch component 410, and/or connect the radiation shield 312 or the superconducting magnet 320 with the switch component 410.

In some embodiments, the connection component may include a first connection piece 710 and a second connection piece 720. The first connection piece 710 may connect the first cold end 520 of the first thermal switch 411 and the first stage cold head 331-1, and connect the radiation shield 312 and the first hot end 530 of the first thermal switch 411. The second connection piece 720 may connect the second cold end 620 of the second thermal switch 412 and the second stage cold head 331-2, and connect the second hot end 630 of the second thermally switch 412 and the superconducting magnet 320.

In some embodiments, each first thermal switch 411 may correspond to two first connection pieces 710. As used herein, one first connection piece 710 may connect the first cold end 520 of the first thermal switch 411 and the first stage cold head 331-1. Another first connection piece 710 may connect the first hot end 530 of the first thermal switch 411 and the radiation shield 312. The cold energy of the first stage cold head 331-1 may be transferred to the first cold end 520 through the first connection piece 710. The first hot end 530 may transfer the cold energy to the radiation shield 312 through the first connection piece 710, thereby transferring the cold energy between the first stage cold head 331-1 and the radiation shield 312. In some embodiments, the first connection piece 710 may be made of a material with high heat transfer rate. For example, the first connection piece 710 may include a copper strip or other thermally conductive member.

Each second thermal switch 412 may correspond to two second connection pieces 720. As used herein, one second connection piece 720 may connect the second cold end 620 of the second thermal switch 412 and the second stage cold head 331-2. Another second connection piece 720 may connect the second hot end 630 of the second thermal switch 412 and the superconducting magnet 320. The cold energy of the second stage cold head 331-2 may be transferred to the second cold end 1232 through the second connection piece 720. The second hot end 630 may transfer the cold energy to the superconducting magnet 320 through the second connection piece 720, thereby transferring the cold energy between the second stage cold head 331-2 and the superconducting magnet 320. In some embodiments, the second connection piece 720 may be made of a material with high heat transfer rate. In some embodiments, the second connection piece 720 may be in contact with the inner vessel 313, or extend into the inner vessel 313. In some embodiments, the second connection piece 720 may extend into the first cooling medium filled in the inner vessel 313. In some embodiments, the second connection piece 125 may be in contact with or extend into a pipeline filled with the first cooling medium. In some embodiments, the second connection piece 720 may include a copper strip or other thermally conductive member.

In some embodiments, the switch component 410 may be a retractable member. According to the operation status of the refrigerator 331, the switch component 410 may extend to be thermally coupled with the refrigerator 331 and/or the radiation shield 312 or the superconducting magnet 320, or retract to break the thermal coupling between the switch component 410 and the refrigerator 331, and/or the thermal coupling between the switch component 410 and the radiation shield 312 or the superconducting magnet 320.

In some embodiments, the first thermal switch 411 may extend to be connected with the first stage cold head 331-1 and/or the radiation shield 312 in the first activation mode, and retracts to be disconnected with the first stage cold head 331-1 and/or the radiation shield 312 in the first deactivation mode. In some embodiments, the second thermal switch 412 may extend to be connected with the second stage cold head 331-2 and/or the superconducting magnet 320 in the second activation mode, and retracts to be disconnected with the second stage cold head 331-2 and/or the superconducting magnet 320 in the second deactivation mode.

In some embodiments, when the refrigerator 331 operates, the first thermal switch 411 may extend to be thermally coupled with the first stage cold head 331-1 and/or the radiation shield 312, and the second thermal switch 412 may extend to be thermally coupled with the second stage cold head 331-2 and/or the superconducting magnet 320. When the refrigerator 331 does not operate, the first thermal switch 411 may retract to break the thermal coupling between the first thermal switch 411 and the first stage cold head 331-1, and/or the thermal coupling between the first thermal switch 411 and the radiation shield 312, and the second thermal switch 412 may retract to break the thermal coupling between the second thermal switch 412 and the second stage cold head 331-2, and/or the thermal coupling between the second thermal switch 412 and the superconducting magnet 320.

In some embodiments, the container of the switch component 410 may be a retractable structure, e.g., a bellows. The bellows may extend or retract through inflation or deflation of the bellows. Alternatively, a guide rod may drive the bellows to extend or retract. The bellows may extend to be in connection with the refrigerator 331 and/or the radiation shield 312 or the superconducting magnet 320. The bellows may retract to be in disconnection with the refrigerator 331 and/or the radiation shield 312 or the superconducting magnet 320.

In some embodiments, the cold end and/or the hot end of the switch component 410 may be a retractable structure, e.g., a bellows, a telescopic rod, a folding rod, etc. The cold end may extend to connect the refrigerator 331, and retract to disconnect the refrigerator 331. The hot end may extend to connect the radiation shield 312 and/or the superconducting magnet 320, and retract to disconnect the radiation shield 312 and/or the superconducting magnet 320.

In some embodiments, the connection component may be moved, based on the operation status of the refrigerator 331, to be connected with the refrigerator 331 and/or the radiation shield 312 or the superconducting magnet 320. When the refrigerator 331 operates, the connection component may be moved to be in connection with the refrigerator 331 and/or the radiation shield 312 or the superconducting magnet 320. When the refrigerator 331 does not operate, the connection component may be moved to be in disconnection with the refrigerator 331 and/or the radiation shield 312 or the superconducting magnet 320.

In some embodiments, the connection component may be a retractable structure (e.g., a bellows, a telescopic rod, a folding rod, etc.). When the refrigerator 331 operates, the connection component may extend to be in connection with the refrigerator 331 and/or the radiation shield 312 or the superconducting magnet 320, thereby facilitating the heat transfer between the refrigerator 331 and the radiation shield 312 or the superconducting magnet 320. When the refrigerator 331 does not operate, the connection component may retract to be in disconnection with the refrigerator 331 and/or the radiation shield 312 or the superconducting magnet 320, thereby breaking or impeding the heat transfer between the refrigerator 331 and the radiation shield 312 or the superconducting magnet 320.

In other embodiments of the present disclosure, the switch component 410 may also include other retractable structures to realize a connection and disconnection.

In some embodiments, the switch component 410 may be a retractable structure (e.g., a bellows, a telescopic rod, a folding rod, etc.) and a good thermal conductor. When the refrigerator 331 operates, the switch component 410 may extend to be in connection with the refrigerator 331 and/or the radiation shield 312 or the superconducting magnet 320, thereby facilitating the heat transfer between the refrigerator 331, and the radiation shield 312 or the superconducting magnet 320. When the refrigerator 331 does not operate, the switch component 410 may retract to be in disconnection with the refrigerator 331 and/or the radiation shield 312 or the superconducting magnet 320, thereby breaking or impeding the heat transfer between the refrigerator 331, and the radiation shield 312 or the superconducting magnet 320.

In some embodiments, the refrigerator 331 (e.g., the first stage cold head 331-1 and/or the second stage cold head 331-2) may be provided with one or more temperature sensors configured to detect the temperature of the refrigerator 331 in real time. The switch component 410 and/or the connection component may be provided with one or more drivers configured to drive the switch component 410 and/or the connection component to move, extend, and/or retract. The one or more temperature sensors may transmit the real-time temperature of the refrigerator 331 to the processing device 120. In response to determining that the temperature of the refrigerator 331 is equal to the refrigeration temperature, which indicates that the refrigerator 331 is operating, the processing device 120 may cause the one or more drivers to control the switch component 410 and/or the connection component to be connected with the refrigerator 331 and/or the radiation shield 312 or the superconducting magnet 320. In response to determining that the temperature of the refrigerator 331 is higher than the refrigeration temperature, which indicates that the refrigerator 331 stops operating, the processing device 120 may cause the one or more drivers to control the switch component 410 and/or the connection component to be disconnected with the refrigerator 331 and/or the radiation shield 312 or the superconducting magnet 320.

In some embodiments, the switch component 410 may adjust, based on the operation status of the refrigerator 331, the heat transfer efficiency between the refrigerator 331, and the radiation shield 312 or the superconducting magnet 320 using the property of the material of the switch component 410. When the temperature of the first end of the switch component 410 is lower than the temperature of the second end of the switch component 410, which indicates that the refrigerator 331 operates, the switch component 410 may be in an activation mode and have good heat transfer rate, thereby facilitating the thermal coupling between the refrigerator 331, and the radiation shield 312 or the superconducting magnet 320. When the temperature of the first end of the switch component 410 is higher than or equal to the temperature of the second end of the switch component 410, which indicates that the refrigerator 331 does not operate, the switch component 410 may be in a deactivation mode and have poor heat transfer rate, thereby breaking or impeding the thermal coupling between the refrigerator 331, and the radiation shield 312 or the superconducting magnet 320.

In some embodiments, a first value of a heat transfer rate of at least a portion of the first thermal switch 411 at a first temperature range including a refrigeration temperature of the first stage cold head 331-1 may be relatively high so that the first thermal switch 411 may be in the first activation mode when the refrigerator 331 is on. In some embodiments, if the refrigeration temperature of the first stage cold head 331-1 is 30-50K, the first temperature range may be 20-60K, 30-50K, 20-50K, 30-60K, lower than 50K, lower than 60K, etc. For example, when the refrigerator 331 is on, the cold energy may be transferred to the first thermal switch 411 from the first stage cold head 331-1 so that the first thermal switch 411 may be in the first temperature range. At this time, the first thermal switch 411 may have a relatively high heat transfer rate so as to facilitate heat transfer between the first stage cold head 331-1 and the radiation shield 312. In this way, cold energy may be transferred from the first stage cold head 331-1 to the radiation shield 312 through the first thermal switch 411 that is in the first activation mode.

In some embodiments, a second value of the heat transfer rate of the at least portion of the first thermal switch 331-1 at a second temperature range higher than the first temperature range may be smaller than the first value so that the first thermal switch 331-1 may be in the first deactivation mode when the refrigerator is off. For example, if the first temperature range is 30-50K, the second temperature range may be higher than 50K. In some embodiments, when the refrigerator 331 is off, the temperature of the first thermal switch 411 may increase so that the temperature of the first thermal switch 411 may be higher than the refrigeration temperature of the first stage cold head 331-1 and in the second temperature range. At this time, the first thermal switch 411 may have a relatively low heat transfer rate so as to break or impede the heat transfer between the first stage cold head 331-1 and the radiation shield 312. In this way, the transfer of the external heat to the radiation shield 312 may be reduced or avoided through the first thermal switch 411 that is in the first deactivation mode.

In some embodiments, a third value of a heat transfer rate of at least a portion of the second thermal switch 412 at a third temperature range including a refrigeration temperature of the second stage cold head 331-2 may be relatively high so that the second thermal switch 412 may be in the second activation mode when the refrigerator 331 is on. In some embodiments, if the refrigeration temperature of the second stage cold head 331-2 is 4.2K, the third temperature range may be 1-7K, 2-6K, 3-5K, lower than 6K, lower than 5K, lower than or equal to 4.2K, etc. For example, when the refrigerator 331 is on, the cold energy may be transferred to the second thermal switch 412 from the second stage cold head 331-2 so that the second thermal switch 412 may be in the third temperature range. At this time, the second thermal switch 412 may have a relatively high heat transfer rate so as to facilitate heat transfer between the second stage cold head 331-2 and the superconducting magnet 320. In this way, cold energy may be transferred from the second stage cold head 331-2 to the superconducting magnet 320 through the second thermal switch 412 that is in the second activation mode.

In some embodiments, a fourth value of the heat transfer rate of the at least portion of the second thermal switch 412 at a fourth temperature range higher than the third temperature range may be smaller than the third value so that the second thermal switch 412 may be in the second deactivation mode when the refrigerator 331 is off. In some embodiments, if the third temperature range is 3-5K, the fourth temperature range may be higher than 3K. For example, when the refrigerator 331 is off, the temperature of the second thermal switch 412 may increase so that the temperature of the second thermal switch 412 may be higher than the refrigeration temperature of the second stage cold head 331-2 and in the fourth temperature range. At this time, the second thermal switch 412 may have a relatively low heat transfer rate so as to break or impede heat transfer between the second stage cold head 331-2 and the superconducting magnet 320. In this way, the transfer of the external heat to the superconducting magnet 320 may be reduced or avoided through the second thermal switch 412 that is in the second deactivation mode.

In some embodiments, the material of the switch component 410 may include lead and/or erbium nickel alloy. In some embodiments, the material of the switch component 410 may include lead, $ErNi_2$ alloy, and $Er_3Ni$ alloy. For example, the first thermal switch 411 may include a first segment thermally coupling with the first stage cold head 331-1, a second segment thermally coupling with the radiation shield 312, and a third segment between the first segment and the second segment. The first segment of the first thermal switch 411 may have a relatively high heat transfer rate in the first temperature range and have a relatively low heat transfer rate in the second temperature range. As another example, the second thermal switch 412 may include a first segment thermally coupling with the second stage cold head 331-2, a second segment thermally coupling with the superconducting magnet 320, and a third segment between the first segment and the second segment. The first segment of the second thermal switch 412 may have a relatively high heat transfer rate in the third temperature range and have a relatively low heat transfer rate in the fourth temperature range. In some embodiments, the material of the first segment(s) of the first thermal switch 411 and/or the second thermal switch 412 may include lead. The material of the second segment(s) of the first thermal switch 411 and/or the second thermal switch 412 may include $Er_3Ni$ alloy. The material of the third segment(s) of the first thermal switch 411 and/or the second thermal switch 412 may include $ErNi_2$ alloy.

In some embodiments, the switch component 410 may also include other materials that make the heat transfer rate of the switch component 410 relatively high when the refrigerator 331 is on so that the switch component 410 is in the activation mode, and make the heat transfer rate of the switch component 410 relatively low when the refrigerator 331 is off so that the switch component 410 is in the deactivation mode.

In the superconducting magnet of the present disclosure, the switch component 410 may adjust, based on an operation status of the refrigerator 331, heat transfer efficiency between the refrigerator 331, and the radiation shield 312 or the superconducting magnet 320. When the refrigerator 331 operates, the switch component 410 may increase the heat transfer efficiency between the refrigerator 331, and the radiation shield 312 or the superconducting magnet 320, thereby facilitating the thermal coupling between the refrigerator 331, and the radiation shield 312 or the superconducting magnet 320, so as to cool the radiation shield 312 and the superconducting magnet 320. When the refrigerator 331 does not operate or needs to be replaced, the switch component 410 may decrease the heat transfer efficiency between the refrigerator 331, and the radiation shield 312 or the superconducting magnet 320, thereby breaking or impeding the thermal coupling between the refrigerator 331, and the radiation shield 312 or the superconducting magnet 320, which may avoid or reduce the transfer of the external heat to the radiation shield 312 and/or the superconducting magnet 320. Further, a rise of the temperature of the superconducting magnet may be avoided or reduced. Therefore, there may be no need to take a long time cooling the radiation shield 312 and the superconducting magnet 320 in the subsequent process. The loss of liquid helium and the quench of superconductivity of the superconducting magnet 320 in the superconducting magnet 320 may be reduced, thereby reducing maintenance costs of the superconducting magnet. The superconducting magnet of the present disclosure may have a simple structure, be easy to be installed, and have high reliability.

The present disclosure also provides an MR device (e.g., the MRI scanner 110). The MR device may include a gradient coil assembly, a radio frequency (RF) coil assembly, and a superconducting magnet assembly (e.g., the superconducting magnet assembly 300 or 400) illustrated in the present disclosure. The superconducting magnet assembly may include a bore. The RF coil assembly may be disposed in the bore. The gradient coil assembly may be located between the RF coil assembly and the superconducting magnet assembly. The superconducting magnet assembly may include a cryostat 310, a superconducting magnet 320, and a refrigeration component 330. The cryostat 310 may include the outer vessel 311, the radiation shield 312, and the inner vessel 313 disposed coaxially along the z-direction. The superconducting magnet 320 may be disposed inside the inner vessel 313. The radiation shield 312 may be located between the outer vessel 311 and the inner vessel 313. The refrigeration component 330 may include the refrigerator 331, a first thermal switch 411, and a second thermal switch 412. The refrigerator 331 may be disposed in the outer vessel 311. The refrigerator 331 may include the first stage cold head 331-1 and the second stage cold head 331-2. The first thermal switch 411 may adjust, based on the operation status of the refrigerator 331, the heat transfer efficiency between the first stage cold head 331-1 and the radiation shield 312. The second thermal switch 412 may adjust, based on the operation status of the refrigerator 331, the heat transfer efficiency between the second stage cold head 331-2 and the superconducting magnet 320.

The MR device including the above superconducting magnet assembly may avoid the quench of superconductivity of the superconducting magnet, which may ensure the performance of the MR device, reduce the maintenance costs of the MR device, while saving a time for cooling the superconducting magnet in the subsequent process.

In some embodiments, the first thermal switch 411 may include the first container 510, the first cold end 520, and the first hot end 530. The first container 510 may be a hollow structure. The first cold end 520 and the first hot end 530 may be disposed on both ends of the first container 510, respectively. The first cold end 520 may be connected to the first stage cold head 331-1. The first hot end 530 may be connected to the radiation shield 312. The inside of the first container 510 may be filled with the first transfer medium 540 that transitions between a gas phase and a liquid phase. The second thermal switch 412 may include the second container 610, the second cold end 620, and the second hot end 630. The second container 610 may be a hollow structure. The second cold end 620 and the second hot end 630 may be disposed on both ends of the second container 610, respectively. The second cold end 620 may be connected to the second stage cold head 331-2. The second hot end 630 may be connected to the superconducting magnet 320. The inside of the second container 610 may be filled with the second transfer medium 640 that transitions between a gas phase and a liquid phase.

The transfer efficiency of the cold energy between the refrigerator 331, and the radiation shield 312 or the superconducting magnet 320 may be adjusted through the first thermal switch 411 and the second thermal switch 412. When the refrigerator 331 operates, the first thermal switch 411 and the second thermal switch 412 may increase the transfer efficiency of the cold energy, which may cool the radiation shield 312 and the superconducting magnet 320. When the refrigerator 331 does not operate or needs to be replaced, the first thermal switch 411 and the second thermal switch 412 may decrease the transfer efficiency of the cold energy, which may avoid or reduce the transfer of the external heat to the radiation shield 312 and/or the superconducting magnet 320. Further, a rise of the temperature of the superconducting magnet may be avoided or reduced. The structures and the working principles of the first thermal switch 411 and the second thermal switch 412 have been mentioned above, which may not be repeated herein.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Traditionally, the refrigerator may be in contact with helium through a cold head and transfer cold energy by liquefaction and reflux of helium. However, such a manner may lead to a helium leakage when replacing the cold head, which may increase cooling costs and not be conducive to the replacement of the cold head.

In response to the above problem, the present disclosure provides a transfer component, a superconducting magnet assembly with the transfer component, and an MR device with the transfer component.

Figure 8:
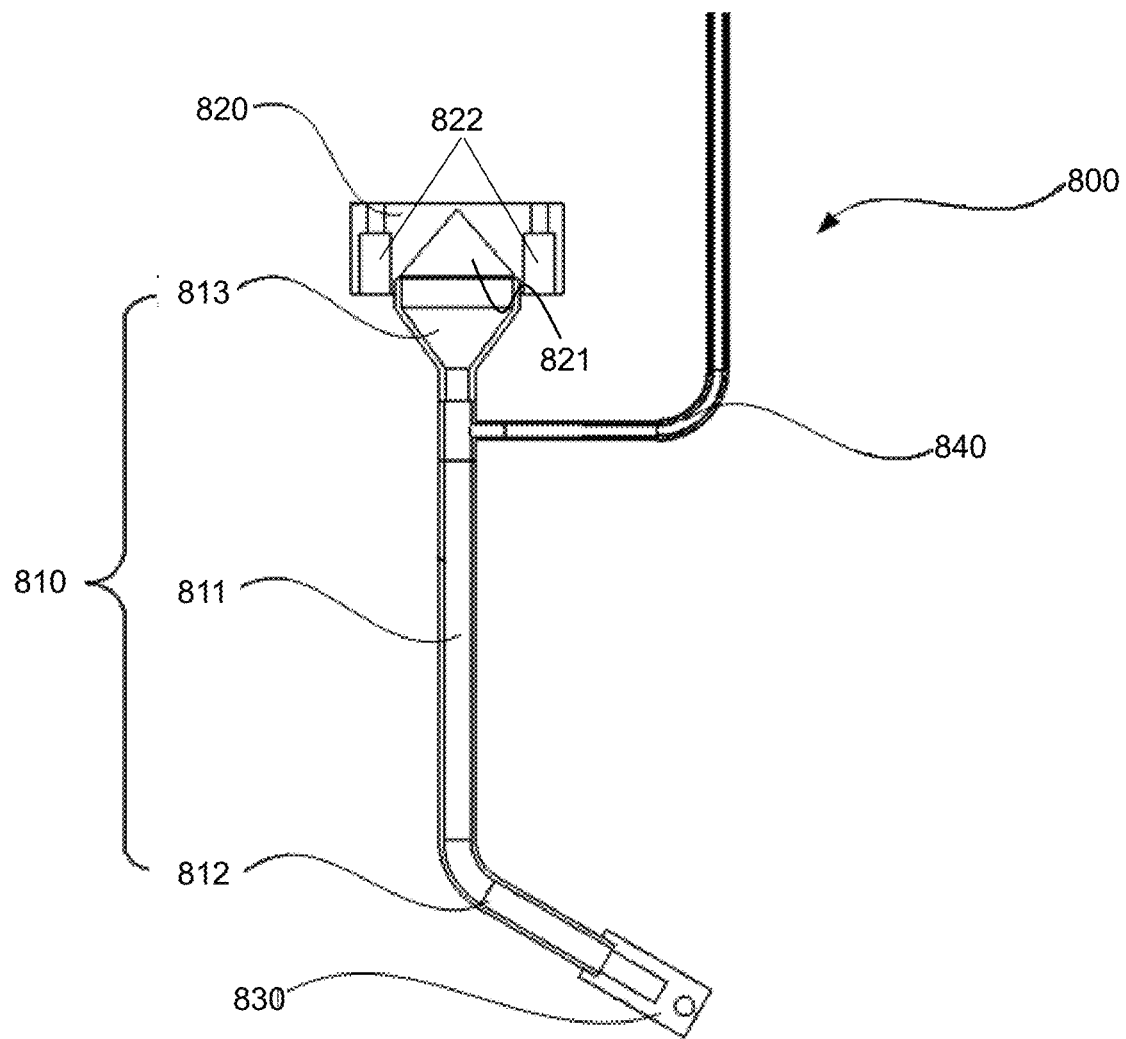
FIG. 8 is a schematic diagram illustrating an exemplary transfer component according to some embodiments of the present disclosure.
Figure 9:
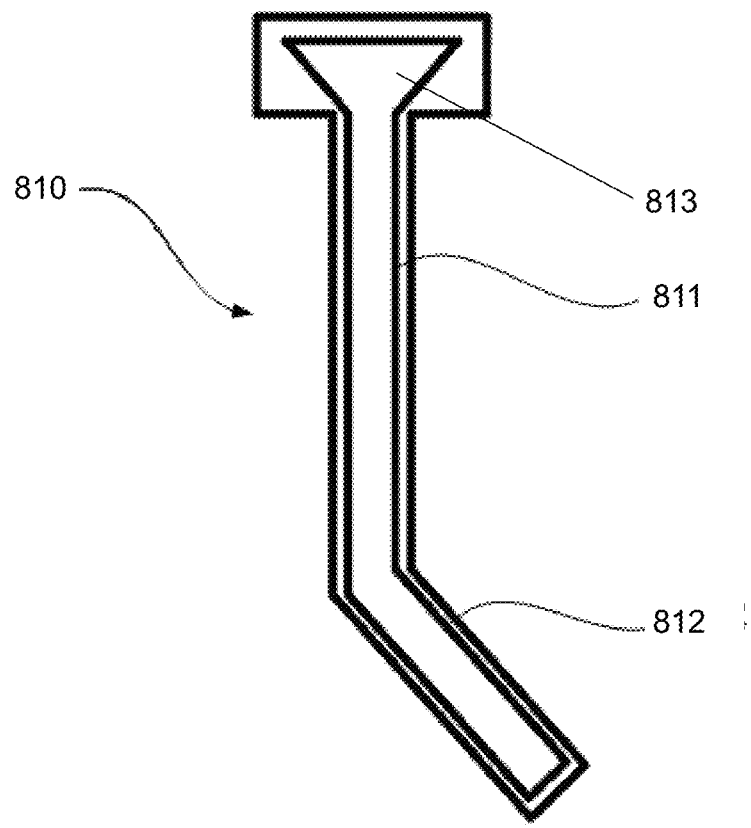
FIG. 9 is a schematic diagram illustrating an exemplary transfer pipeline of the transfer component illustrated in FIG. 8 according to some embodiments of the present disclosure.
Figure 10:
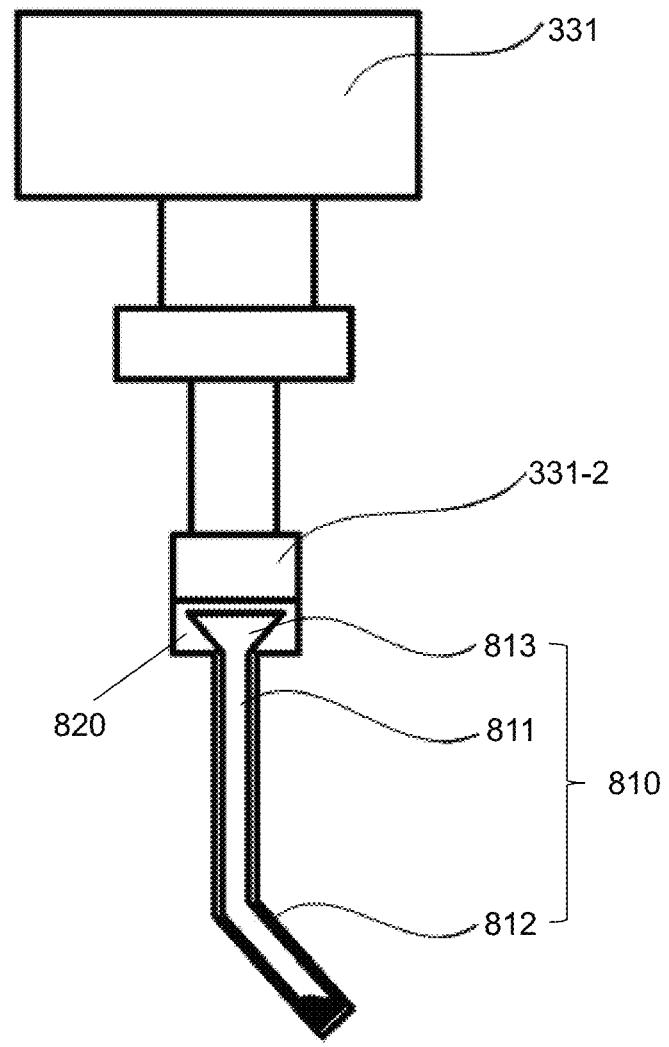
FIG. 10 is a schematic diagram illustrating an exemplary refrigeration component with the transfer component illustrated in FIG. 8 according to some embodiments of the present disclosure.
Figure 11:
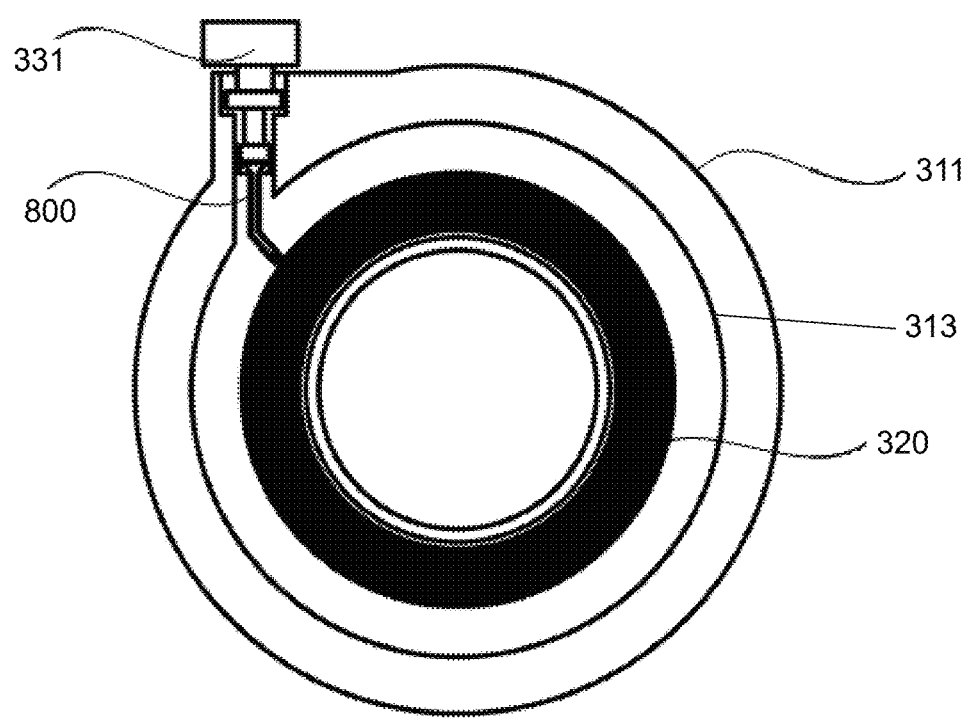
FIG. 11 is a schematic diagram illustrating an exemplary superconducting magnet assembly with the transfer component illustrated in FIG. 8 according to some embodiments of the present disclosure.

FIG. 8 is a schematic diagram illustrating an exemplary transfer component 800 according to some embodiments of the present disclosure. FIG. 9 is a schematic diagram illustrating an exemplary transfer pipeline 810 of the transfer component 800 according to some embodiments of the present disclosure. FIG. 10 is a schematic diagram illustrating an exemplary refrigeration component with the transfer component 800 according to some embodiments of the present disclosure. FIG. 11 is a schematic diagram illustrating an exemplary superconducting magnet assembly with the transfer component 800 according to some embodiments of the present disclosure. In some embodiments, the transfer component 800 may be applied in the superconducting magnet assembly 300 in FIG. 3 and/or the switch component 310 of the superconducting magnet assembly 400 in FIG. 4. The heat transfer between the refrigerator 331, and the radiation shield 312 or the superconducting magnet 320 may be implemented based on the transfer component 800.

For brevity, the transfer component 800 for transferring heat between the second stage cold head 331-2 and the superconducting magnet 320 may be taken as an example. It should be noted that heat transfer between the first stage cold head 331-1 and the radiation shield 312 may be implemented based on another transfer component that may be similar to the transfer component 800.

In some embodiments, the transfer component 800 may be located in the outer vessel 311. One end (e.g., an upper end) of the transfer component 800 may be thermally coupled with the second stage cold head 331-2 of the refrigerator 331. Another end (e.g., a lower end) of the transfer component 800 may be thermally coupled with the superconducting magnet 320, e.g., extend into the inner vessel 313 to cool the superconducting magnet 320 in the inner vessel 313.

Since the transfer component 800 is thermally coupled with the second stage cold head 331-2 of the refrigerator 331, the cold energy from the second stage cold head 331-2 may be transferred to the inner vessel 313 through the transfer component 800 to cool the superconducting magnet 320. When the second stage cold head 331-2 of the refrigerator 331 needs to be replaced, the second stage cold head 331-2 of the refrigerator 331 may be disassembled from the cryostat 310 directly. A leakage of liquid helium in the inner vessel 313 may not be caused, which may be conducive to the replacement of the second stage cold head 331-2 of the refrigerator 331 and avoid situations such as the helium leakage. Therefore, the performance of the cryostat 310 may be ensured. The increase of cost due to leakage may be avoided. In addition, the replacement of the second stage cold head 331-2 of the refrigerator 331 may be conducive to operating.

In some embodiments, the transfer component 800 may include a container, such as a transfer pipeline 810. The transfer pipeline 810 may be a hollow closed structure. The transfer pipeline 810 may include an accommodation chamber (not shown). The accommodation chamber may be configured to accommodate a transfer medium. The transfer pipeline 810 may include a first end and a second end. The first end of the transfer pipeline 810 may be thermally coupled with the second stage cold head 331-2. The second end of the transfer pipeline 810 may be thermally coupled with the superconducting magnet 320. In some embodiments, the location of the first end of the transfer pipeline 810 may be higher than the location of the second end of the transfer pipeline 810. For example, the first end of the transfer pipeline 810 may be the upper end of the transfer pipeline 810, and the second end of the container may be the lower end of the transfer pipeline 810. The first end of the transfer pipeline 810 may be thermally coupled with the second stage cold head 331-2 of the refrigerator 331 of the cryostat 310. The second end of the transfer pipeline 810 may be thermally coupled with the superconducting magnet 320, e.g., extend into the inner vessel 313 for cooling the superconducting magnet 320.

The transfer pipeline 810 may be a hollow closed structure. The transfer pipeline 810 may include an accommodation chamber. The transfer pipeline 810 may accommodate the transfer medium through the accommodation chamber. In some embodiments, the first end and the second end of the transfer pipeline 810 may be sealed, thereby avoiding the leakage of the transfer medium in the transfer pipeline 810. The transfer medium may transition from a liquid state to a gaseous state after absorbing heat. The transfer medium may transition from a gaseous state to a liquid state after absorbing cold energy. When the transfer medium is cooled to the liquid state from the gaseous state, the liquid transfer medium may maintain the superconducting magnet 320 at a superconducting state.

As shown in FIG. 8, the first end (e.g., the upper end) of the transfer pipeline 810 may be thermally coupled with the second stage cold head 331-2 of the refrigerator 331 in the outer vessel 311. The second end (e.g., the lower end) of the transfer pipeline 810 may extend into the inner vessel 313 to cool the superconducting magnet 320. The transfer medium in the transfer pipeline 810 may be under a state of gaseous and liquid coexistence. The gaseous transfer medium may converge at the first end of the transfer pipeline 810. The liquid transfer medium may converge at the second end of the transfer pipeline 810.

Since the first end of the transfer pipeline 810 is thermally coupled with the second stage cold head 331-2 of the refrigerator 331, the cold energy generated by the refrigerator 331 may be transferred to the transfer pipeline 810 through the second stage cold head 331-2 to cool the transfer medium in the transfer pipeline 810. The gaseous transfer medium at the first end of the transfer pipeline 810 may transform to the liquid state after absorbing the cold energy. When the transfer medium transforms to the liquid state, the liquid transfer medium may flow below an inner wall of the transfer pipeline 810, and converge at the second end of the transfer pipeline 810.

The second end of the transfer pipeline 810 may extend into the inner vessel 313, and cool the superconducting magnet 320. When the temperature in the inner vessel 313 is high, the heat may be transferred to the second end of the transfer pipeline 810. The liquid transfer medium below the transfer pipeline 810 may absorb the heat and transform to the gaseous state. When the transfer medium transforms to the gaseous state, the gaseous transfer medium may flow along the inner wall of the transfer pipeline 810 to the first end of the transfer pipeline 810, and converge at the first end of the transfer pipeline 810. The transfer medium may release the cold energy while absorbing the heat. The cold energy may cool the superconducting magnet 320 in the inner vessel 313 to reduce the temperature of the superconducting magnet 320. Therefore, the superconducting magnet 320 may maintain the superconducting state.

In some embodiments, the transfer medium may be a cryogenic medium such as liquid helium or liquid nitrogen. In some embodiments, the transfer medium illustrated in FIG. 8 may be similar to the second transfer medium illustrated in FIGS. 4, 6A, and 6B. In this case, the transfer pipeline 810 may act as a switch component similar to the second thermal switch 412 in FIG. 4. The transfer pipeline 810 may be applied in the first thermal switch 411 and/or the second thermal switch 412 in FIG. 4.

The transfer component 800 of the above embodiments may implement the cooling of the superconducting magnet 320 by the transfer pipeline 810 including the transfer medium. When the refrigerator 331 transfers the cold energy to the transfer pipeline 810 via the second stage cold head 331-2, the transfer medium in the transfer pipeline 810 may be liquefied and flow to the second end of the transfer pipeline 810. The superconducting magnet 320 of the cryostat 310 may be cooled by the transfer medium through the second end of the transfer pipeline 810. Accordingly, when the second stage cold head 331-2 of the refrigerator 331 is replaced, the second stage cold head 331-2 of the refrigerator 331 may be directly removed from the transfer pipeline 810 of the refrigerator 331, which may be effective to solve the problem of the inconvenience of replacing the cold head. Therefore, the situation such as the helium leakage may be avoided, which may ensure the performance of the cryostat 310. The increase of cost due to leakage may be avoided. In addition, the replacement of the second stage cold head 331-2 of the refrigerator 331 may be conducive to operating.

In some embodiments, the transfer pipeline 810 may include a first transfer pipeline 811 and a second transfer pipeline 812. A first end of the first transfer pipeline 811 may be connected with a first end of the second transfer pipeline 812 so that the first transfer pipeline 811 and the second transfer pipeline 812 may be in fluid communication. The second transfer pipeline 812 may be at an angle with the first transfer pipeline 811. A second end of the first transfer pipeline 811 may be thermally coupled with the refrigerator 331 (e.g., the second stage cold head 331-2). A second end of the second transfer pipeline 812 may be thermally coupled with the superconducting magnet 320, e.g., extend into the inner vessel 313.

In some embodiments, a hollow portion of the first transfer pipeline 811 may be connected to a hollow portion of the second transfer pipeline 812 to form the accommodation chamber of the transfer pipeline 810. In some embodiments, the first transfer pipeline 811 may be located above the second transfer pipeline 812 and thermally coupled with the second stage cold head 331-2. The second transfer pipeline 812 may be located below the first transfer pipeline 811 and extend into the inner vessel 313. In some embodiments, the first transfer pipeline 811 may be disposed in a vertical direction (e.g., along the y-direction). The second transfer pipeline 812 may be disposed at an angle with the first transfer pipeline 811. Therefore, the second transfer pipeline 812 may extend into the inner vessel 313 to cool the superconducting magnet 320 in the inner vessel 313.

It may be understood that cross-sectional shapes of the first transfer pipeline 811 and the second conduit 112 may not be limited as long as there is a hollow accommodation chamber to accommodate the transfer medium. In some embodiments, the first transfer pipeline 811 and the second conduit 112 may be circular pipes. In some embodiments, the first transfer pipeline 811 and the second conduit 112 may also be square pipes, elliptical pipes, or pipes with other shapes.

In some embodiments, the transfer pipeline 810 may include a hollow straight pipeline. A first end (e.g., an upper end) of the straight pipeline may be thermally coupled with the second stage cold head 331-2. A second end (e.g., a lower end) of the straight pipeline may be thermally coupled with the superconducting magnet 320. The straight pipeline may be disposed along the y-direction or at an angle with the y-direction, so that the first end of the straight pipeline may be located higher than the second end of the straight pipeline.

In some embodiments, the transfer pipeline 810 may also include an end cover 813. The end cover 813 may be connected with the second end of the first transfer pipeline 811. A diameter of a first end of the end cover 813 connected to the first transfer pipeline 811 may be smaller than a diameter of a second end of the end cover 813 away from the first transfer pipeline 811. The end cover 813 may be configured to implement the seal of the second end of the first transfer pipeline 811, thereby avoiding the leakage of the transfer medium in the transfer pipeline 810. Therefore, the cooling of the superconducting magnet 320 may not be affected due to the leakage of the transfer medium. The end cover 813 may also increase an area of the first end of the transfer pipeline 810, thereby increasing a heat transfer area between the transfer pipeline 810 and the second stage cold head 331-2 of the refrigerator 331. Therefore, the transfer of the cold energy may be improved to implement the rapid cooling of the transfer medium.

In some embodiments, a diameter of the first end of the end cover 813 may be consistent with the diameter of the first transfer pipeline 811. Therefore, the end cover 813 may be reliably coupled to the first transfer pipeline 811. In some embodiments, the diameter of the end cover 813 may be increased from the first end of the end cover 813 to the second end of the end cover 813. In some embodiments, the end cover 813 may include a variable section structure.

In some embodiments, the second end of the first transfer pipeline 811 may be sealed. The second end of the second transfer pipeline 812 may be sealed.

In some embodiments, the end cover 813, the first transfer pipeline 811, and the second transfer pipeline 812 may form an integral structure, which may reduce the number (count) of components, thereby reducing the assembly process for easy use. In some embodiments, the end cover 813, the first transfer pipeline 811, and the second transfer pipeline 812 may be individual members, and in connection by welding such as brazing, etc. In some embodiments, a supplement hole may be disposed on the first transfer pipeline 811. The transfer medium may be added to the transfer pipeline 810 through the supplement hole.

In some embodiments, outer walls of the end cover 813, the first transfer pipeline 811, and the second transfer pipeline 812 may be made of a material with poor heat transfer rate. That is, the outer walls of the end cover 813, the first transfer pipeline 811, and the second transfer pipeline 812 may be poor conductors of heat. Therefore, the transfer of the cold energy of the transfer medium through the outer walls may be reduced, thereby reducing the loss of the cold energy. The cold energy may be transferred to the inner vessel 313 to cool the superconducting magnet 320. In some embodiments, the outer walls of the end cover 813, the first transfer pipeline 811, and the second transfer pipeline 812 may be made of stainless steel.

In some embodiments, a surface of the end cover 813 thermally coupled with the second stage cold head 331-2 of the refrigerator 331 may be made of a material with a high heat transfer rate. That is, the second end of the end cover 813 may a good conductor of heat, which may allow the cold energy to transfer through the second end of the end cover 813 to the transfer medium in the transfer pipeline 810. Transfer efficiency of the cold energy may be improved. The transfer medium may be easily cooled. In some embodiments, the second end of the second transfer pipeline 812 may be made of a material with a high heat transfer rate. Therefore, the cold energy may be easy to transfer to the inner vessel 313 through the second end of the second transfer pipeline 812, thereby cooling the superconducting magnet 320 in the inner vessel 313.

In some embodiments, the transfer component 800 may further include a connection block 830. The connection block 830 may be connected with the second end of the transfer pipeline 810. The transfer pipeline 810 may be thermally coupled with the superconducting magnet 320 through the connection block 830.

In some embodiments, the connection block 830 may be connected with the second end of the second transfer pipeline 812. The connection block 830 may be configured to cool the superconducting magnet 320. In some embodiments, the second end of the second transfer pipeline 812 may be a closed end or an open end. When the second end of the second transfer pipeline 812 is an open end, the connection block 830 may be connected with the second end of the second transfer pipeline 812 to seal the second end of the second transfer pipeline 812, thereby avoiding the leakage of the transfer medium in the transfer pipeline 810.

In some embodiments, the connection block 830 may be connected to the second transfer pipeline 812 by brazing, etc. In some embodiments, the connection block 830 may be made of a material with a high heat transfer rate. That is, the connection block 830 may be a good conductor of heat. Therefore, the cold energy of the transfer medium may be transferred to the inner vessel 313 through the connection block 830 to cool the superconducting magnet 320, which may improve the transfer efficiency of the cold energy, and be easy to cool the superconducting magnet 320. In some embodiments, the connection block 830 may be made of copper. In some embodiments, the connection block 830 may be made of oxygen-free copper.

In some embodiments, the connection block 830 may include a concave connection hole. The connection hole may be a blind hole. The connection hole may be configured to mount the second transfer pipeline 812. In some embodiments, an outer diameter of the connection hole may be the same as an outer diameter of the second transfer pipeline 812, which may ensure that the connection block 830 may be reliably connected to the second transfer pipeline 812. Therefore, a gap at the connection between the connection block 830 and the second transfer pipeline 812 may be reduced to avoid the leakage of the transfer medium.

In some embodiments, the transfer component 800 may further include a supporting component 820. The supporting component 820 may include one or more fixing holes configured to fix the transfer pipeline 810 and the refrigerator 331 (e.g., the first stage cold head 331-1) on the support component 820. The supporting component 820 may be connected to the first end of the transfer pipeline 810. The supporting component 820 may implement that the transfer pipeline 810 may be reliably connected with the second stage cold head 331-2 of the refrigerator 331 to avoid the first end of the transfer pipeline 810 from being detached from the second stage cold head 331-2 to ensure the cooling effect.

As shown in FIG. 8, a lower surface of the supporting component 820 may be provided with a first fixing hole 821. An upper surface of the supporting component 820 may be connected with the second stage cold head 331-2. The end cover 813 of the transfer pipeline 810 may be mounted in the first fixing hole 821 of the supporting component 820. One or more second fixing holes 822 may be disposed through the supporting component 820, which may facilitate the connection of a connector (e.g., a thread component) and the second stage cold head 331-2, and the assembly of the supporting component 820 and the second stage cold head 331-2.

In some embodiments, an area of a surface of the support component 820 facing the refrigerator 331 may be larger than an area of a cross section of the transfer pipeline 810. In some embodiments, the area of the surface of the supporting component 820 facing the second stage cold head 331-2 may be 1.5-5 times the area of the cross section of the transfer pipeline 810. The supporting component 820 may increase an area of a surface of the transfer component 800 facing the second stage cold head 331-2, which may facilitate the transfer of the cold energy of the second stage cold head 331-2. The transfer efficiency of the cold energy may be improved, which may implement the rapid cooling of the transfer medium.

In some embodiments, the supporting component 820 may be fixed to the transfer pipeline 810 by welding such as brazing, which may ensure that the transfer pipeline 810 may be reliably connected to the supporting component 820. In some embodiments, the supporting component 820 may be made of a material with a high heat transfer rate. That is, the supporting component 820 may be a good conductor of heat, which may allow the cold energy to be transferred to the transfer medium in the transfer pipeline 810 by the supporting component 820. The transfer efficiency of the cold energy may be improved. The transfer medium may be easily cooled. In some embodiments, the supporting component 820 may be made of copper. In some embodiments, the supporting component 820 may be made of oxygen-free copper.

In some embodiments, the transfer component 800 may further include a supplement pipeline 840. A first end of the supplement pipeline 840 may be in fluid communication with the transfer pipeline 810. A second end of the supplement pipeline 840 may extend outside the outer vessel 311 and be connected with an external cold source of the transfer medium. The supplement pipeline 840 may be configured to allow addition of the transfer medium to the transfer pipeline 810. Therefore, the transfer medium may be added in time. The cooling effect of the transfer medium may be ensured. The transfer medium in the external cold source may be added into the transfer pipeline 810 through the supplement pipeline 840.

In some embodiments, the connection block 830, the supporting component 820, and the supplement pipeline 840 may be fixed to the transfer pipeline 810 by welding, which may ensure that the connection block 830, the supporting component 820, the supplement pipeline 840, and the transfer pipeline 810 may be reliably connected. In some embodiments, the supplement pipeline 840 may be made of a material with poor heat transfer rate. That is, the supplement pipeline 840 may be a poor conductor of heat. Therefore, the transfer of the cold energy of the transfer medium to the supplement pipeline 840 may be reduced, thereby reducing the loss of the cold energy. Therefore, the cold energy may be transferred to the inner vessel 313 to cool the superconducting magnet 320. In some embodiments, the supplement pipeline 840 may be made of stainless steel.

In some embodiments, the transfer component 800 may further include a supplement valve disposed on the supplement pipeline 840. The supplement valve may control the fluid communication between the supplement pipeline 840 and the external cold source. When the supplement valve controls the supplement pipeline 840 to be in fluid communication with the external cold source, the transfer medium may be added into the transfer pipeline 810 through the supplement pipeline 840. When the supplement valve controls the supplement pipeline 840 to not be in fluid communication with the external cold source, the transfer medium may not be added into the transfer pipeline 810 through the supplement pipeline 840. In some embodiments, the supplement valve may be located on the supplement pipeline 840 outside the outer vessel 311, which make the supplement valve easy to be operated.

The working principle of the transfer component 800 of the present disclosure may be described as follows.

The transfer medium may be added to the transfer pipeline 810 through the supplement pipeline 840. After the refrigerator 331 operates, the cold energy of the refrigerator 331 may be transferred to the supporting component 820 through the second stage cold head 331-2. The supporting component 820 may transfer the cold energy to the end cover 813 of the transfer pipeline 810. Therefore, the end cover 813 may transfer the cold energy to the transfer medium in the transfer pipeline 810. The transfer medium may transform from the gaseous state to the liquid state after pre-cooling the inner wall of the end cover 813. The liquid refrigeration medium may flow along the first transfer pipeline 811 and the second transfer pipeline 812 of the transfer pipeline 810 to the connection block 830. The superconducting magnet 320 in the inner vessel 313 may be cooled through the connection block 830.

After the liquid transfer medium in the connection block 830 absorbs the heat, the transfer medium may transform from the liquid state to the gaseous state, and rise to the end cover 813 of the transfer pipeline 810. Then, the transfer medium may be cooled by the second stage cold head 331-2 of the refrigerator 331. With the cycle repeats, the transfer medium may cool the superconducting magnet 320.

In some embodiments, when a first cooling medium is filled in the inner vessel 313 to cool the superconducting magnet 320, the transfer component 800 may extend in the inner vessel 313 to cool the first cooling medium. The first cooling medium may cool the superconducting magnet 320. When the superconducting magnet 320 is cooled in the inner vessel 313 without the first cooling medium, the transfer component 800 may extend into the inner vessel 313 to directly cool the superconducting magnet 320. In some embodiments, the first cooling medium may include liquid helium, liquid nitrogen, or the like. In some embodiments, the transfer medium may be the same as or different from the first cooling medium.

The transfer component 800 of the present disclosure may transfer the cold energy accurately and efficiently to ensure the cooling effect of the superconducting magnet 320. Therefore, when the second stage cold head 331-2 of the refrigerator 331 is replaced, the second stage cold head 331-2 of the refrigerator 331 may be directly removed from the transfer pipeline 810 to avoid the leakage of helium, which may ensure the performance of the cryostat 310. The increase of cost due to leakage may be avoided. In addition, the replacement of the second stage cold head 331-2 of the refrigerator 331 may be conducive to operating.

Referring to FIG. 3, the present disclosure also provides a transfer component 800. The transfer component 800 may be applied to a cryostat 310. The transfer component 800 may include the transfer pipeline 810 and the supplement pipeline 840. The transfer pipeline 810 may include an accommodation chamber. The supplement pipeline 840 may be in fluid communication with the accommodation chamber. The first end of the transfer pipeline 810 may be thermally coupled with the second stage cold head 331-2 of the refrigerator 331 of the cryostat 310. The second end of the transfer pipeline 810 may extend into the inner vessel 313. The first end of the supplement pipeline 840 may be connected to the transfer pipeline 810. The second end of the supplement pipeline 840 may extend outside the cryostat 310.

The transfer pipeline 810 may be a hollow structure. The transfer pipeline 810 may include the accommodation chamber. The transfer pipeline 810 may accommodate the transfer medium through the accommodation chamber. The first end (e.g., the upper end) of the transfer pipeline 810 may be thermally coupled with the second stage cold head 331-2 of the refrigerator 331 in the outer vessel 300. The second end (e.g., the lower end) of the transfer pipeline 810 may extend into the inner vessel 313 to cool the superconducting magnet 320. It should be noted that the heat transfer connection herein realizes the transfer of the cold energy. The heat transfer connection may relate to a direct connection, an indirect connection, or a radiation transfer, etc., as long as the cold energy transfer may be achieved. The cold energy transfer between the transfer pipeline 810 and the second stage cold head 331-2 may be established through the heat transfer connection. Therefore, the second stage cold head 331-2 may cool the transfer medium in the transfer pipeline 810. The transfer medium in the transfer pipeline 810 may be under a state of gaseous and liquid coexistence. The gaseous transfer medium may converge at the upper end of the transfer pipeline 810. The liquid transfer medium may converge at the lower end of the transfer pipeline 810.

Since the upper end of the transfer pipeline 810 is thermally coupled with the second stage cold head 331-2 of the refrigerator 331, the cold energy generated by the refrigerator 331 may be transferred to the transfer pipeline 810 through the second stage cold head 331-2 to cool the transfer medium in the transfer pipeline 810. The gaseous transfer medium at the upper end of the transfer pipeline 810 may transform to the liquid state after absorbing the cold energy. When the transfer medium transforms to the liquid state, the liquid transfer medium may flow below an inner wall of the transfer pipeline 810, and converge in the lower end of the transfer pipeline 810.

The lower end of the transfer pipeline 810 may extend into the inner vessel 313, and cool the superconducting magnet 320. When the temperature in the inner vessel 313 is high, the heat may be transferred to the lower end of the transfer pipeline 810. The liquid transfer medium at the lower end of the transfer pipeline 810 may absorb the heat and transform to the gaseous state. When the transfer medium transforms to the gaseous state, the gaseous transfer medium may flow along the inner wall of the transfer pipeline 810 to the upper end of the transfer pipeline 810, and converge at the upper end of the transfer pipeline 810. The transfer medium may release the cold energy while absorbing the heat. The cold energy may cool the superconducting magnet 320 in the inner vessel 313 to reduce the temperature of the superconducting magnet 320. Therefore, the superconducting magnet 320 may maintain the superconducting state.

The transfer component 800 of the above embodiments may implement the cooling of the superconducting magnet 320 by the transfer pipeline 810 including the transfer medium. When the refrigerator 331 transmits the cold energy to the transfer pipeline 810 via the second stage cold head 331-2, the transfer medium in the transfer pipeline 810 may be liquefied and flow to the lower end of the transfer pipeline 810. The superconducting magnet 320 of the cryostat 310 may be cooled by the transfer medium through the lower end of the transfer pipeline 810. Accordingly, when the second stage cold head 331-2 of the refrigerator 331 is replaced, the second stage cold head 331-2 of the refrigerator 331 may be directly removed from the transfer pipeline 810 of the refrigerator 331, which may be effective to solve the problem of the inconvenience caused by replacing the cold head. Therefore, the situation such as the helium leakage may be avoided, which may ensure the performance of the cryostat 310. The increase of cost due to leakage may be avoided. In addition, the replacement of the second stage cold head 331-2 of the refrigerator 331 may be conducive to operating.

The supplement pipeline 840 may be configured to allow addition of the transfer medium to the transfer pipeline 810. Therefore, the transfer medium may be added in time. The cooling effect of the transfer medium may be ensured. The first end of the supplement pipeline 840 may be connected to the first transfer pipeline 811. The second end of the supplement pipeline 840 may extend outside the outer vessel 311 and be connected to the external cold source. Therefore, the transfer medium in the external cold source may be added into the transfer pipeline 810 through the supplement pipeline 840.

The transfer component 800 of the present disclosure may implement the cold energy transfer of the refrigerator 331 through the transfer pipeline 810 to cool the superconducting magnet 320. The transfer medium in the transfer pipeline 810 may be supplied through the supplement pipeline 840. Therefore, the transfer pipeline 810 may steadily cool the superconducting magnet 320.

In some embodiments, a diameter of the supplement pipeline 840 may be less than or equal to the diameter of the transfer pipeline 810. For example, as shown in FIG. 8, the diameter of the supplement pipeline 840 may be less than the diameter of the transfer pipeline 810, which may reduce the leakage of the cold energy while reducing costs. In some embodiments, the diameter of the supplement pipeline 840 may also be equal to the diameter of the transfer pipeline 810.

In some embodiments, a connection between the supplement pipeline 840 and the transfer pipeline 810 may be closer to the first end of the transfer pipeline 810 than to the second end of the transfer pipeline 810. In some embodiments, a connection of the supplement pipeline 840 and the transfer pipeline 810 may be adjacent to the upper end of the transfer pipeline 810. The supplement pipeline 840 may be disposed adjacent to the second stage cold head 331-2 of the refrigerator 331. Therefore, when the transfer pipeline 810 is located in the outer vessel 311, a mounting depth of the supplement pipeline 840 may be reduced, facilitating to mount the supplement pipeline 840 in the outer vessel 311. Since after being added into the transfer pipeline 810 through the supplement pipeline 840, the gaseous transfer medium may move upward in the transfer pipeline 810, a location of the supplement pipeline 840 closer to the upper end of the transfer pipeline 810 may reduce a moving distance of the transfer medium and improve the cooling efficiency.

The transfer component 800 may be applied in a cryostat 310. The first end of the transfer component 800 may be thermally coupled with the second stage cold head 331-2 of the refrigerator 331. The second end of the transfer component 800 may extend into the inner vessel 313 for cooling the superconducting magnet 320.

The cryostat 310 of the present disclosure may use the transfer component 800 of the above embodiment, which may transfer the cold energy accurately and efficiently to ensure the cooling effect of the superconducting magnet 320. Therefore, when the second stage cold head 331-2 of the refrigerator 331 is replaced, the second stage cold head 331-2 of the refrigerator 331 may be directly removed from the transfer pipeline 810 to avoid situations such as the helium leakage, which may ensure the performance of the cryostat 310. The increase of cost due to leakage may be avoided. In addition, the replacement of the second stage cold head 331-2 of the refrigerator 331 may be conducive to operating.

The present disclosure also provides a magnetic resonance (MR) device. The MR device may include the superconducting magnet 320 and the cryostat 310 in the above embodiment. The superconducting magnet 320 may be mounted in the inner vessel 313 of the cryostat 310. The transfer component 800 in the cryostat 310 may cool the superconducting magnet 320.

After the MR device adopts the cryostat 310 including the transfer component 800, the cold energy may be transferred accurately and efficiently to ensure the cooling effect of the superconducting magnet 320. Therefore, when the second stage cold head 331-2 of the refrigerator 331 is replaced, the second stage cold head 331-2 of the refrigerator 331 may be directly removed from the transfer pipeline 810 to avoid situations such as the helium leakage, which may ensure the performance of the cryostat 310. The increase of cost due to leakage may be avoided. In addition, the replacement of the second stage cold head 331-2 of the refrigerator 331 may be conducive to operating.

In some embodiments, the transfer pipeline 810 of the transfer component 800 may be thermally coupled with the superconducting magnet 320. The inner vessel 313 may not be filled with the first cooling medium, and the superconducting magnet 320 may be cooled directly by the transfer component 800. For instance, when the superconducting magnet 320 is placed in the inner vessel 313 without liquid helium, the transfer component 800 may extend into the inner vessel 313 to directly cool the superconducting magnet 320.

In some embodiments, the transfer pipeline 810 of the transfer component 800 may extend into the inner vessel 313, and be thermally coupled with the first cooling medium in the inner vessel 313. When the first cooling medium is filled in the inner vessel 313 to cool the superconducting magnet 320, the transfer pipeline 810 of the transfer component 800 may extend into the inner vessel 313 to cool the first cooling medium. The superconducting magnet 320 may be cooled through the first cooling medium. When the first cooling medium in the inner vessel 313 is with a small amount, the transfer pipeline 810 may still be effective to cool the superconducting magnet 320 to maintain the superconducting magnet 320 in the superconducting state.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

To cool the radiation shield 312 to a steady-state temperature (e.g., 30K-50K) of the radiation shield 312, a series of precooling processes are usually required. Generally, liquid nitrogen is poured into the inner vessel 313 to cool the superconducting magnet 320 and the inner vessel 313, and the radiation shield 312 is cooled by heat transferred from the inner vessel 313. However, on the one hand, the radiation shield 312 is generally made of metal materials, which is a heat sink with a relatively large heat capacity. The above process often takes a long time, such as 3-7 days. Moreover, in this process, a temperature of the radiation shield 312 cannot be cooled directly to 50 K, but generally above 100 K. After the above process, the liquid nitrogen needs to be drained, and then liquid helium is added and the refrigerator 331 is turned on to further precool the radiation shield 312. On the other hand, during transport, the refrigerator 331 cannot operate. The temperature of the radiation shield 312 may rise quickly. Heat transferred from the radiation shield 312 to the inner vessel 313 may greatly increase, which may lead to a large amount of volatilization of the first cooling medium in the inner vessel 313, thereby limiting the transportation time and transportation distance.

In order to solve the above problems (a long cooling time of the radiation shield, a limited transportation time and transportation distance), the present disclosure provides a heat exchange component, a superconducting magnet assembly with the heat exchange component, and an MRI device with the heat exchange component.

Figure 12:
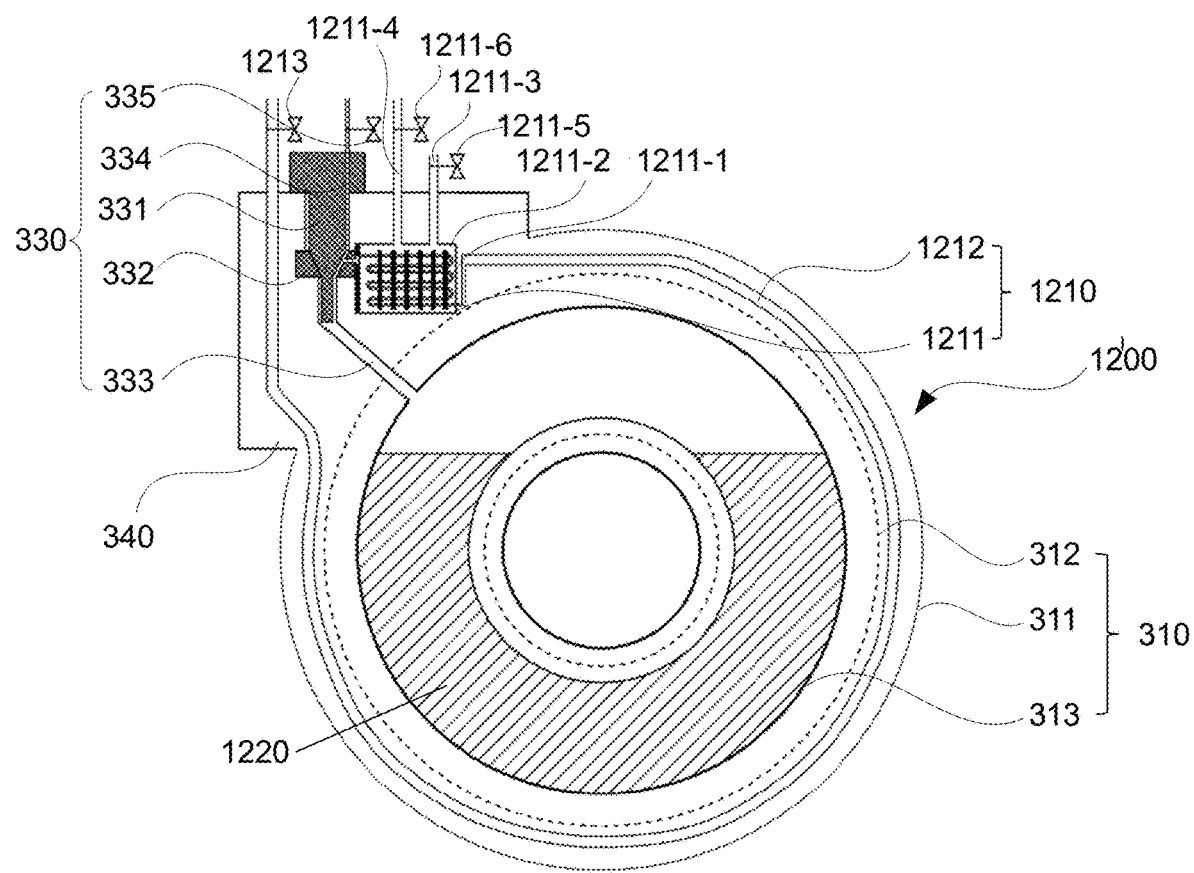
FIG. 12 is a schematic diagram illustrating an exemplary superconducting magnet assembly according to some embodiments of the present disclosure.
Figure 13:
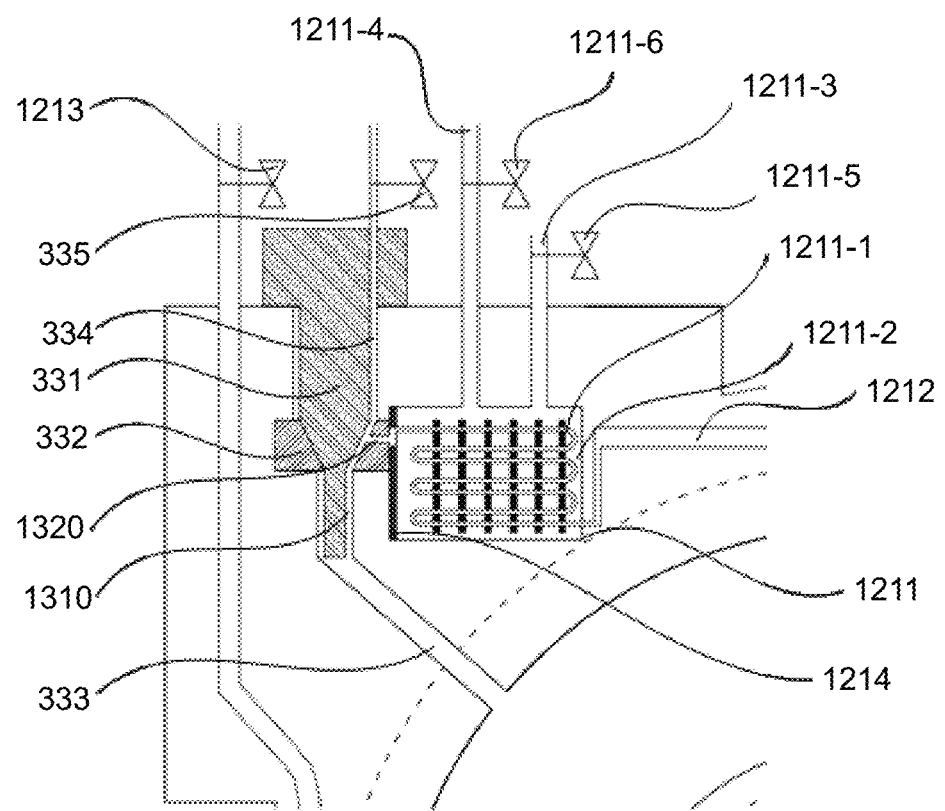
FIG. 13 is a partial enlarged schematic diagram of the exemplary superconducting magnet assembly illustrated in FIG. 12 according to some embodiments of the present disclosure.

FIG. 12 is a schematic diagram illustrating an exemplary superconducting magnet assembly 1200 according to some embodiments of the present disclosure. FIG. 13 is a partial enlarged schematic diagram of the exemplary superconducting magnet assembly 1200 according to some embodiments of the present disclosure. In some embodiments, the superconducting magnet assembly 1200 may be applied in the main magnet 220 of the MRI scanner 200. In some embodiments, the switch component 410 illustrated in FIGS. 4 to 7 and/or the transfer component 800 illustrated in FIGS. 8 through 11 may be applied in the superconducting magnet assembly 1200.

In some embodiments, compared with the superconducting magnet assembly 300, the superconducting magnet assembly 1200 may further include a heat exchange component 1210. The heat exchange component 1210 may be disposed in the outer vessel 311 and/or the service turret 340. In some embodiments, the heat exchange component 1210 may be located at a space between the inner vessel 313 and the outer vessel 311. The heat exchange component 1210 may be configured to exchange heat with the first cooling medium 1220 in the inner vessel 313 to cool the radiation shield 312.

In some embodiments, the heat exchange component 1210, the inner vessel 313, and the refrigeration component 330 may be in fluid communication. The gaseous first cooling medium 1220 in the inner vessel 313 may enter the heat exchange component 1210 through the refrigeration component 330, and exchange heat with the heat exchange component 1210. After heat exchange between the first cooling medium 1220 and the heat exchange component 1210, the first cooling medium 1220 or the heat exchange component 1210 may cool the radiation shield 312 to reduce the temperature of the radiation shield 312. In some embodiments, the heat exchange component 1210 may be thermally coupled with the refrigeration component 330 and absorb the cold energy produced by the refrigeration component 330.

In some embodiments, the heat exchange component 1210 may include a heat exchanger 1211. The heat exchanger 1211 may be located in the outer vessel 311 and/or the service turret 340. In some embodiments, the heat exchanger 1211 may be located in the service turret 340. The heat exchanger 1211 may be in fluid communication with the inner vessel 313 to enable the first cooling medium 1220 in the inner vessel 313 to flow into the heat exchanger 1211, and exchange heat with the heat exchanger 1211. If the temperature of the first cooling medium 1220 is higher than the heat exchanger 1211, the heat exchanger 1211 may reduce the temperature of the first cooling medium 1220, and the cooled first cooling medium 1220 may be used to cool the radiation shield 312. If the temperature of the first cooling medium 1220 is lower than the heat exchanger 1211, the heat exchanger 1211 may absorb the cold energy of the first cooling medium 1220, and cool the radiation shield 312. In some embodiments, the heat exchanger 1211 may cool the radiation shield 312 using the cryogenic first cooling medium 1220.

In some embodiments, the refrigeration component 330 may include a base 332. The refrigerator 331 may be disposed on the base 332. At least a portion of the base 332 or the refrigerator 331 may be thermally coupled with the first cooling medium 1220 through a first pipeline 1310. In some embodiments, the first cooling medium 1220 may directly transfer heat with the refrigerator 331. In some embodiments, the first cooling medium 1220 may indirectly transfer heat with the refrigerator 331, e.g., transfer heat with the refrigerator 331 through other components. An inner wall of the cold head sleeve of the service turret 340 and the refrigeration component 330 may form the first pipeline 1310. An end of the base 332 may be with an opening to form a second pipeline 1320. The first pipeline 1310 may be in fluid communication with the second pipeline 1320. The heat exchanger 1211 may be in fluid communication with the second pipeline 1320 of the base 332 for exchanging heat with the first cooling medium 1220.

In some embodiments, the base 332 may be mounted in the service turret 340. A top portion of the refrigerator 331 may extend outside the service turret 340. Other portions of the refrigerator 331 may be located in the service turret 340 and mounted on the base 332. The first pipeline 1310 may be configured to allow the first cooling medium 1220 to flow outside the inner vessel 313. One end of the first pipeline 1310 may be in fluid communication with the inner vessel 313 through a third pipeline 333. Another end of the first pipeline 1310 may be in fluid communication with a fourth pipeline 334. The fourth pipeline 334 may be configured to allow the first cooling medium 1220 to flow outside the inner vessel 313, thereby releasing the pressure of the inner vessel 313. The fourth pipeline 334 may be thermally coupled to the refrigerator 331. It may be understood that a position of the fourth pipeline 334 is not limited in principle as long as the fourth pipeline 334 can be thermally coupled to the refrigerator 331, and heat transfer can be performed between the fourth pipeline 334 and the refrigerator 331. In some embodiments, the fourth pipeline 334 may extend along a major axial direction of the refrigerator 331. One end of the fourth pipeline 334 may pass through the base 332 and be in fluid communication with the first pipeline 1310. In some embodiments, the third pipeline 333 and the fourth pipeline 334 may also accommodate current leads, or be configured to allow addition of the first cooling medium 1220 to the inner vessel 313.

In some embodiments, the refrigeration component 330 may include a first valve 335. The first valve 335 may be disposed on the fourth pipeline 334 for controlling the fluid communication between the fourth pipeline 334 and the outside of the cryostat 310. When the first valve 335 is opened, the first cooling medium 1220 that transforms into a gas state may enter the first pipeline 1310 through the third pipeline 333, and then enter the fourth pipeline 334 through the first pipeline 1310 to release the pressure of the inner vessel 313. When the first valve 335 is closed, the first cooling medium 1220 in the inner vessel 313 may not flow outside the cryostat 310 through the fourth pipeline 334. In some embodiments, the first valve 335 may be a valve that can be manually operated or automatically operated at a certain pressure.

When the superconducting magnet operates normally, the first valve 335 may be closed, and the heat exchange component 1210 does not operate. When the first cooling medium 1220 in the inner vessel 313 may absorb the heat of the superconducting magnet 320 or the heat from the outside of the cryostat 310, the first cooling medium 1220 may vaporize. The gaseous first cooling medium 1220 may be in contact with the refrigerator 331 (e.g., the second stage cold head 331-2 of the refrigerator 331) through the second pipeline 1320 on the inner vessel 313, and transfer heat with the refrigerator 331. The gaseous first cooling medium 1220 may condense to the liquid state and flow into the inner vessel 313 along the second pipeline 1320. Therefore, the loss of the first cooling medium 1220 may be avoided.

In some embodiments, the base 332 may include the second pipeline 1320 in fluid communication with the first pipeline 1310. The second pipeline 1320 may be in fluid communication with the heat exchanger 1211. When the radiation shield 312 needs to be precooled, the first valve 335 may be closed. The heat exchange component 1210 may operate. The gaseous first cooling medium 1220 in the inner vessel 313 may enter the first pipeline 1310 through the third pipeline 333. Since the refrigerator 331 does not operate, the gaseous first cooling medium 1220 in the first pipeline 1310 may not be cooled into the liquid state. Therefore, the gaseous first cooling medium 1220 may enter the heat exchanger 1211 through the second pipeline 1320. The heat exchanger 1211 may exchange heat with the first cooling medium 1220.

When the radiation shield 312 is precooled, the first valve 335 may be closed. The heat exchange component 1210 may operate. Therefore, the gaseous first cooling medium 1220 in the inner vessel 313 may enter the heat exchanger 1211 through the first pipeline 1310 and the second pipeline 1320 of the refrigeration component 330. After transferring heat with the heat exchanger 1211, the first cooling medium 1220 may cool the radiation shield 312 to reduce the temperature of the radiation shield 312 and improve a rate of precooling the radiation shield 312. In some embodiments, during transport, the refrigerator 331 may not operate and the first valve 335 may be closed. The heat exchange component 1210 may operate. The gaseous first cooling medium 1220 in the inner vessel 313 may enter the heat exchanger 1211 through the first pipeline 1310 and the second pipeline 1320 of the refrigeration component 330. After transferring heat with the heat exchanger 1211, the first cooling medium 1220 may cool the radiation shield 312 to reduce the heat transfer from the radiation shield 312 to the inner vessel 313 caused by the temperature rise of the radiation shield 312, thereby reducing volatilization of a large amount of the first cooling medium 1220 to extend the transportation time and transportation distance of the superconducting magnet assembly. In other cases where the refrigerator 331 do not operate, the heat exchange component 1210 may also cool the radiation shield 312 and delay the temperature rise of the radiation shield 312.

In some embodiments, the first cooling medium 1220 in the inner vessel 313 may enter the heat exchanger 1211 through the refrigeration component 330. The heat exchanger 1211 may exchange heat with the first cooling medium 1220 to further cool the radiation shield 312, which may effectively solve the problem of taking a long time to cooling the radiation shield 312, implementing the rapid cooling of the radiation shield 312 and shortening the cooling time. In some embodiments, during transport, the radiation shield 312 may transfer heat with the heat exchanger 1211, thereby slowing down the temperature rise of the radiation shield 312 when the refrigeration component 330 stops operating, and delaying the volatilization of the first cooling medium 1220, which may be convenient for the long transportation distance and transportation time of the superconducting magnet assembly.

In some embodiments, the heat exchanger 1211 may be located between the radiation shield 312 and the outer vessel 311. In some embodiments, the heat exchanger 1211 may also be located between the radiation shield 312 and the inner vessel 313. In some embodiments, the heat exchanger 1211 may also be located within the service turret 340 or outside the service turret 340. In some embodiments, the heat exchanger 1211 may be of a flat shape. In some embodiments, the heat exchanger 1211 may be in fluid communication with the inner vessel 313.

In some embodiments, the heat exchanger 1211 may include an exchange chamber 1211-1 and a storage chamber 1211-2. The exchange chamber 1211-1 may be in fluid communication with the inner vessel 313 so that the first cooling medium 1220 flows between the exchange chamber 1211-1 and the inner vessel 313. The storage chamber 1211-2 may accommodate a second cooling medium that is configured to exchange heat with the first cooling medium 1220. The exchange chamber 1211-1 may be in fluid communication with the second pipeline 1320 of the refrigeration component 330. Therefore, the gaseous first cooling medium 1220 in the inner vessel 313 may enter the heat exchanger 1211 through the third pipeline 333, the first pipeline 1310, and the second pipe 1222, and exchange heat with the second cooling medium in the storage chamber 1211-2. In some embodiments, a material of the heat exchanger 1211 may be a metal, which may improve the heat exchange effect of the heat exchanger 1211. In some embodiments, the heat exchanger 1211 may be made of copper, which may further improve the heat exchange effect of the heat exchanger 1211.

In some embodiments, the first cooling medium 1220 may be liquid helium, and the second cooling medium may be liquid nitrogen. Due to the convenient preparation and low cost of liquid nitrogen, the heat exchanger 1211 using the liquid nitrogen may greatly save costs. In some embodiments, the second cooling medium in the heat exchanger 1211 may also include other cryogenic medium, such as liquid helium. In some embodiments, the second cooling medium of the heat exchanger 1211 may also use a cooling medium (e.g., water, etc.) with a relatively high heat capacity to store more cold energy.

The first cooling medium 1220 that escapes from the inner vessel 313 and enters the exchange chamber 1211-1 may sufficiently exchange heat with the second cooling medium in the heat exchanger 1211. When a temperature of the first cooling medium 1220 is higher than a temperature of the second cooling medium, the first cooling medium 1220 may be cooled by the second cooling medium. Conversely, when the temperature of the second cooling medium is higher than the temperature of the first cooling medium 1220, the second cooling medium may be cooled by the first cooling medium 1220. For instance, when the second cooling medium is liquid nitrogen or water, the second cooling medium may be cooled to solid ice by the first cooling medium 1220. The solid ice may be present in the heat exchanger 1211-1 as a cold energy storage material. When the temperature of the first cooling medium 1220 rises, the first cooling medium 1220 may be cooled by the cooling storage material.

In some embodiments, the exchange chamber 1211-1 may be disposed in the storage chamber 1211-2. In some embodiments, the exchange chamber 1211-1 may include at least one bent, which may increase a contact area of the exchange chamber 1211-1 and the storage chamber 1211-2. Therefore, the heat exchange effect between the first cooling medium 1220 and the second cooling medium may be improved. In some embodiments, the exchange chamber 1211-1 may be disposed in a solenoid shape, a U-type, a Z-type, an S-shape, a snakelike shape, a corrugated shape, etc. In some embodiments, an inner wall of the exchange chamber 1211-1 may have a groove with a raised or recessed surface. Therefore, the contact area of the exchange chamber 1211-1 and the storage chamber 1211-2 may be increased, thereby improving the heat exchange effect between the first cooling medium 1220 and the second cooling medium.

In some embodiments, the heat exchanger 1211 may include a fin heat exchanger, a tube-plate heat exchanger, or other structures capable of exchanging heat. In some embodiments, the inside of the storage chamber 1211-2 may be disposed with at least one exchange chamber 1211-1 where the first cooling medium 1220 can flow. In some embodiments, the exchange chamber 1211-1 may be a pipeline with a solenoid shape, a U-type, a Z-type, an S-shape, a snakelike shape, a corrugated shape, etc. A material of the exchange chamber 1211-1 may be a metal, such as copper, aluminum, or the like. In some embodiments, one or more heat sinks may be disposed on the exchange chamber 1211-1. Each of the one or more heat sinks may be a good conductor of heat, such as a copper fin, or the like. Each of the one or more heat sinks may be connected with the exchange chamber 1211-1 by a physical connection, such as mechanical assembly, welding, or the like. In this way, a heat exchange area of the exchange chamber 1211-1 may be increased. In some embodiments, the exchange chamber 1211-1 may be a heat pipe structure, thereby greatly improving heat exchange efficiency.

In some embodiments, the exchange chamber 1211-1 may be thermally connected with the first stage cold head 331-1 of the refrigerator 331 through at least a portion of the second pipeline 1320. The exchange chamber 1211-1 may be located near the first stage cold head 331-1 of the refrigerator 331 or thermally connected with the first stage cold head 331-1 of the refrigerator 331 through a communication position between the second pipeline 1320 and the inner vessel 313, which may form a primary thermal truncation, thereby reducing the heat leakage caused by the heat transfer.

In some embodiments, the heat exchange component 1210 may also include a cooling pipeline 1212. A first end of the cooling pipeline 1212 may be in fluid communication with the exchange chamber 1211-1. The cooling pipeline 1212 may be disposed circumferentially around the radiation shield 312 for cooling the radiation shield 312. A second end of the cooling pipeline 1212 may extend outside the outer vessel 311. When the radiation shield 312 is cooled using the heat exchange component 1210, the first valve 335 may be closed. The gaseous first cooling medium 1220 in the inner vessel 313 may enter the heat exchanger 1211 through the third pipeline 333, the first pipeline 1310, and the second pipeline 1320. The first cooling medium 1220 in the exchange chamber 1211-1 may exchange heat with the second cooling medium in the storage chamber 1211-2. After the heat exchange, the first cooling medium 1220 may enter the cooling pipeline 1212, and be thermally coupled with the radiation shield 312 through the cooling pipeline 1212 to cool the radiation shield 312, thereby reducing the temperature of the radiation shield 312. In some embodiments, after cooling the cooling radiation shield 312, the first cooling medium 1220 may be discharged through the cooling pipeline 1212.

In some embodiments, the heat exchange component 1210 may also include a second valve 1213. The second valve 1213 may be disposed on the second end of the cooling pipeline 1212 extending outside the outer vessel 311. The second valve 1213 may be configured to control the fluid communication between the cooling pipeline 1212 and the outside of the cryostat 310. In some embodiments, the second valve 1213 may be a valve that can be manually operated or automatically operated at a certain pressure. When the superconducting magnet assembly operates, the first valve 335 and the second valve 1213 may be closed. At this time, the refrigerator 331 may operate to cool the first cooling medium 1220, and no first cooling medium 1220 may flow outside of the cryostat 310, which implements no loss of the first cooling medium 1220. When the radiation shield 312 is cooled, the first valve 335 may be closed, and the second valve 1213 may be opened. The gaseous first cooling medium 1220 in the inner vessel 313 may enter the heat exchanger 1211 through the third pipeline 333, the first pipeline 1310, and the second pipeline 1320. And then, the first cooling medium 1220 may enter the cooling pipeline 1212 after exchanging heat with the second cooling medium of the storage chamber 1211-2 in the exchange chamber 1211-1. The first cooling medium 1220 may be discharged from the cryostat 310 after cooling the radiation shield 312 through the cooling pipeline 1212.

In some embodiments, the cooling pipeline 1212 may be disposed around the outer circumference of the radiation shield 312. In some embodiments, the cooling pipeline 1212 may be disposed around the inner circumference of the radiation shield 312. In some embodiments, the cooling pipeline 1212 and the radiation shield 312 may be in direct contact. In some embodiments, the cooling pipeline 1212 may be connected with the radiation shield 312 through a thermal transfer member 1410, etc. The above manners may implement that the cooling pipeline 1212 may be thermally coupled with the radiation shield 312 to cool the radiation shield 312. In some embodiments, the cooling pipeline 1212 may be thermally coupled with the radiation shield 312 at one or more positions. In some embodiments, the whole cooling pipeline 1212 may be thermally coupled with the radiation shield 312. In some embodiments, the cooling pipeline 1212 may be disposed at least one circle of the circumference of the radiation shield 312 to cool the radiation shield 312. In some embodiments, the number (count) of the cooling pipeline 1212 may be larger than or equal to one. The more than one cooling pipeline 1212 may be in fluid communication with the exchange chamber 1211-1, respectively. The more than one cooling pipeline 1212 may be disposed circumferentially around the radiation shield 312, respectively, and spaced from each other. In some embodiments, when there are two or more transfer pipelines 1212, the number (count) of the exchange chamber 1211-1 may be one or more.

In some embodiments, the cooling pipeline 1212 may be made of a metal material, which may improve the heat transfer effect of the cooling pipeline 1212. In some embodiments, the cooling pipeline 1212 may be made of copper, which may further improve the heat transfer effect of the cooling pipeline 1212. In some embodiments, one end of the cooling pipeline 1212 connected with the exchange chamber 1211-1 may be connected with one end of the heat exchanger 1211 away from the refrigerator 331, or extend inside the exchange chamber 1211-1 to be connected with the second pipeline 1320. It should be noted that a connection position of the cooling pipeline 1212 and the exchange chamber 1211-1 may not be limited to the above position. For example, the cooling pipeline 1212 may be connected with the exchange chamber 1211-1 in other manners, e.g., the cooling pipeline 1212 may be connected with the exchange chamber 1211-1 at a middle portion of the exchange chamber 1211-1.

In some embodiments, the heat exchanger 1211 may include a fifth pipeline 1211-3 and a sixth pipeline 1211-4 in fluid communication with the storage chamber 1211-2. The fifth pipeline 1211-3 and the sixth pipeline 1211-4 may be configured to input the second cooling medium in the storage chamber 1211-2 or output the second cooling medium from the storage chamber 1211-2. The fifth pipeline 1211-3 and the sixth pipeline 1211-4 may pass through the outer vessel 311 or the service turret 340, and extend inside the cryostat 310 (e.g., the outer vessel 311 or the service turret 340) to be in fluid communication with the storage chamber 1211-2 in the heat exchanger 1211. The fifth pipeline 1211-3 may be configured to allow the addition of the second cooling medium to the storage chamber 1211-2. The sixth pipeline 1211-4 may be configured to allow the discharge of the second cooling medium from the storage chamber 1211-2 after the second cooling medium absorbs the heat. In some embodiments, the heat exchanger 1211 may further include a third valve 1211-5 and a fourth valve 1211-6. The third valve 1211-5 may be disposed on the fifth pipeline 1211-3 for controlling the fluid communication between the fifth pipeline 1211-3 and the outside of the cryostat 310. The fourth valve 1211-6 may be disposed on the sixth pipeline 1211-4 for controlling the fluid communication between the sixth pipeline 1211-4 and the outside of the cryostat 310. In some embodiments, the second cooling medium may be added, in advance, into the storage chamber 1211-2 to cool the second cooling medium. An external cold source may be in fluid communication with the heat exchanger 1211 through the fifth pipeline 1211-3 and the sixth pipeline 1211-4. In some embodiments, the third valve 1211-5 and the fourth valve 1211-6 may be valves that can be manually operated or automatically operated at a certain pressure.

In some embodiments, the fifth pipeline 1211-3 and the sixth pipeline 1211-4 may be made of stainless steel, which may reduce the heat transfer from the outside to the radiation shield 312 and the inner vessel 313. In some embodiments, the fifth pipeline 1211-3 and the sixth pipeline 1211-4 may be elongated pipes of which a ratio of diameter and length may be within a range from 1:5 to 1:10. In some embodiments, the fifth pipeline 1211-3 and the sixth pipeline 1211-4 may also use thin-walled bellows.

In some embodiments, the radiation shield 312 may be cooled by the heat exchanger 1211 and the cooling pipeline 1212. As shown in FIG. 12 and FIG. 13, there may be a certain space between the heat exchanger 1211 and the radiation shield 312. The heat exchanger 1211 may transfer heat with the radiation shield 312 by heat radiation between the heat exchanger 1211 and the radiation shield 312. For instance, when the radiation shield 312 is cooled, the first valve 335 may be closed. The second valve 1213 may be opened. The gaseous first cooling medium 1220 in the inner vessel 313 may enter the exchange chamber 1211-1 of the heat exchanger 1211 through the third pipeline 333, the first pipeline 1310, and the second pipe 1222, and then exchange heat with the second cooling medium in the storage chamber 1211-2. The first cooling medium 1220 after the heat exchange may enter the cooling pipeline 1212, and be thermally coupled to the radiation shield 312 through the cooling pipeline 1212 to reduce the temperature of the radiation shield 312. In some embodiments, the second cooling medium in the storage chamber 1211-2 may also transfer the cold energy to the radiation shield 312 to cool the radiation shield 312 in thermal radiation. The first cooling medium 1220 may be discharged from the cryostat 310 after the first cooling medium 1220 in the cooling pipeline 1212 cools the radiation shield 312.

In some embodiments, the heat exchange component 1210 may include a thermal connection joint 1214. The thermal connection joint 1214 may be located at one end of the heat exchanger 1211 and thermally coupled with the refrigeration component 330. The thermal connection joint 1214 may be configured to transfer the cold energy of the refrigerator 331 to the heat exchanger 1211. The thermal connection joint 1214 may be connected with the base 332 of the refrigeration component 330. The cold energy of the first stage cold head 331-1 and/or the second stage cold head 331-2 of the refrigerator 331 may be transferred to the thermal connection joint 1214 through the base 332, and then transferred to the heat exchanger 1211 through the thermal connection joint 1214 to cool the second cooling medium. Therefore, the heat exchanger 1211 may store the cold energy of the refrigerator 331. The heat exchanger 1211 may be used as a cold energy storage to exchange heat with the first cooling medium 1220 in the exchange chamber 1211-1.

In some embodiments, the second cooling medium may be added to the heat exchanger 1211 using the fifth pipeline 1211-3 and the sixth pipeline 1211-4. In some embodiments, after being added into the heat exchanger 1211, the second cooling medium in the heat exchanger 1211 may store the cold energy of the refrigerator 331 through the thermal connection joint 1214. In some embodiments, simultaneously, the second cooling medium may be added to the heat exchanger 1211 using the fifth pipeline 1211-3 and the sixth pipeline 1211-4, and store the cold energy of the refrigerator 331 through the thermal connection joint 1214.

Figure 14:
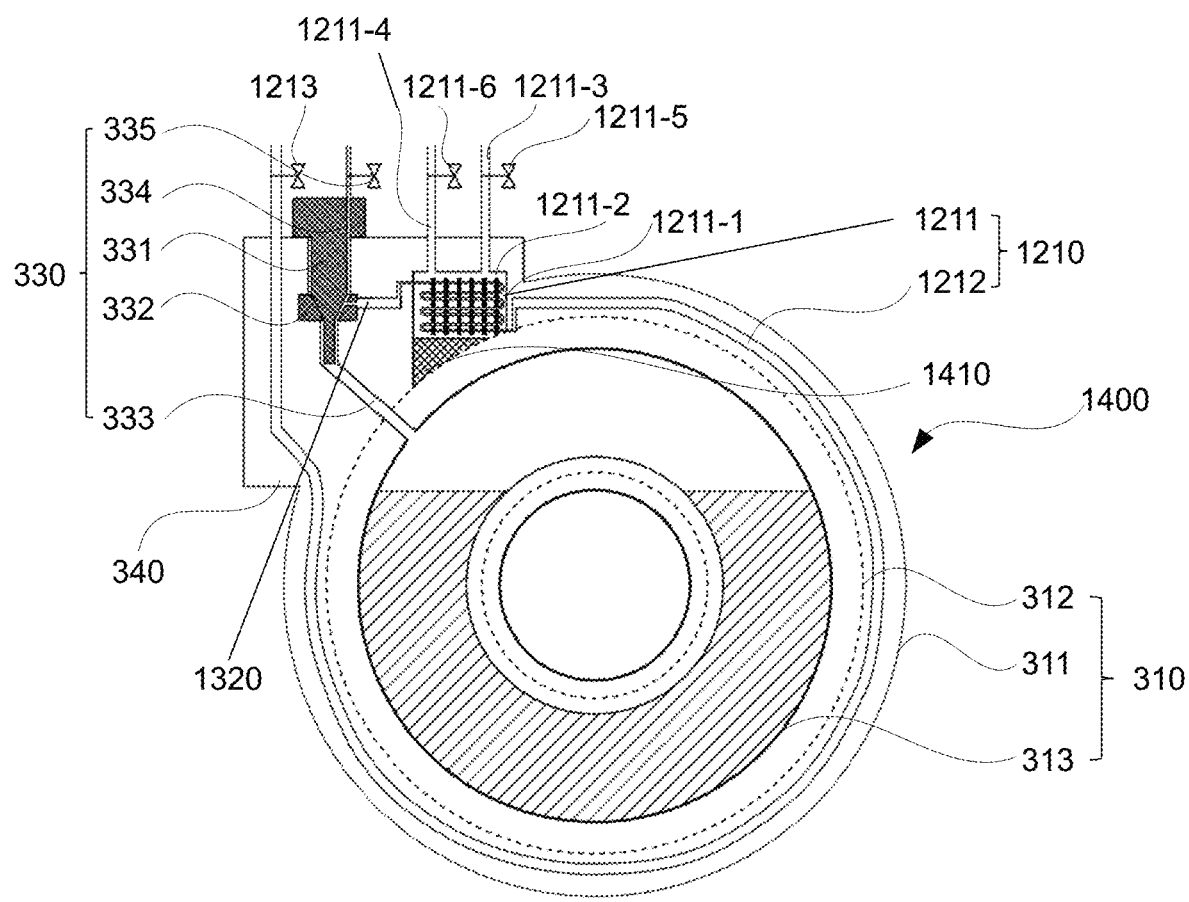
FIG. 14 is a schematic diagram illustrating an exemplary superconducting magnet assembly according to some embodiments of the present disclosure.

FIG. 14 is a schematic diagram illustrating an exemplary superconducting magnet assembly 1400 according to some embodiments of the present disclosure. In some embodiments, the superconducting magnet assembly 1400 may be applied in the main magnet 220 of the MRI scanner 200. In some embodiments, the switch component 410 illustrated in FIGS. 4 to 7 and/or the transfer component 800 illustrated in FIGS. 8 through 11 may be applied in the superconducting magnet assembly 1400.

Compared with the superconducting magnet assembly 1200 in FIGS. 12 and 13, in the superconducting magnet assembly 1400, the heat exchanger 1211 may be connected with the radiation shield 312 through a thermal transfer member 1410. Alternatively or additionally, there may be a certain space between the heat exchanger 1211 and the refrigerator 331. For example, as shown in FIG. 14, the second pipeline 1320 may extend outside the base 332 to space the heat exchanger 1211 and the refrigerator 331. In this case, the thermal connection joint 1214 may or may not be omitted. The heat exchanger 1211 and the refrigerator 331 (e.g., the first stage cold head 331-1) may be thermally coupled through the second pipeline 1320.

In some embodiments, the heat exchanger 1211 may be thermally coupled with the radiation shield 312. The storage chamber 1211-2 may transfer heat with the radiation shield 312. The second cooling medium in the storage chamber 1211-2 may absorb the heat of the radiation shield 312 to reduce the temperature of the radiation shield 312. In some embodiments, the heat exchanger 1211 may be connected with the radiation shield 312 directly or through a thermal transfer member 1410. A surface of the thermal transfer member 1410 facing the radiation shield 312 may be an arc surface to match the circumference surface of the radiation shield 312. Therefore, the heat transfer efficiency between the heat exchanger 1211 and the radiation shield 312 may be improved, which may improve the stability of the cryostat 310.

In some embodiments, as shown in FIG. 14, there may be a certain space between the heat exchanger 1211 and the refrigerator 331. The second cooling medium in the heat exchanger 1211 may be added through the fifth pipeline 1211-3 and the sixth pipeline 1211-4 to ensure the cold energy of the heat exchanger 1211. The heat exchanger 1211 and the radiation shield 312 may be connected through a thermal transfer member 1410, such as a thermal transfer band. For instance, when the radiation shield 312 is cooled, the first valve 335 may be closed. The second valve 1213 may be opened. The third valve 1211-5 and the fourth valve 1211-6 may be opened. The gaseous first cooling medium 1220 in the inner vessel 313 may enter the exchange chamber 1211-1 of the heat exchanger 1211 through the third pipeline 333, the first pipeline 1310, and the second pipe 1222, and then exchange heat with the second cooling medium in the storage chamber 1211-2. The first cooling medium 1220 after the heat exchange may enter the cooling pipeline 1212, and be thermally coupled with the radiation shield 312 through the cooling pipeline 1212 to reduce the temperature of the radiation shield 312. In some embodiments, the second cooling medium may transfer the cold energy to directly cool the radiation shield 312 through the thermal transfer member 1410 to reduce the temperature of the radiation shield 312. The first cooling medium 1220 in the cooling pipeline 1212 may be discharged from the cryostat 310 after the heat transfer.

Figure 15:
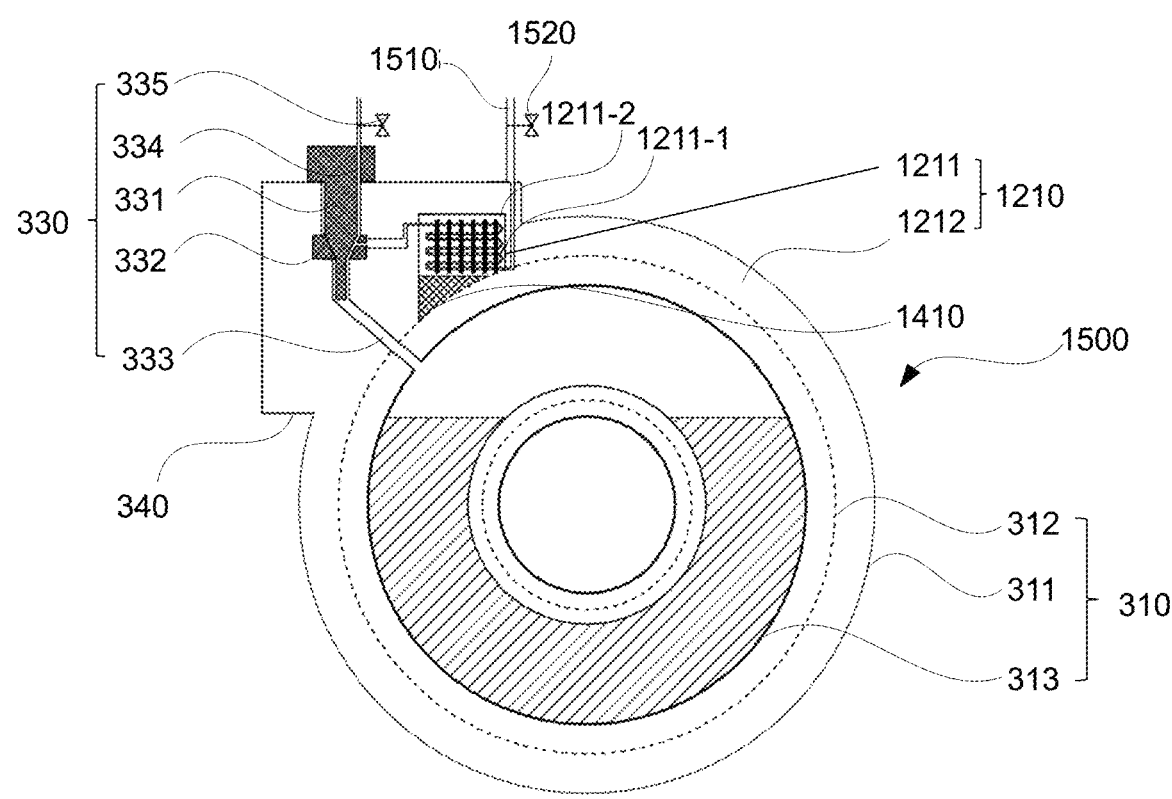
FIG. 15 is a schematic diagram illustrating an exemplary superconducting magnet assembly according to some embodiments of the present disclosure.

FIG. 15 is a schematic diagram illustrating an exemplary superconducting magnet assembly 1500 according to some embodiments of the present disclosure. In some embodiments, the superconducting magnet assembly 1500 may be applied in the main magnet 220 of the MRI scanner 200. In some embodiments, the switch component 410 illustrated in FIGS. 4 to 7 and/or the transfer component 800 illustrated in FIGS. 8 through 11 may be applied in the superconducting magnet assembly 1500.

Compared with the superconducting magnet assembly 1200 and/or the superconducting magnet assembly 1400, in the superconducting magnet assembly 1500, the heat transfer component 1210 may include a seventh pipeline 1510 (e.g., an outlet pipeline) configured to allow the first cooling medium 1220 to flow outside the cryostat 310. A first end of the seventh pipeline 1510 may be in fluid communication with the exchange chamber 1211-1, and a second end of the seventh pipeline 1510 may extend outside the cryostat 310. The gaseous first cooling medium 1220 in the inner vessel 313 may enter the exchange chamber 1211-1 of the heat exchanger 1211 through the third pipeline 333, the first pipeline 1310, and the second pipe 1222. And then, the second cooling medium in the storage chamber 1211-2 may absorb the cold energy of the first cooling medium 1220 in the heat exchanger 1211 to cool the radiation shield 312, which may also slow the temperature rise of the radiation shield 312. In this case, the transfer pipeline 1211-2 may be omitted. In some embodiments, in the superconducting magnet assembly 1500, the fifth pipeline 1211-3 and the sixth pipeline 1211-4 may be omitted and the second cooling medium may be added into the storage chamber 1211-2 of the heat exchanger 1211 in advance.

In some embodiments, the heat exchange component 1210 may include a fifth valve 1520. The fifth valve 1520 may be disposed on the seventh pipeline 1510 for controlling the fluid communication between the outside and the seventh pipeline 1510. In some embodiments, the fifth valve 1520 may be a valve that can be manually operated or automatically operated at a certain pressure. When the superconducting magnet assembly operates, the first valve 335 and the fifth valve 1520 may be closed. When the fifth valve 1520 is opened and the first valve 335 is closed, the gaseous first cooling medium 1220 in the inner vessel 313 may enter the heat exchanger 1211 through the third pipeline 333, the first pipeline 1310, and the second pipeline 1320. The first cooling medium 1220 may enter the seventh pipeline 1510 to be discharged from the cryostat 310 after the first cooling medium 1220 exchanges heat with the second cooling medium in the storage chamber 1211-2 in the exchange chamber 1211-1.

In some embodiments, in the superconducting magnet assembly 1500, the radiation shield 312 may be cooled only by the heat exchanger 1211. The heat exchanger 1211 may be thermally coupled with the radiation shield 312. The seventh pipeline 1510 may be connected with the exchange chamber 1211-1 and extend outside the cryostat 310. Referring to FIG. 15, in the superconducting magnet assembly 1500, when the radiation shield 312 is cooled, the first valve 335 may be closed, and the fifth valve 1520 may be opened. The gaseous first cooling medium 1220 in the inner vessel 313 may enter the exchange chamber 1211-1 of the heat exchanger 1211 through the third pipeline 333, the first pipeline 1310, and the second pipe 1222, and then exchange heat with the second cooling medium in the storage chamber 1211-2. The first cooling medium 1220 after the heat exchange may enter the seventh pipeline 1510, and be discharged from the cryostat 310. The second cooling medium after absorbing the cold energy of the first cooling medium 1220 may directly cool the radiation shield 312 to reduce the temperature of the radiation shield 312.

Figure 16:
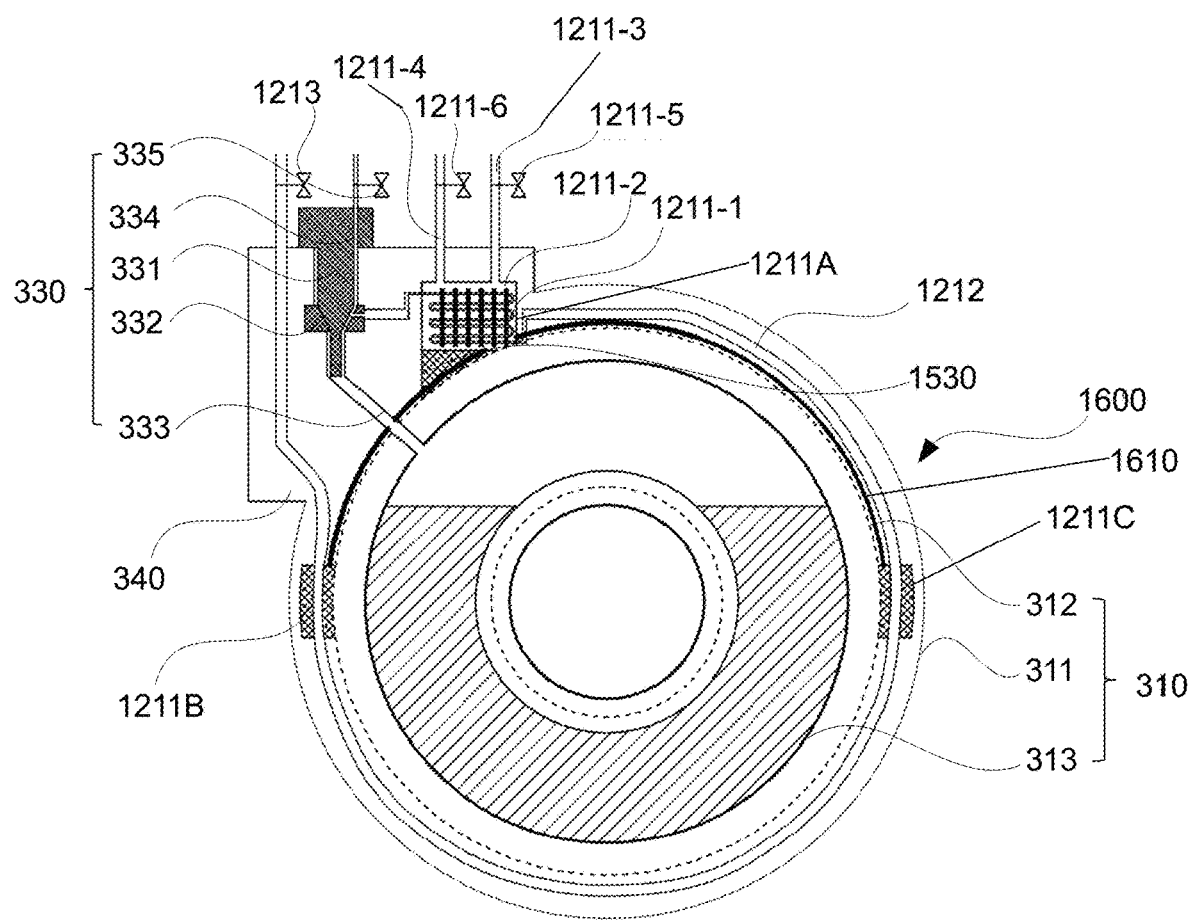
FIG. 16 is a schematic diagram illustrating an exemplary superconducting magnet assembly according to some embodiments of the present disclosure.

FIG. 16 is a schematic diagram illustrating an exemplary superconducting magnet assembly 1600 according to some embodiments of the present disclosure. In some embodiments, the superconducting magnet assembly 1600 may be applied in the main magnet 220 of the MRI scanner 200. In some embodiments, the switch component 410 illustrated in FIGS. 4 to 7 and/or the transfer component 800 illustrated in FIGS. 8 through 11 may be applied in the superconducting magnet assembly 1600.

Compared with the superconducting magnet assembly 1200 and/or the superconducting magnet assembly 1400, in the superconducting magnet assembly 1600, the number (count) of the heat exchanger 1211 may be more than one. The more than one exchange member 1211-1 may be disposed around the circumference of the radiation shield 312 at interval. The storage chamber 1211-2 of each heat exchanger 1211 may be connected in series and/or parallel with other storage chambers. The more than one exchange member 1211-1 may cool the radiation shield 312 by transferring heat with the radiation shield 312 through, e.g., radiation heat transfer, contact heat transfer, conduction heat transfer, etc. The cooling pipeline 1212 may be connected with the exchange chamber 1211-1 of each heat exchanger 1211, respectively, to cool the first cooling medium 1220 in the cooling pipeline 1212, thereby implementing the rapid cooling of the radiation shield 312. In some embodiments, the storage chambers 1211-2 of the more than one exchange chamber 1211-1 may be in fluid communication through a delivery pipeline 1610 to allow the flow of the second cooling medium in the storage chambers 1211-2 of the more than one exchange chamber 1211-1.

In some embodiments, referring to FIG. 16, the heat exchange component 1210 may include three heat exchangers 1211, such as 1211-A, 1211-B, and 1211-C. The three heat exchangers 1211 may be disposed around the circumference of the radiation shield 312 at interval. One of the three heat exchangers 1211 (e.g., 1211-A) may be connected with the fifth pipeline 1211-3 and the sixth pipeline 1211-4. The heat exchanger 1211-A may be in fluid communication with the two other heat exchangers 1211-B and 1211-C through the delivery pipeline 1610 to deliver the second cooling medium to ensure that the heat exchangers 1211 may cool the cooling pipeline 1212 and the radiation shield 312. In some embodiments, the cooling pipeline 1212 may pass through the three heat exchangers 1211-A through 1211-C successively.

For instance, when the radiation shield 312 is cooled, the first valve 335 may be closed. The second valve 1213 may be opened. The third valve 1211-5 and the fourth valve 1211-6 may be opened. The second cooling medium may be added into the three heat exchangers 1211. The gaseous first cooling medium 1220 in the inner vessel 313 may enter the exchange chamber 1211-1 of the heat exchanger 1211 through the third pipeline 333, the first pipeline 1310, and the second pipe 1222, and exchange heat with the second cooling medium in the storage chamber 1211-2. The first cooling medium 1220 after the heat exchange may enter the cooling pipeline 1212, and be thermally coupled with the radiation shield 312 through the cooling pipeline 1212 to reduce the temperature of the radiation shield 312. In some embodiments, the second cooling medium may also cool the radiation shield 312 to reduce the temperature of the radiation shield 312. The first cooling medium 1220 after the heat transfer with the radiation shield 312 may be discharged from the cryostat 310.

When the radiation shield 312 of the present disclosure is pre-cooled, the first valve 335 may be closed. The second valve 1213, the third valve 1211-5, and the fourth valve 1211-6 may be opened. The second cooling medium may enter the storage chamber 1211-2 through the fifth pipeline 1211-3 and the sixth pipeline 1211-4. The gaseous first cooling medium 1220 in the inner vessel 313 may enter the exchange chamber 1211-1 through the third pipeline 333, the first pipeline 1310, the second pipeline 1320, and exchange heat with the second cooling medium in the storage chamber 1211-2. The first cooling medium 1220 may enter the cooling pipeline 1212 to cool the radiation shield 312, and escape from the cooling pipeline 1212 after cooling the radiation shield 312, which may greatly improve the heat transfer efficiency and the precooling speed.

In some embodiments, the heat exchanger 1211 may be connected or coupled with a cryogenic member such as a magnet current lead, a superconducting switch, etc. besides connected or coupled with the cooling pipeline 1212 and the radiation shield 312, which may improve the thermal stability of each component.

After the precooling of the superconducting magnet, a quantity of the second cooling medium (e.g., liquid nitrogen) may be added into the heat exchanger 1211. When the refrigerator 331 is turned on, since a refrigeration temperature of the first stage cold head 331-1 is about 30-50 K, the storage chamber 1211-2 may be cooled by the thermal connection joint 1214. The second cooling medium (e.g., liquid nitrogen) in the storage chamber 1211-2 may be solidified as nitrogen ice. The nitrogen ice may be a cold energy storage of the cryostat 310.

During transport or when the power of the superconducting magnet assembly is off, the refrigerator 331 may not operate. The first cooling medium 1220 in the inner vessel 313 may begin to volatilize. The first valve 335 may be closed. The second valve 1213 may be opened. The gaseous first cooling medium 1220 may enter the heat exchanger 1211 through the third pipeline 333. The first cooling medium 1220 may exchange heat with the second cooling medium (e.g., nitrogen ice) in the exchange chamber 1211-1, and then enter the cooling pipeline 1212. After cooling the radiation shield 312, the first cooling medium 1220 may escape from the cooling pipeline 1212. After the second cooling medium (e.g., nitrogen ice) absorbs the heat of the first cooling medium 1220, the nitrogen ice may gradually liquefy into liquid nitrogen, and finally gasify into nitrogen. The nitrogen may be discharged from the sixth pipeline 1211-4. The process of heat transfer may slow down the volatilization of the first cooling medium 1220 in the inner vessel 313, thereby reducing a temperature rise speed of the radiation shield 312. Therefore, the transport time of the superconducting magnet assembly may be extended, thereby avoiding a re-precooling process of the superconducting magnet assembly.

In some embodiments, when the MRI system operates with a strong pulse sequence, a gradient coil of the MRI system may generate a large vortex flow on the radiation shield 312, the inner vessel 313, and the superconducting magnet. The vortex flow may rise the temperature of the radiation shield 312 continuously. The temperature of the radiation shield 312 may even exceed a temperature threshold of the MRI system to cause a halt of the MRI system. In the present disclosure, the second cooling medium (e.g., nitrogen ice) in the heat exchanger 1211 may be pre-cooled used as an additional cold source for cooling the gaseous first cooling medium 1220, the cooling pipeline 1212, and the radiation shield 312 connected with the second cooling medium. Therefore, the temperature rise of the radiation shield 312 may be slowed down, thereby improving the scan stability of the MRI system.

The superconducting magnet assembly of the present disclosure may also cause large-scale refrigeration devices to be widely used in the MRI system. For instance, there may be no need to provide an exclusive pre-cooling interface on the superconducting magnet assembly. During the precooling stage of the superconducting magnet assembly, the large-scale refrigeration device may be connected with the fifth pipeline 1211-3 and the sixth pipeline 1211-4 of the heat exchanger 1211. Therefore, the second cooling medium (e.g., helium with a temperature of 20K) may be added into the heat exchanger 1211. The gaseous first cooling medium 1220 in the inner vessel 313 may be rapidly cooled. The base 332 of the refrigerator 331 and the radiation shield 312 may be cooled through the heat exchanger 1211, thereby greatly speed up the cooling speed of the radiation shield 312.

In some embodiments, the number (or count) of the heat exchange component 1210 may be more than one. For example, the more than one heat exchange component 1210 may be disposed in parallel along the z-direction.

The present disclosure provides a superconducting magnet assembly. The superconducting magnet assembly may include a cryostat 310, a superconducting magnet 320, and a refrigeration component 330. The refrigeration component 330 may include the base 332 and the refrigerator 331 disposed on the base 332. At least a portion of the base 332 may be in fluid communication with the inner vessel 313. The structure of the superconducting magnet assembly has been mentioned above, which may not be described herein.

In some embodiments, the superconducting magnet assembly may include a heat exchanger 1211 and a cooling pipeline 1212. The structure has been mentioned above, which may not be described herein.

The present disclosure provides an MRI device. The MRI device may include a cryostat 310, a superconducting magnet 320, and a refrigeration component 330. The cryostat 310 may include the inner vessel 313, the outer vessel 311 sleeved outside the inner vessel 313, and the radiation shield 312 between the inner vessel 313 and the outer vessel 311. The first cooling medium 1220 may be accommodated in the inner vessel 313. The superconducting magnet 320 may be immersed in the first cooling medium 1220. There may be an accommodation chamber between the outer vessel 311 and the inner vessel 313. At least a portion of the refrigeration component 330 may be disposed in the accommodation chamber. The refrigeration component 330 may cool the first cooling medium 1220 and the radiation shield 312. The heat exchange component 1210 may be disposed in the accommodation chamber. The heat exchange component 1210 may include the heat exchanger 1211. The heat exchanger 1211 may exchange heat with the first cooling medium 1220 to cool the radiation shield 312.

The superconducting magnet assembly may generate a powerful and uniform main magnetic field in a scan region. A frequency radio (RF) coil assembly may include transmitting and/or receiving coils. A gradient coil assembly may be surrounded the scan region. The MRI system may consume cold energy produced by the refrigeration component 330. A computer processing system (e.g., the processing device 120) may receive signals from the receiving coil and transform the signals to data such as images. Since the superconducting magnet operates at very low temperatures, the cryostat 310 may maintain the temperature of the superconducting magnet, so that the superconducting magnet may be operated normally.

A structure of the cryostat in the embodiment may be the same as the structure of the cryostat 310 in the above embodiments, which may not be described herein. The MRI system may use the cryostat 310 to maintain the temperature of the superconducting magnet 320, thereby allowing the superconducting magnet 320 to maintain a good superconducting state to ensure normal operation of the superconducting magnet 320.

The present disclosure provides a cooling method of an MRI system. The MRI system may include a cryostat 310, a superconducting magnet 320, and a refrigeration component 330. The refrigeration component 330 may include the base 332 and the refrigerator 331 disposed on the base 332. It may be understood that the specific structure of the cryostat 310 in this embodiment has been mentioned above, which may not be described herein. In some embodiments, the cooling method may include two stages, such as the precooling process and the cooling process during transport.

The precooling process may include adding the first cooling medium 1220 into the cryostat 310, and adding the second cooling medium into the heat exchanger 1211. For example, the first cooling medium 1220 may be added into the inner vessel 313 of the cryostat 310 to immerse at least a portion of the superconducting magnet 320 in the first cooling medium 1220.

The precooling process may also include driving the refrigeration component 330 to cool the first cooling medium 1220 so as to cause the superconducting magnet 320 to maintain the superconducting state, and cooling the radiation shield 312 of the cryostat 310 using the refrigeration component 330 by heat transfer. During the process, an airflow transmission channel between the cryostat 310 and the outside may be closed. Valves for controlling the fluid communication between the inner vessel 313 of the cryostat 310 and the outside, and valves for controlling the fluid communication between the heat exchange component 1210 and the outside may be closed. For example, one or more of the first valve 335, the second valve 1213, the third valve 1211-5, the fourth valve 1211-6, the fifth valve 1520, etc., may be closed. In some embodiments, the first valve 335 and the second valve 1213 may be in a closed state simultaneously.

The cooling method during transport may include stopping driving the refrigeration component 330. One end of the heat exchange component 1210 may be in fluid communication with the refrigeration component 330. Another end of the heat exchange component 1210 may extend outside the cryostat 310 such that the first cooling medium 1220 flowing from the inner vessel 313 may reach the outside of the cryostat 310 through the heat exchange component 1210, thereby continuously cooling the radiation shield 312. In some embodiments, at least one end of the base 332 may be opened. The cold head sleeve and a portion of the refrigerator 331 may form an airflow passage. The airflow passage may be in fluid communication with the opening of the base 332 such that the first cooling medium 1220 flowing from the inner vessel 313 may reach the outside of the cryostat 310 through the heat exchange component 1210. During the above process, the first valve 335 may maintain closed, and the second valve 1213 may maintain open.

The cooling method of the MRI system in the present disclosure may effectively maintain the cryogenic state of the radiation shield 312 in the case where the refrigeration component 330 does not operate, thereby ensuring that the shielding effect of the radiation shield 312 is good and maintaining the superconducting state of the superconducting magnet. The opening of the base 332 may be in fluid communication with the heat exchange component 1210, avoiding the gasification cooling medium directly flushing the heat exchange component 1210 or the refrigeration component 330. A large amount of volatilization of the refrigeration medium may be avoided while ensuring the cooling efficiency.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system."

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claimed subject matter may lie in less than all features of a single foregoing disclosed embodiment.

What is claimed is:

1. A superconducting magnet assembly, comprising:

a cryostat, including
an outer vessel;
and
a radiation shield disposed within the outer vessel;
a superconducting magnet configured to generate a main magnetic field and disposed in the radiation shield; and
a refrigeration component at least a portion of which is disposed within the outer vessel, including
a refrigerator including a first stage cold head and a second stage cold head, the second stage cold head being configured to cool the superconducting magnet to a superconducting state, the first stage cold head being configured to cool the radiation shield; and
a transfer component, the transfer component being thermally coupled with the second stage cold head of the refrigerator and the superconducting magnet, and the transfer component including a transfer pipeline, wherein
the transfer pipeline is a hollow closed structure filled with a transfer medium that transitions between a gas phase and a liquid phase based on a refrigeration temperature of the refrigerator, a first end of the transfer pipeline being thermally coupled with the second stage cold head of the refrigerator, a second end of the transfer pipeline being thermally coupled with the superconducting magnet, and
the transfer pipeline includes a first transfer pipeline and a second transfer pipeline, a first end of the first transfer pipeline being connected with a first end of the second transfer pipeline so that the first transfer pipeline and the second transfer pipeline are in fluid communication, the first transfer pipeline being disposed in a vertical direction, the second transfer pipeline being at an angle with the first transfer pipeline, a second end of the first transfer pipeline being thermally coupled with the refrigerator, and a second end of the second transfer pipeline being thermally coupled with the superconducting magnet.

2. The superconducting magnet assembly of claim 1, wherein the transfer pipeline includes an end cover connected with the second end of the first transfer pipeline, a diameter of a first end of the end cover being smaller than a diameter of a second end of the end cover, the first end of the end cover being connected with the second end of the first transfer pipeline, the second end of the end cover being away from the second end of the first transfer pipeline.

3. The superconducting magnet assembly of claim 1, wherein the transfer component includes a connection block connected with the second end of the transfer pipeline, the transfer pipeline being thermally coupled with the radiation shield or the superconducting magnet through the connection block.

4. The superconducting magnet assembly of claim 1, wherein the refrigeration component includes a support component, the support component including one or more fixing holes configured to fix the transfer pipeline and the refrigerator on the support component, the support component being connected with the first end of the transfer pipeline.

5. The superconducting magnet assembly of claim 4, wherein an area of a surface of the support component facing the refrigerator is larger than an area of a cross section of the transfer pipeline.

6. The superconducting magnet assembly of claim 1, wherein the transfer component includes a supplement pipeline configured to allow addition of the transfer medium to the transfer pipeline, a first end of the supplement pipeline being in fluid communication with the transfer pipeline, a second end of the supplement pipeline extending outside the cryostat and being connected with an external cold source of the transfer medium.

7. The superconducting magnet assembly of claim 6, wherein the transfer component includes a valve of the supplement pipeline configured to control fluid communication between the supplement pipeline and the external cold source.

8. The superconducting magnet assembly of claim 1, wherein
the refrigeration component includes a switch component,
the switch component includes a thermal switch, the thermal switch including a activation mode configured to facilitate heat transfer between the first stage cold head and the radiation shield, and a deactivation mode configured to break or impede the heat transfer between the first stage cold head and the radiation shield;
the thermal switch includes a container, a cold end, and a hot end, a first end of the container being thermally coupled with the stage cold head through the cold end, and a second end of the container being thermally coupled with the radiation shield through the hot end; and
the container is a hollow structure filled with a transfer medium that transitions between a gas phase and a liquid phase based on a refrigeration temperature of the first stage cold head.

9. The superconducting magnet assembly of claim 1, wherein
the refrigeration component includes a switch component,
the switch component includes a thermal switch, the thermal switch including a activation mode configured to facilitate heat transfer between the first stage cold head and the radiation shield, and a deactivation mode configured to break or impede the heat transfer between the first stage cold head and the radiation shield;
a first value of a heat transfer rate of at least a portion of the thermal switch at a first temperature range including a refrigeration temperature of the first stage cold head is relatively high so that the thermal switch is in the activation mode when the refrigerator is on;
a second value of the heat transfer rate of the at least portion of the thermal switch at a second temperature range higher than the first temperature range is smaller than the first value so that the first thermal switch is in the deactivation mode when the refrigerator is off.

10. The superconducting magnet assembly of claim 1, wherein the refrigeration component includes a switch component and a connection component, the connection component being configured to connect the refrigerator with the switch component, and connect the switch component with the radiation shield or the superconducting magnet.

11. The superconducting magnet assembly of claim 1, wherein:
the cryostat includes an inner vessel;
the inner vessel accommodates a first cooling medium configured to maintain the superconducting magnet in the superconducting state; and
the superconducting magnet assembly further comprises a heat exchange component that is disposed within the outer vessel and configured to exchange heat with the first cooling medium.

12. The superconducting magnet assembly of claim 11, wherein the heat exchange component includes an exchange chamber and a storage chamber, the exchange chamber being in fluid communication with the inner vessel so that the first cooling medium flows from the inner vessel to the heat exchange component, the storage chamber accommodating a second cooling medium that is configured to exchange heat with the first cooling medium.

13. The superconducting magnet assembly of claim 12, wherein the heat exchange component includes a cooling pipeline configured to cool the radiation shield, the cooling pipeline being disposed circumferentially around the radiation shield, a first end of the cooling pipeline being in fluid communication with the exchange chamber, and a second end of the cooling pipeline extending outside the cryostat.

14. The superconducting magnet assembly of claim 12, wherein the heat exchange component includes an outlet pipeline configured to allow the first cooling medium to flow outside the cryostat, a first end of the outlet pipeline being in fluid communication with the exchange chamber, and a second end of the outlet pipeline extending outside the cryostat.

15. The superconducting magnet assembly of claim 11, wherein the heat exchange component includes a thermal connection joint through which the heat exchange component is thermally coupled with the refrigeration component.

16. A magnetic resonance (MR) device, comprising:
a superconducting magnet assembly including a bore;
a frequency radio (RF) coil assembly disposed within the bore; and
a gradient coil assembly disposed within the bore and between the RF coil assembly and the superconducting magnet assembly;
wherein the superconducting magnet assembly includes:
a cryostat, including
an outer vessel; and
a radiation shield disposed within the outer vessel;
a superconducting magnet configured to generate a main magnetic field and disposed in the radiation shield; and
a refrigeration component at least a portion of which is disposed within the outer vessel, including:
a refrigerator configured to cool the superconducting magnet to a superconducting state and cool the radiation shield;
a transfer component, the transfer component being thermally coupled with the second stage cold head of the refrigerator and the superconducting magnet, and the transfer component including a transfer pipeline, wherein
the transfer pipeline is a hollow structure filled with a transfer medium that transitions between a gas phase and a liquid phase based on a refrigeration temperature of the refrigerator, a first end of the transfer pipeline being thermally coupled with the second stage cold head of the refrigerator, a second end of the transfer pipeline being thermally coupled with the superconducting magnet, and
the transfer pipeline includes a first transfer pipeline and a second transfer pipeline, a first end of the first transfer pipeline being connected with a first end of the second transfer pipeline so that the first transfer pipeline and the second transfer pipeline are in fluid communication, the first transfer pipeline being disposed in a vertical direction, the second transfer pipeline being at an angle with the first transfer pipeline, a second end of the first transfer pipeline being thermally coupled with the refrigerator, and a second end of the second transfer pipeline being thermally coupled with the superconducting magnet.

17. The MR device of claim 16, wherein the transfer pipeline includes an end cover connected with the second end of the first transfer pipeline, a diameter of a first end of the end cover being smaller than a diameter of a second end of the end cover, the first end of the end cover being connected with the second end of the first transfer pipeline, the second end of the end cover being away from the second end of the first transfer pipeline.

18. The MR device of claim 16, wherein the transfer component includes a connection block connected with the second end of the transfer pipeline, the transfer pipeline being thermally coupled with the radiation shield or the superconducting magnet through the connection block.

19. The MR device of claim 16, wherein the refrigeration component includes a support component, the support component including one or more fixing holes configured to fix the transfer pipeline and the refrigerator on the support component, the support component being connected with the first end of the transfer pipeline.

20. The MR device of claim 16, wherein the transfer component includes a supplement pipeline configured to allow addition of the transfer medium to the transfer pipeline, a first end of the supplement pipeline being in fluid communication with the transfer pipeline, a second end of the supplement pipeline extending outside the cryostat and being connected with an external cold source of the transfer medium.

* * * * *